(12) United States Patent
Reed et al.

(10) Patent No.: US 7,480,976 B2
(45) Date of Patent: Jan. 27, 2009

(54) AUTOMATED SPUTTERING TARGET PRODUCTION AND SUB SYSTEMS THEREOF

(75) Inventors: Wiley Zane Reed, Greenville, SC (US); Bobby R. Cosper, Trenton, GA (US); Kenneth G. Schmidt, Piedmont, SC (US); Neil D. Bultz, Greenville, SC (US); Charles E. Wickersham, Columbus, OH (US); John P. Matera, Grove City, OH (US)

(73) Assignee: Tosoh SMD Etna, LLC, Grove City, OH (US)

( * ) Notice: Subject to any disclaimer, the term of this patent is extended or adjusted under 35 U.S.C. 154(b) by 0 days.

(21) Appl. No.: 11/795,391

(22) PCT Filed: Jan. 18, 2006

(86) PCT No.: PCT/US2006/001721

§ 371 (c)(1),
(2), (4) Date: Sep. 25, 2007

(87) PCT Pub. No.: WO2006/078707

PCT Pub. Date: Jul. 27, 2006

(65) Prior Publication Data

US 2008/0110011 A1    May 15, 2008

Related U.S. Application Data

(60) Provisional application No. 60/644,929, filed on Jan. 19, 2005, provisional application No. 60/646,244, filed on Jan. 24, 2005, provisional application No. 60/656,978, filed on Feb. 28, 2005, provisional application No. 60/657,054, filed on Feb. 28, 2005, provisional application No. 60/656,977, filed on Feb. 28, 2005, provisional application No. 60/657,263, filed on Mar. 1, 2005.

(51) Int. Cl.
B23Q 7/04      (2006.01)
B23Q 17/20    (2006.01)
B23Q 39/04    (2006.01)

(52) U.S. Cl. .......................... 29/563; 29/33 P; 409/133; 901/31

(58) Field of Classification Search .................. 29/33 P, 29/563; 409/133, 136; 901/30, 31; 505/511
See application file for complete search history.

(56) References Cited

U.S. PATENT DOCUMENTS 3,737,824 A     6/1973   Coles (Continued)

OTHER PUBLICATIONS

MSDS—Tantalum Sputtering Target, Cabot Corporation, Jun. 20, 2007, 7 pages.

Primary Examiner—David P Bryant
Assistant Examiner—Eric A Gates
(74) Attorney, Agent, or Firm—Wegman, Hessler & Vanderburg

(57) ABSTRACT

A fixture and method is provided for gripping an article, such as a sputtering target. The fixture comprises a base, a first set of contact rollers, and a second set of contact rollers, wherein at least one of the first set and the second set are adjustably positioned relative to the other of the first set and the second set on the base. The contact rollers can be configured as v-grooved wheels that will only touch chamfered portions of an outer diameter of the sputtering target when the contact rollers are clamped against the sputtering target. At least one of the first set and the second set of contact rollers can be pivotally mounted on a slide, with the slide being adjustably positioned on the base of the fixture.

20 Claims, 51 Drawing Sheets

U.S. PATENT DOCUMENTS

| | | |
|---|---|---|
| 4,392,362 A | 7/1983 | Little |
| 4,885,836 A | 12/1989 | Bonomi et al. |
| 5,107,599 A | 4/1992 | Marincic et al. |
| 5,306,405 A | 4/1994 | Lorentz et al. |
| 5,439,877 A | 8/1995 | Face |
| 6,007,236 A | 12/1999 | Maguire |
| 6,171,455 B1 | 1/2001 | Pavate et al. |
| 6,298,572 B1 | 10/2001 | McAuley |
| 6,365,871 B1 | 4/2002 | Knowles et al. |
| 6,444,105 B1 | 9/2002 | Lai et al. |
| 2003/0106202 A1 | 6/2003 | Walker et al. |
| 2005/0147150 A1 | 7/2005 | Wickersham, Jr. et al. |
| 2007/0163120 A1* | 7/2007 | Okamoto et al. ....... 29/890.054 |

* cited by examiner

AUTOMATED SPUTTERING TARGET PRODUCTION AND SUB SYSTEMS THEREOF

This application claims the benefit of U.S. Provisional Patent Application Nos. 60/644,929 filed Jan. 19, 2005; 60/656,978 filed Feb. 28, 2005; 60/657,054 filed Feb. 28, 2005; 60/657,263 filed Mar. 1, 2005; 60/646,244 filed Jan. 24, 2005; and 60/656,977 filed Feb. 28, 2005, all of which are incorporated in their entirety by reference herein. The present invention relates to a system and method for manufacturing sputtering targets. The system is preferably automated in part or in its entirety. The present invention also relates to individual sub systems or components of the system and methods for manufacturing sputtering targets. While the preferred embodiment is a system and method for manufacturing sputtering targets, it is to be understood that the present invention also relates to a system and method for manufacturing sputtering target components, metal articles, and workpieces.

Prior to the present invention, the manufacturing of sputtering targets involved labor intensive efforts by a number of individuals. Generally, most, if not all, of the manufacturing of sputtering targets was not automated. In other words, the entire operation of making sputtering targets involved many manual steps and human involvement which can be dangerous, expensive, time consuming, and create non-cleanliness, and the like. While a gantry crane or other lifting device may have been used to assist the manual efforts, essentially prior manufacturing processes involved human intervention before, during, and/or after each processing step. The present invention in at least one embodiment involves a complete or near complete automated production line which reduces or eliminates human intervention and/or manual manipulating of the sputtering targets or other work articles.

The present invention in various embodiments preferably involves sputtering targets in their near-final finished state. In other words, preferably, the sputtering target has a sputter target surface, such as tantalum or niobium, attached by any means to a backing plate. Alternatively, the sputter target can be a hollow cathode magnetron-type product which is a shape commonly used in the sputter target industry. The sputter target manufactured by the present invention can be any conventional size, shape, or material. Generally, the automated sputtering target system and method of the present invention can be adjusted to handle any size, shape, or material used in the sputtering target industry. In at least some embodiments of the present invention, the present invention essentially involves the final steps of preparing a sputtering target for sputtering. As described in detail below, the steps include machining the surface of the target and/or backing plate, washing the target, grit blasting at least a portion of the surface of the target and arc spraying at least a portion of the target surface, and then cleaning the sputtering target, and then packaging the sputtering target. For purposes of the present invention, the manner in which the sputter target was preliminarily prepared, for instance, the thermomechanical working of the metal that formed the plates used to form the sputter target and/or backing plate is not at all critical to the present invention. The sputter target, prior to the steps conducted in the present invention, can be prepared in any manner and from any material. For example, the present invention can be used for any type of physical vapor deposition target, such as a sputtering target. For purposes of the present invention, the term "sputtering target" will be used, but it is clearly meant to include all physical vapor deposition targets and any target used to form a film or coating as a result of the deposition of the target thus producing thin films. The sputter target in the present invention can be any type of material, such as metal. For instance, metals can include FCC-type metals, BCC-type metals, or other metals, and alloys thereof. Examples include, but are not limited to, tantalum, niobium, tungsten, titanium, copper, cobalt, nickel, platinum, molybdenum, rhenium, aluminum, silicon, chromium, iron, gold, hafnium, silver, or any alloy containing one or more of these elements. Classes of material used in sputter targets are refractory metals or valve metals which can also be used in the present invention. With respect to the backing plate, the backing plate can be any type of material commonly used as backing plates, including copper, aluminum, tantalum, niobium, cobalt, titanium, and any alloy thereof containing at least one of these elements, such as, but not limited to, TaW, NbW, TaZr, NbZr, TaNb, NbTa, TaTi, NbTi, TaMo, NbMo, and the like. No limitation exists as to the type of materials used in the sputtering target and/or backing plate. This is equally true with respect to the hollow cathode magnetron-type sputtering target. The target material can be ingot derived or a powder metallurgical consolidated product.

According to various embodiments, a system for manufacturing a sputtering target is provided comprising a plurality of sub systems that are designed and/or integrated to receive and process work pieces made from materials suitable for sputtering, for example, tantalum or niobium or alloys thereof. The work pieces (e.g., pre-finished targets) can be received already partially machined or with no prior machining, and the system according to various embodiments of the present teachings can provide for further processing to transform the work pieces into their final form (e.g., finished targets), for use as sputtering targets.

The system and method according to various embodiments of the present teachings can process at least two different styles of product to produce the final sputtering targets. A work piece from which a sputtering target can be produced can be in the form of a circular flat disk, and if desired, the circular flat disk can be supported or attached on a backing plate. The backing plate can also provide a means for holding the work piece during further processing in the present invention. The circular flat disk type of work piece can be referred to as "disk type," and can be obtained in its preliminary machined or un-machined form from monolithic or bonded assembly. A second style of work piece that can be manufactured into a sputtering target can be referred to as an "HCM" style product, or Hollow Cathode Magnetron style product. The HCM style product can be in the form of a cylindrically-shaped work piece, closed at one end, for example, a top-hat shaped work piece, and can comprise a peripheral flange that can provide a contact surface for holding the work piece during further processing without contacting the critical machined surfaces of the work piece. For purposes of the present invention, a hollow cathode magnetron-style product includes any container-shaped deposition target design, for instance, used in physical vapor deposition. One example includes the HCM design set forth in U.S. Pat. No. 6,444,105 B1. This is strictly provided as an example. This patent is incorporated in its entirety by reference herein.

A system for manufacturing a sputtering target, according to various embodiments, can comprise a plurality of sub systems, including, but not limited to, a robotic part handling sub system, a machining sub system, a weighing sub system adapted to measure the weight of a part to be manufactured into a sputtering target, a grit blasting and arc spray sub system for applying particle trap surfaces to the sputtering target, a cleaning sub system adapted to clean a part to be manufactured into a sputtering target, an inspection sub system adapted to measure dimensions, surface finish and cleanliness of a part to be manufactured into a sputtering target or the finished sputtering target, a helium leak check sub system for testing the vacuum integrity of the part, a packaging sub system for packaging the part preferably in an at least class 100 inert gas environment, and a feedback control sub system adapted to provide control signals to one or more of the sub systems, such as the robotic handling sub system, the weighing sub system, the cleaning sub system, and/or the inspection sub system to control processing performed by one or more of the sub systems. In at least one embodiment, the weighing sub system can measure the sputtering target at any point during the manufacturing process. In other words, the weighing sub system can measure the weight of the part prior to any process step described herein or before and/or after any process step described herein. The weighing sub system can be used to measure the weight of the part being manufactured (e.g., pre-finished target) and/or after the formation of the finished sputtering target. For purposes of the present invention, the term "part to be manufactured into a sputtering target" includes a pre-finished sputtering target or a finished sputtering target, especially with respect to the quality control type sub systems, such as the weighing, cleaning, and/or inspection sub systems. The quality control sub systems are completely optional. Further, the cleaning sub system can be incorporated into the manufacturing process line at any point. However, it is preferred that the cleaning sub system occur once the sputtering target is in a finished state. In other words, the cleaning system is best utilized once all other previous steps which create dirt or particles have occurred, such as machining, grit blasting, and arc spraying. Also, the inspection sub system can occur at any point in the process line. However, it is best utilized once a finished sputtering target has been made and cleaned. With respect to the helium leak check sub system, it is to be recognized that this helium leak check sub system is completely optional and is generally used for the HCM parts. The helium leak check sub system is not generally utilized for disk type targets and therefore, when disk type products are being made, the helium leak check sub system is generally not used. With respect to the packaging sub system, any packaging sub system can be used, whether automated or manual. Thus, a packaging sub system which is in communication with the feedback control sub system is completely optional.

The sub systems that make up the system according to various embodiments for manufacturing a sputtering target can be arranged at various stations, and the stations can be separated into one or more zones. A first zone can be provided comprising a plurality of stations, each of which can include a sub system for processing a work piece that is to be manufactured into a sputtering target.

One or more multi-tooled robots, for instance, on a servo-controlled rail can be provided to transfer one or more work pieces through a first zone comprising one or more of the following stations: an on-load station, a pre-machining weigh station, a computer numerically controlled (CNC) machining station adapted to machine the work piece to desired specifications, a post-machining weighing, marking and mark-verification station (which can be the same as or part of the pre-machining weigh station), a degrease cleaning and drying station, a part transfer station, an ultrasonic thickness measurement station, an end effector cleaning station, a bonding integrity test station, a helium mass spectrometer leak test station, a part holding station, an arc spray station and grit blast station, and a part transfer station for transferring the work piece to a further cleaning zone. The further cleaning zone can comprise one or more of the following stations: an ultrasonic cleaning station, an inert gas (e.g., nitrogen) clean tunnel system, wherein the inert gas clean tunnel system can comprise one or more of a part drying oven, a part cooling system, a part transfer system, a cleanliness and surface finish inspection system, a reject conveyor, and a bagging station. For purposes of the present invention, there can be any number of each of the various stations.

Additional features and advantages of the present teachings will be set forth in part in the description that follows, and in part will be apparent from the description, or may be learned by practice of the present teachings. The objectives and other advantages of the present teachings will be realized and attained by means of the elements and combinations particularly pointed out in the description that follows.

It is to be understood that both the foregoing general description and the following detailed description are exemplary and explanatory only and are intended to provide a further explanation of the present teachings.

BRIEF DESCRIPTION OF THE DRAWINGS

Various embodiments of the present teachings are exemplified in the accompanying drawings. The teachings are not limited to the embodiments depicted, and include equivalent structures and methods as set forth in the following description and as known to those of ordinary skill in the art.

DESCRIPTION OF VARIOUS EMBODIMENTS

A sputtering target manufacturing system according to various embodiments of the present teachings can comprise a plurality of sub systems designed and/or integrated to receive rough formed metal pieces and process them to their final form, as sputtering targets. Different types or styles of product, such as disk type (e.g., 200 mm, 300 mm) and HCM (e.g., 200 mm, 300 mm), can be manufactured on the system. The targets and backing plates can have any metal purity, texture, shapes, and/or grain size. The chemical and/or physical parameters are not at all relevant to be present invention. Any size target can also be accommodated in the present invention when adjustments are made.

Figure 1:
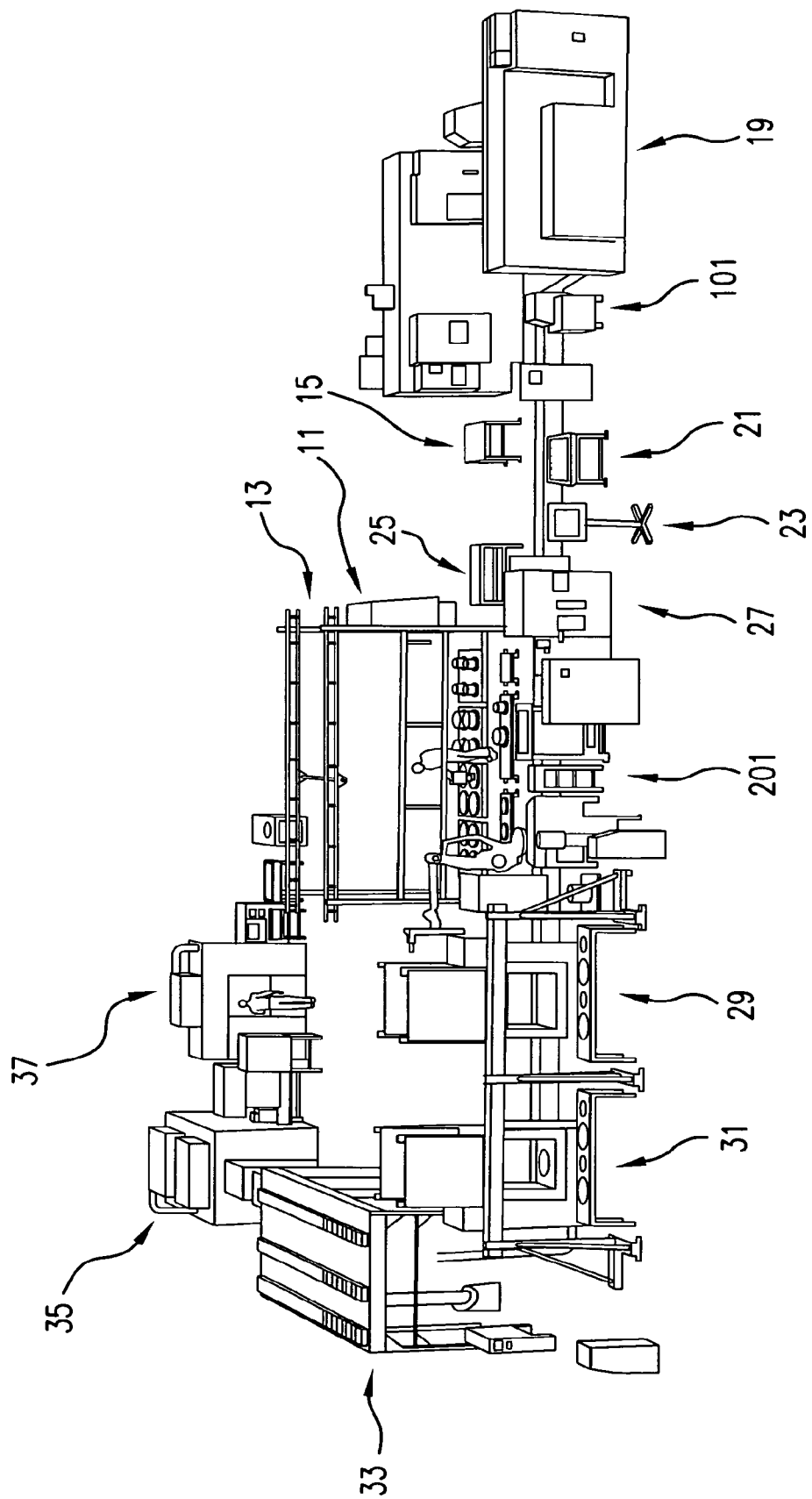
FIGS. 1-10, 11a, 11b and 12-50 are computer-produced pictures of various parts of several embodiments of the automated line of the present invention.

A multi-tooled robot, such as on a servo-controlled rail, can transfer the work in process through Zone 1, which can comprise an on-load station, a pre-machining weigh station, a CNC machining station, a post machining weighing station, part marking and marking verification station, a degrease clean and dry station, a part transfer station, a vacuum cup end effector and stand, an ultrasonic thickness measurement station, an end effector cleaning station, a helium mass spectrometer leak test station, a part holding station, an arc spray station and grit blast station, and a part transfer system adapted to transfer a work piece from Zone 1 into a Zone 2 that can comprise a Class 1000 or better Ultrasonic Cleaning Station. The robot can operate on any type of guide system or can operate on a rail-less system or guide-less system or any system that permits its location to be controlled and known. As stated before, the post-machining weighing station can be the same station used for the pre-machining weigh station. Again, there can be more than one of any same station mentioned herein. FIG. 1 is a computer generated picture or diagram of one embodiment of the present invention showing the layout of many of the stations that can be used in the automated line of the present invention. The layout shown in FIG. 1 is simply one example, and the layout can be any other type of arrangement depending upon the work space and other considerations. In FIG. 1, a floor-supported bridge crane workstation 13 is shown. A Human Machine Interface (HMI) 11 is further shown. Weight station 15 is shown adjacent to one of the CNC machining stations 17 and across from the first CNC machining station 17 is a second CNC machining station 19. A target resting station 25 is shown. The target resting stations are simply locations throughout the automated line where the robot can place a target when needed. These rest stations are recognized as designated locations in the automated line and thus, their locations are tracked and recognized by the overall automated system. A removable receptacle 101, which can be part of the CNC machining center, is used to receive cuttings from the machining process. This removable receptacle 101 can be on rollers so that it can be easily replaced when full or when other metals are being machined so as to pool the same metal cuttings together. Also shown on FIG. 1 is an ultrasonic thickness measurement station 21. An additional HMI is shown as 23 in FIG. 1. A degrease, clean, and dry station is shown as 27, and a helium mass spectrometer leak test station is shown as 201. Also shown is a grit blast station 29, along with an arc spray station 31. A cleaning station 33 is shown, as well as an inert gas tunnel 35, and a packaging or bagging station 37.

A series of gantry robots, a class 100 clean room conveyor, and various lift devices can transfer the work piece through Zone 2, which can comprise a cleaning station, such as the Class 1000 Ultrasonic Cleaning Station, and an inert gas clean room system, such as a Class 100 or Class 10 Inert Gas Clean Room System. This inert gas can be nitrogen gas or any other inert gas. The inert gas clean system can comprise a drying oven part, a cooling section part, a transfer system part, a cleanliness and target surface finish inspection, a reject conveyor, and/or a bagging station.

A data management system can be coupled with the manufacturing system. The data management system can track work in process, record pertinent data, coordinate the various sub system's operation and provide an interface for system performance and operation. The entire system can be designed such that minimal human intervention is used while insuring safe, reliable, and repeatable processing of the disk type and HCM products or other work pieces to be manufactured into finished sputtering targets or components thereof. The present invention can be also useful in manufacturing coil, such as for sputtering applications, for instance, as a RF coil set.

The sputtering target manufacturing system according to various embodiments can be designed and manufactured to allow automated and/or manual process steps for finishing disk type components, HCM components, and/or other work pieces suitable for or used with sputtering targets, wherein inspection and component data tracking can be performed for all finished products, and optionally one finished product can be preferably produced in short orders of time, like approximately every 20 to 210 minutes.

The sputtering target manufacturing line can comprise sub systems and stations for processing one to four or more basic sizes of finished product that can include two or more sizes of disk type parts and two or more sizes of HCM parts, with several material variations being possible within various basic sizes.

The disk type parts can be provided to the manufacturing line according to various embodiments on pallets or other similar transport devices. The pre-machined or un-machined surface of desired sputtering material, for example, tantalum or niobium, can be oriented on the pallet preferably with the machined side up, if pre-machined. The targets can be oriented with the machine side down. As stated, the target, prior to being introduced into the manufacturing line by way of the on-load station, can be preliminarily machined on one or both surfaces of the target or can have no prior machining on one or more surfaces. It is completely optional to have any prior machining done to any surface prior to introducing the target to the manufacturing line of the present invention.

According to various embodiments, the HCM parts can be provided to the manufacturing line on pallets or other similar transport devices oriented with the open end of the work piece preferably facing downward toward the pallet or transport device. It is possible to orient to HCM parts facing upward. The HCM parts can also be gripped and handled on the outside diameter of a peripheral flange that can be optionally premachined into the work piece using gripper jaws or other end effectors, for example, a vacuum end effector.

According to various embodiments, parts to be processed at an incoming product load station (e.g., an on-load station) can be positioned within the loading area, and an operator can utilize a crane and hoist or other lifting or transfer device to transfer the parts from the pallets to locating fixtures on the on-load station. Once the locating fixtures are loaded the system can be started and a robot can remove parts from the locating fixtures and move them to various process stations as programmed. When a part is put on the on-line station, the on-line station has specific locations (e.g., location fixtures) recognizable by the PLC or other computer operating network in communication with the main system controller. Once the automated system is informed of the particular pre-finished target in a particular location, the robot can then take that pre-finished target and process it through the automated system and the target and its location can be entirely tracked throughout the system in order to achieve a finished target. When a target is placed on the on-line station in a particular location, the automated system will know the type of pre-finished target, its part number, and any other information that the manufacturer or user wishes to have assigned to the target, such as chemical data on the target purity, dimensions, and the like. The information regarding the target and its location can be inputted into the automated system by scanning a bar code on the target or adjacent to the target, typing in a part number or other identifier, and informing the automated system of its location on the on-line station. The on-load station can accommodate any number of targets based on the overall size of the on-load station and the number of identifiable locations on the on-load station that the automated system will recognize. Multiple on-load stations can be used or larger on-load stations can be used to accommodate any number of targets which are to be introduced into the automated system. As stated, any means to identify the part being located on a locating fixture of the on-line station can be used. For instance, a bar code located on or near the target can be entered by bar code scanning so that the automated system knows the part being located on the on-line station and further the location on the on-line station can further be imputed by the operator. Other means to identify the target can be used, such as tags that can be on or in the target, such as RF tags or other identifiers. With the use of such tags, the target can be monitored throughout the entire automated system by this additional means, as well as the tracking of the part through the automated system as it goes from station to station as indicated herein.

Figure 2:
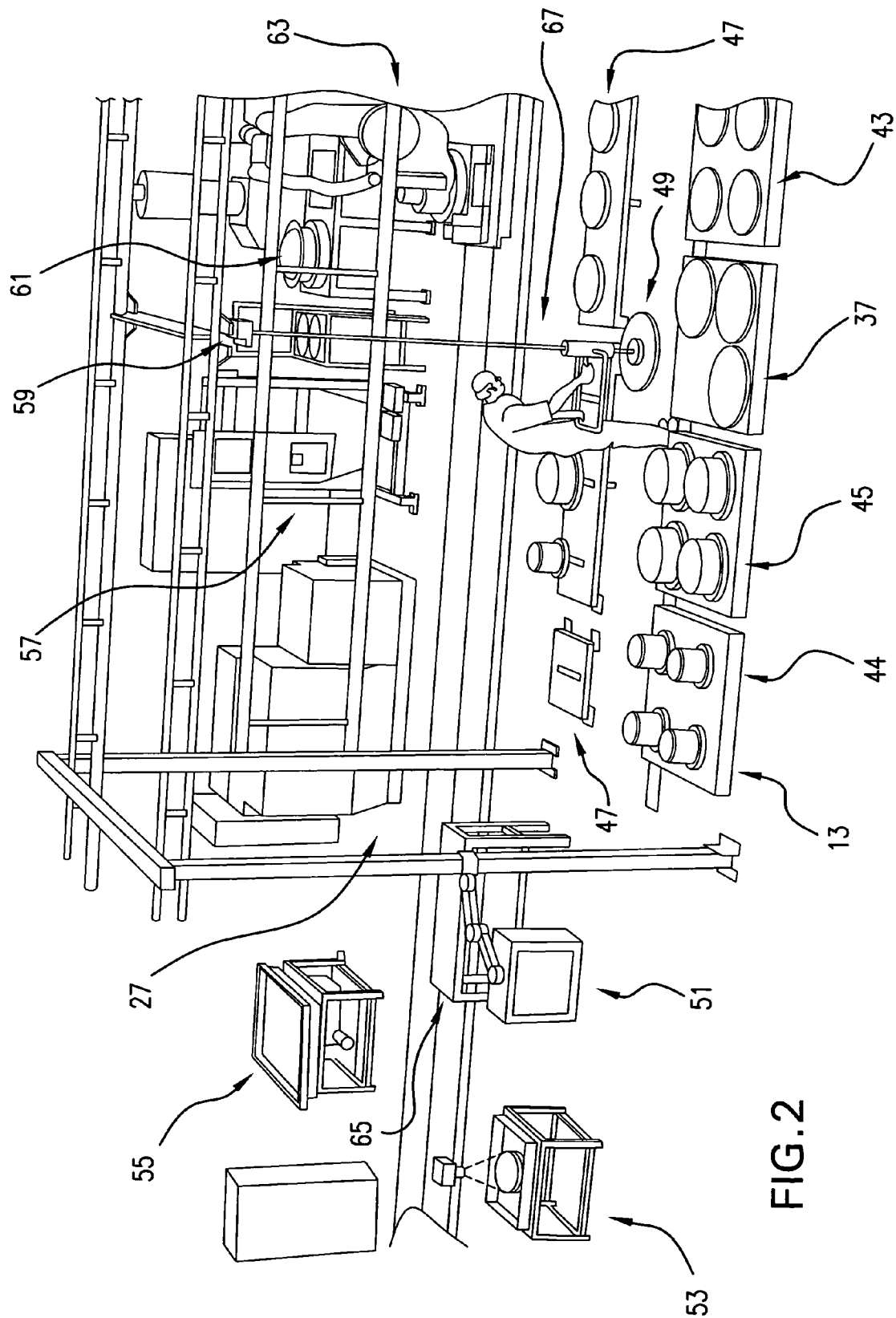

The incoming product load station can comprise a staging area for incoming product pallets suitable for one or more shifts of plant production, for example, 1 to 7 or more parts. Any number of targets can be processed. In this example, seven universal part fixtures can be provided to stage and position one shift of production parts for the robotic material handling system. A floor supported bridge crane workstation can be provided, for example, with a bridge length of approximately 10 feet and a runway length of approximately 23 feet, and can be supported using four corner columns at a height of approximately 12 feet. Total bridge crane loading capacity can be approximately 2000 Lbs (including lift hoist, vacuum lift end effector and product). The incoming product load station can further comprise an electric chain hoist that can be attached to the bridge crane. The hoist can feature a lift capacity of approximately 2000 Lbs. One of ordinary skill in the art will recognize that the number of parts handled during a shift, the load capacities of handling equipment, and the dimensions of handling equipment including conveyors and cranes as referred to in these examples are exemplary only, and are not in any way limiting on the variety of different shift capacities, load capacities, and dimensions of the work piece handling equipment, including cranes and hoists, that can be employed within the scope of the present teachings. A mechanical vacuum lifting mechanism can also be provided for handling the work pieces, and can comprise a compressed air powered vacuum generator and check valve, and a custom pad attachment and battery powered leak detector. A manually operated generator can be capable of handling up to approximately a 750-pound or more lift capacity. A powered gravity roller conveyor can be provided to handle rejected parts, and can be, for example, 10 feet long, to allow parts rejected within the process to be staged for manual removal. Referring to FIG. 2, one example of an on-line station is shown as 47 in FIG. 2. As can be seen in FIG. 2, the length of the on-line station(s) can vary and can contain different types of pre-finished sputter targets. Each of the on-line stations have a locating fixture. In FIG. 2, this figure primarily shows the loading area and an operator utilizing a crane 67 to transfer sputter targets, such as sputter target 49, from a pallet, such as 13, to the on-line station 47. Also, in FIG. 2, four different sputter target shapes or sizes are shown. 44 is an example of an HCM 200 mm target. 45 is an example of a 300 mm HCM target. 39 is an example of a 300 mm disk shaped target. 43 is an example of a 200 mm disk shaped target. FIG. 2 also shows a material handling device or computer controlled robot 63. 65 is an example of a rest station on the automated line, which can be the same as 25 in FIG. 1. Similarly, 51 is an example of a human machine interface device, which can be the same as the HMI 11 in FIG. 1. The material handling device or computer controlled robot 63, is mounted to a linear robot transport or rail 67, as shown in FIG. 2. One quality control station is a bonding evaluation station 53 for determining the integrity of a bond between a backing plate and a target blank. In the background of FIG. 2 is the helium mass spectrometer leak test station 61, and a vacuum gripping device station 59 which can be gripped by the end effector, which is a gripping device that can be attached to the robot 63. This vacuum gripping device rests on this station when not in use. 57 in FIG. 2 is one example of a special invert fixture, which permits the robot 63 to invert the part prior to loading the target in a station.

According to various embodiments, a material handling device (e.g., computer controlled robot, such as a multi-axis robot) for all stations included in the system outside of a downstream clean room environment can be, for example, a Fanuc 6 Axis Robot or the Fanuc M-900iA series of robots mounted to a linear robot transport unit (RTU) or rail. The robot on the rail can utilize a specific end of the arm gripper mechanism to lift and position disk type or HCM products to and from the various staging and process stations within the system. In some operations where the robot can be required to invert the part prior to loading at the next station, the robot's 6-axis or multi-axis capability along with a special invert fixture can be utilized. The fixture can be designed such that it allows the robot to position and drop off the part to be inverted in a "vertical axis" orientation in the fixture, which then allows the robot to reposition itself on the opposite end of the part for regripping and retrieval. Product movement in the system can include the loading and unloading of all sub system equipment and can be handled by the computer controlled robot, such as the Fanuc robot/RTU system. Generally, an operator loads products to the staging fixtures at the incoming product load station.

According to various embodiments, the Fanuc M-900iA series of robots, as well as other computer controlled robots, can be engineered for precision, user-friendly setup and maximum reliability. The robots can be supported by Fanuc's extensive service and parts network. The M-900iA can be a 6-axis, modular construction, electric servo-driven robot with a load capacity of 350 kilograms designed for a variety of manufacturing and system processes. Other computer controlled robots with similar capabilities can be used.

Some desirable features of the Fanuc M-900iA include wrist design suitability for harsh environments, small robotic footprints and reduced controller size to conserve space, slim arm and wrist assemblies to minimize interference with system peripherals and allow operation in confined spaces, allow wrist moments and inertias to meet a variety of heavy handling challenges, and ease of integration and reliability while providing the highest uptime and productivity. Further features can include longer maintenance intervals, which can equate to lower operating costs, robust mechanical design features that can reduce down time, increase mean time between failure (MTBF) and minimize spare part requirements, and the use of high performance motion yielding fast cycle times and high throughput. Again, other computer controlled robots with one or more similar capabilities can be used.

According to various embodiments, features of the Fanuc M-900iA series of robots can include multiple controller type and mounting capabilities, a 6 axis of motion, and a slim profile design. Control of the Fanuc M-900iA series of robots can include a quick change amplifier (<5 minutes), a fast boot time (<30 seconds), a standard Ethernet Port, a PCMCIA Software distribution, and easy connections to a variety of I/O, including a number of distributed I/O networks.

According to various embodiments, the software of Fanuc M-900iA series of robots can include processing specific software packages for various applications, web-based software tools for remote connectivity, diagnostics and production monitoring, and machine vision for robot guidance and inspection.

According to various embodiments, the robotic transfer unit (RTU) can be a single carriage heavy duty, floor-mount that is approximately 40-inches wide. The RTU can transport the FANUC M-900iA robot and related equipment with a maximum static load rating of less than 6,000-lbs. including robot, payload, and peripherals. A center mounted cable carrier is included. Again, other types of RTU systems can be used, even track-less systems.

According to various embodiments, the end effector for the system can include a custom designed product specific part gripper assembly, one for both disk type and HCM products. The end effector can contain various active and static tooling features such as a direct current electric powered linear actuator, a vacuum holding device, and/or a fixed reference tooling feature to perform the gripping, locating, and holding functions as required during the loading and unloading of products within the system. The end effector can be designed to accommodate all sizes of parts in the part families. The end effector's gripping and locating mechanisms can allow it to grip the parts from either the top or the bottom as needed for machine tool loading/unloading, invert over mechanism loading/unloading, and other process equipment loading/unloading requirements. Further details of the end effector are set forth in U.S. patent application Ser. No. 60/644,929, filed Jan. 19, 2005, incorporated in its entirety by reference herein.

According to various embodiments, a further sub system can comprise a weighing station, wherein the weighing station can comprise a scale that can be used to weigh each part as they first enter (and/or at some other time) the system prior to loading for the next operation in both disk type and HCM products. The scale can compare the actual weight of the selected part with the expected correct raw part weight stored within the system controller or compare the actual weight with a previously recorded weight of the same part. The weighing station in the present invention is completely optional. The weighing that occurs especially prior to any processing of the target to completion to form a finished sputter target is not necessary and is simply provided as a quality control measure. In preferred embodiments, and as indicated above, the pre-finished target put on a particular locator on the on-load station is identified by information associated with that pre-finished target. The part already has a history associated with it which has been entered into the computer database, such as part number, weight, chemical analysis, and other physical and chemical properties associated with target manufacturing or metal articles. Thus, when a part is put on the on-load station and the computer is informed of the particular part and the particular location on the on-load station, the automated system can optionally then weigh the part at the weighing station to ensure that the weight of the target matches the weight previously identified with the target based on information previously entered into the computer system. If the weight as measured in the weighing station matches within acceptable error of the previously identified weight, then the automated system will then proceed with processing the part based on the work order associated with this particular part. This weighing station thus provides added insurance that the particular part being handled by the automated system is the part associated with the part number or other identifier to ensure that the proper work will be done on the part. It is clearly envisioned that this weighing station can be eliminated in many embodiments, though it is preferred from a quality control point of view. Acceptable parts are sent on for further processing by the system. In the event of an improperly positioned part by the operator, the scale can identify the incorrect part and can signal the robot to reject the part and the part can be taken to a rejection station.

Figure 3:
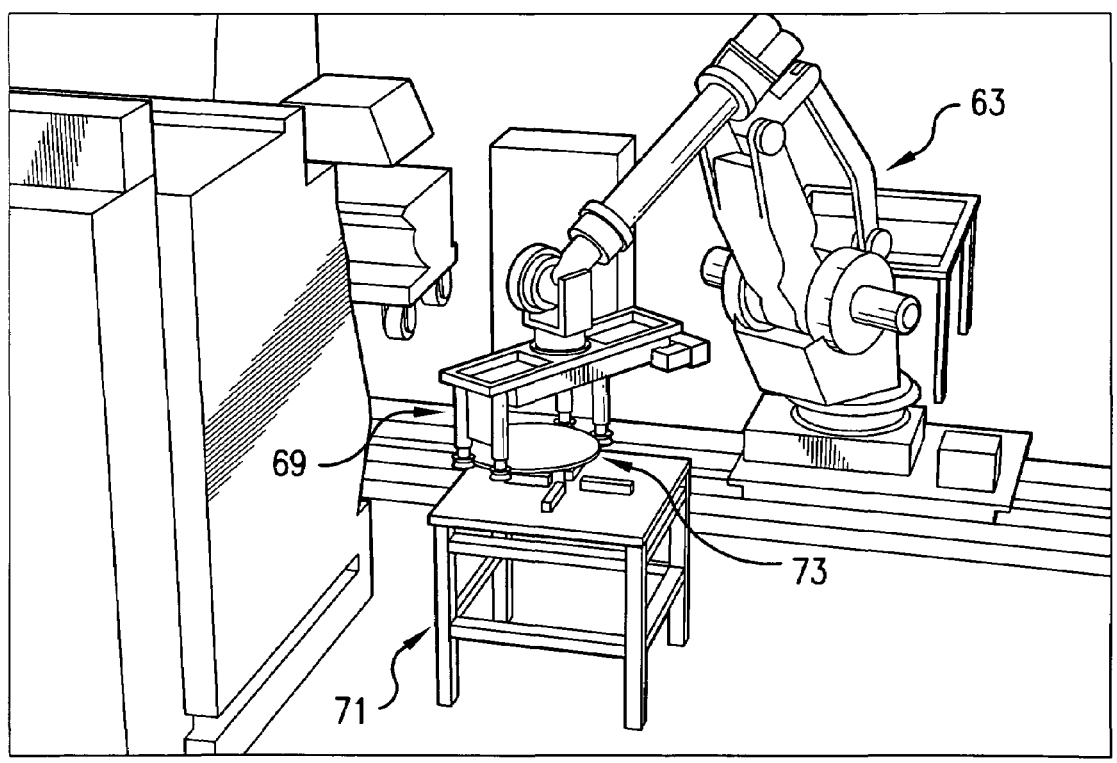

According to various embodiments, the weighing station can comprise a Cardinal Floor Hugger scale (or other suitable scale) mounted to the plant floor. The weighing station is preferably close to the incoming product load station, though can be located anywhere in the automated system. The Cardinal scale can have a platform size of 3 feet×3 feet with output graduations in increments of 0.2 lbs. The scale features can include a smooth top plate, four hermetically sealed stainless steel load cells, trim resistors for section sealing in addition to calibration adjustments in weight displays, self-checking load cells, and adjustable leveling feet mounted to each load cell. The scale can be equipped with an indicator type operator display and can include an interface card to allow communication with the control system. Parts can be placed into and retrieved from nest fixtures attached to the scale top plate by the robot. As stated above, in at least one embodiment, any raw part weights or previous weight measurements of the part for all products, styles, sizes, and materials that differ by a sufficient amount will allow the scale to detect an incorrect product part when weighed. In FIG. 3, the computer controlled robot 63 using the end effector gripping device 69 is placing a target 73 gripped by the end effector 69 on the weigh station 71 for weight measurement.

Figure 13:
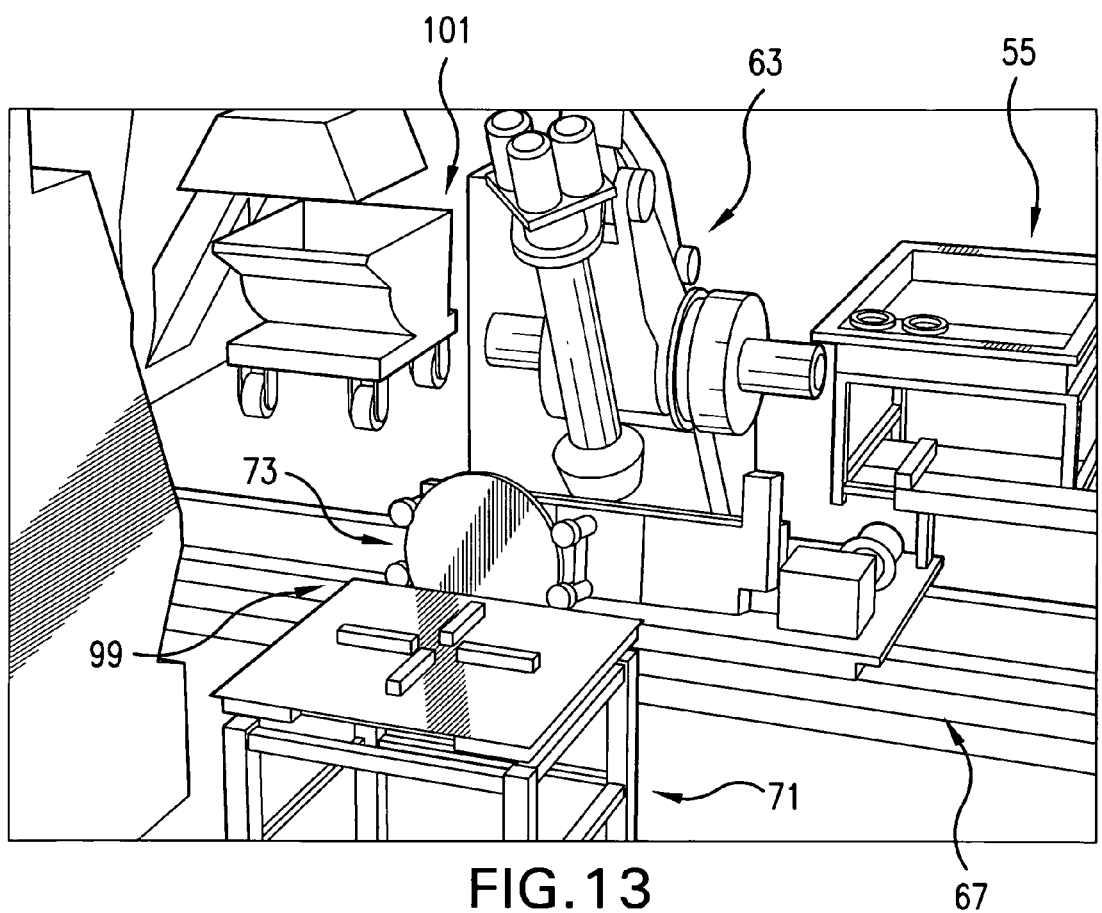
Figure 14:
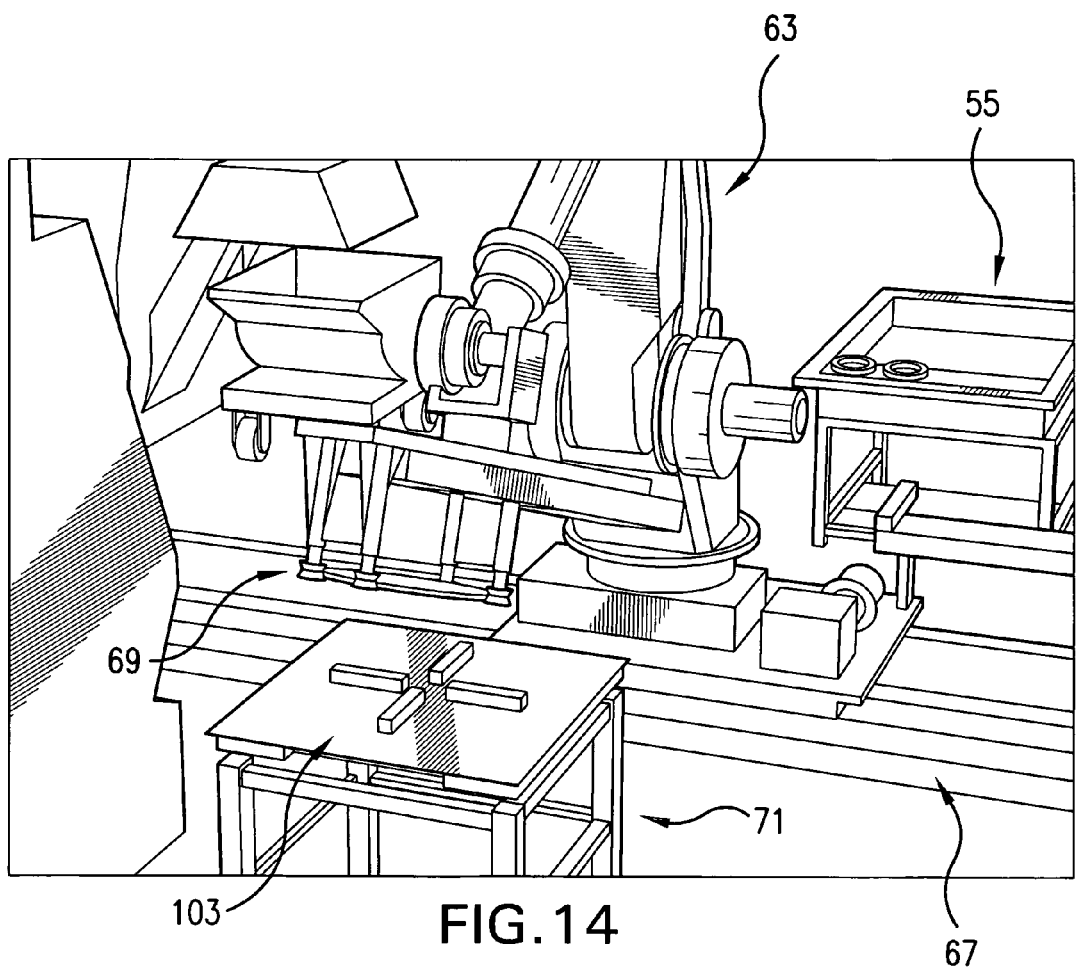

According to various embodiments, an impact printer can also be provided, wherein the printer can be adapted to engrave a desired word, for example, "CABOT", a desired logo, the customer part number, the revision, and/or the serial number. One example is a Telesis single pin impact printer that can include a 1-½"×2-½" marking window capable of dot matrix characters in a variety of sizes and styles with dot density from about 10 to 200 dots per inch and can be held in position by a robot. For instance, disk type parts can be marked on the back and HCM parts can be marked on the circumference of the flange. Any means to mark a target can be used in the present invention. For instance, a laser printer or engraver can be used. Accordingly, any means to identify or provide information on a target can be used in the present invention and incorporated into the automated system of the present invention. The use of a printer, such as a impact printer, is simply exemplary for purposes of the present invention. The impact printer can be a separate station or it can be incorporated with another station, such as the weighing station. In some of the figures described herein, the print station is attached to the weighing station simply from a convenience point of view, as well as a space conservation point of view. Like the weighing station, the print station and any information provided by the printer or other means of providing information on a target are completely optional in the present invention. The printer, or other marking means, can be equipped with an indicator type operating display and can include an interface card to allow communication with the control system. What is printed on the target or marked on the target can be incorporated in the overall automation and decided well in advance with respect to each individual target based on part number or other identifying means, although this information can be entered into the operating system. FIG. 13 shows a target 73, which, in this case, has been subjected to the degrease, cleaning, and drying station, now being marked by an impact printer or other marking device 99, which is attached to the weigh station 71. Though not related to this particular station, as shown in the background is a receptacle 101 which receives cuttings from the CNC machining center. Further shown in the background is the ultrasonic measurement station 55 with the two air dry ports. In FIG. 14, the computer controlled robot 63 using the end effectors 69 is gripping the target and placing it on the weigh station 71 which includes four hermetically sealed stainless steel load cells 103.

According to various embodiments, the disk type parts can be provided to the manufacturing line pre-machined in order to assure that the surface of the work piece opposite from the sputtering surface, for example, a backing plate surface comprising copper or an alloy thereof, is parallel to the sputtering surface to provide a circular disk of constant thickness. The preliminary machining can include the complete facing of the backing plate surface side opposite from the sputtering side, and preliminary machining of the final outer diameter of the part, such that the part does not require removal from the CNC machine used during the final processing in order to turn the part around and machine the other side in the CNC machine. According to various embodiments, the disk type can be machined on the backing plate side in an offline process so it does not need to be flipped in the CNC machining center. The disk type work piece can be gripped or handled on the outside diameter of a peripheral flange that can be preliminarily machined into the work piece. The gripping or handling can be performed using specially designed gripper jaws or other end effectors, for example, a vacuum end effector.

Figure 4:
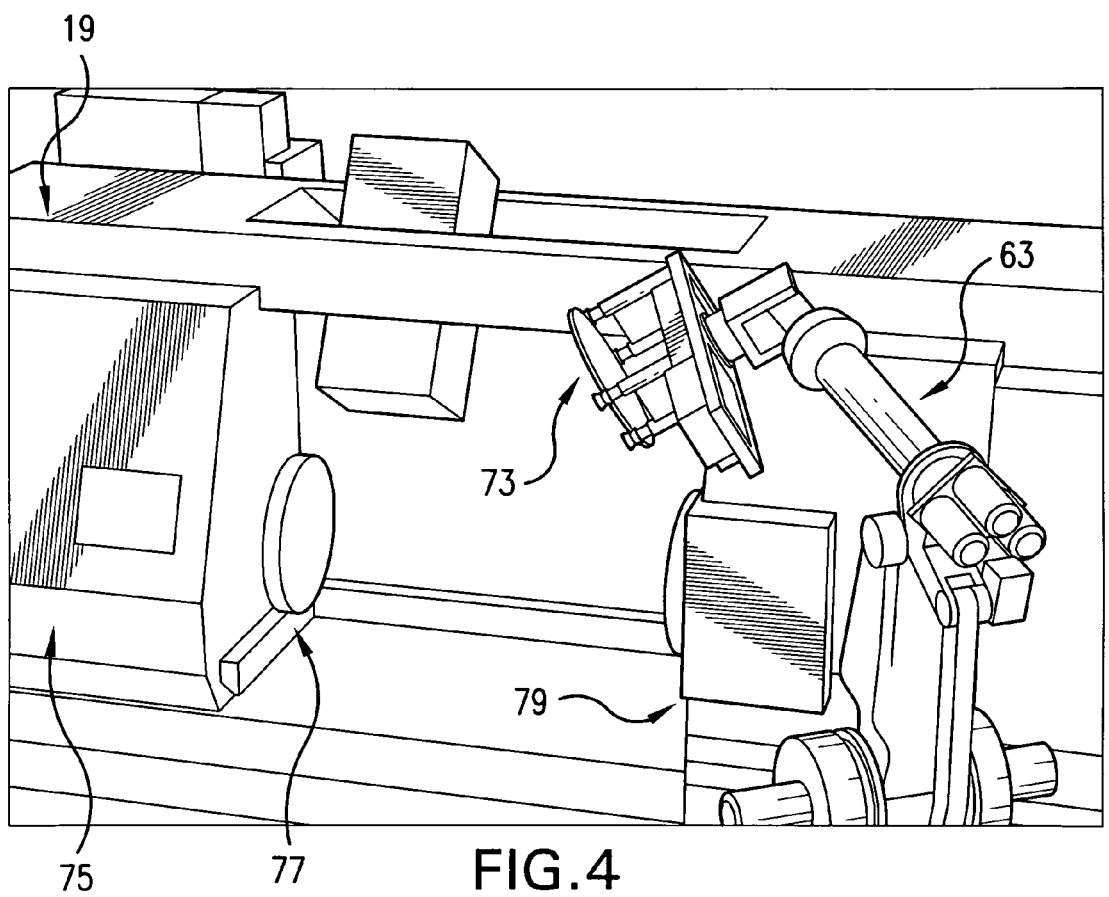
Figure 5:
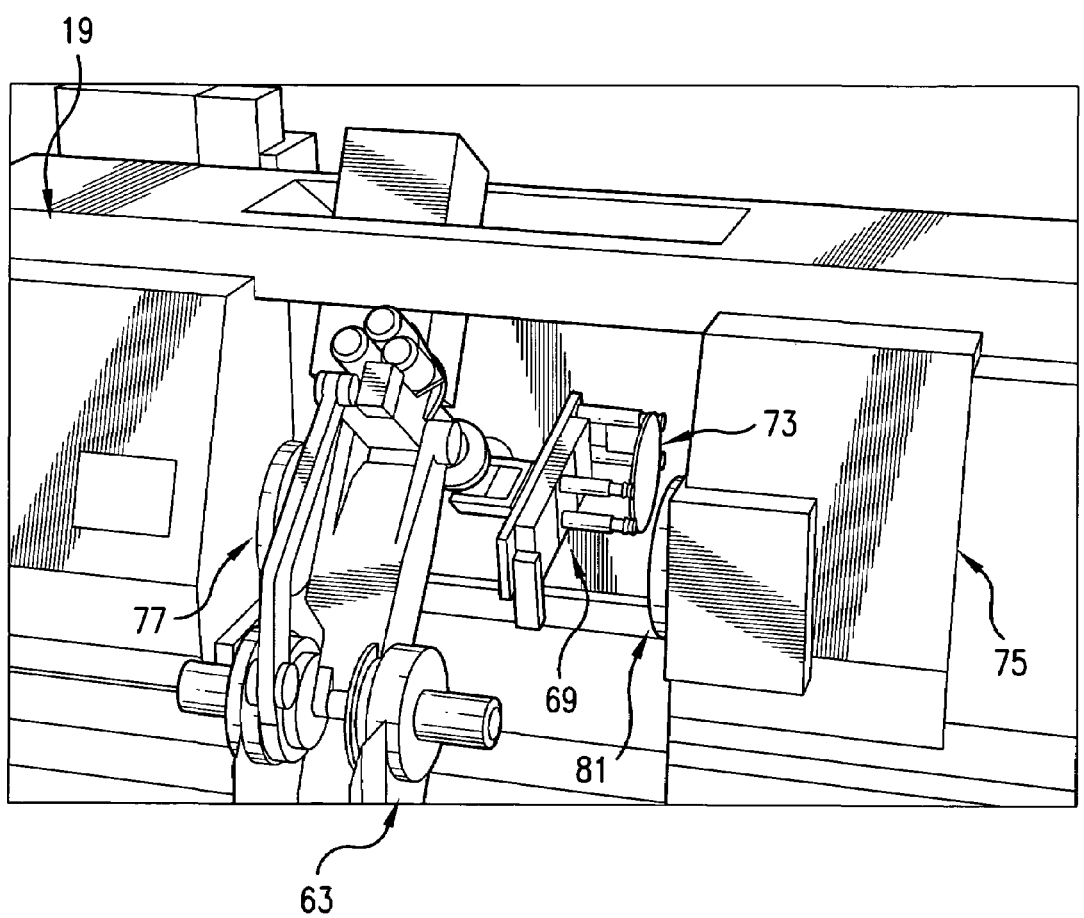

According to other embodiments, the target, such as disk type or HCM type, can be machined in a dual spindle CNC machining station. For instance, a multi-axis mill having dual spindles and tool changer can be used, such as a Mori Seiki MT-3000S/1500 Mill Turn Center. This type of CNC machining station can be controlled by a programmable logic controller or other computer operating network with communication to the main system controller. In this type of CNC machining station, for instance, the multi-tooled robot or other type of robot with a gripper such as an end effector, can grip the target and place it into the CNC machining station. In more detail, the robot can place the target onto a spindle in the CNC machining system that has pie-jaw chucks to hold the target during the machining step. Once the target has been placed on the spindle and the target secured by the pie-jaw chucks, the machining of the first surface of the target can occur by the automated tool device in the CNC machining system. Generally, in this CNC machining station, the backing plate surface is first machined and then the target surface is machined afterwards. However, any order can be used. The machining of the first surface is controlled by a program to the CNC machine which bases the machining on the type of target in the CNC machining center and the desired end thickness dimensions of the target. Generally, the machining can occur in stages optionally with progressively smaller cuts being made after each machining stage until the desired thickness is achieved. The machine tools used to machine the surface can be automatically changed with a tool changer in the CNC machining center which can be capable, for instance, of using 60 different tool holder positions or more or less. The CNC machining center can be programmed to use the particular order of machining tools during the machining process to achieve the desired surface finish and thickness of the overall target. All of this can be pre-programmed and controlled through the interface with the PLC or other computer operating network. Once the first surface is machined to the proper surface finish and thickness, the first spindle can automatically transfer or hand off the target to a second spindle located directly across from the first spindle by, for instance, an extending arm or axis attached behind the first spindle. Essentially, this can be accomplished by the first spindle extending over to the second spindle and having the pie-jaw chucks of the first spindle releasing upon the target contacting the second spindle and the pie-jaw chucks of the second spindle holding the target. Upon doing this, the unmachined surface is now exposed for machining by the tooling device. Again, the machining of the second surface, which is preferably the target side surface, can then be achieved in the same manner using a pre-program to achieve a desired surface finish and thickness for the particular type of target. Upon completion of the machining of the second surface, the robot can then remove the machined target for further processing, such as taking the machined target to a degrease clean and dry station as discussed hereafter in further detail. One unique aspect of this embodiment using the dual spindle CNC machining center is that two spindles are being used so that the target does not need to be handled excessively during the machining stage, and second, the machining occurs faster since there is no flipping or excessive robotic intervention during the actual machining. During the machining of the target surface, the tool device will further create an O-ring groove in the backing plate surface that is on the same side as the target surface. This machining sub system is the same for HCM or disk type targets except for the shape of the targets. FIG. 4 shows the computer controlled robot 63 using the end effector to grip a target 73 which is being placed into the CNC machining station 19. The target 73 is being placed onto the spindle 77, which has pie-jaw chucks to hold the target. Upon placing the target 73 into the CNC machining center, double doors, one of which is shown as 75 in FIG. 4, will close for the machining operations to start. FIG. 4 also shows a computer control interface 79 on the CNC machining device 19. FIG. 5 then shows the same CNC machining station 19, wherein the spindle 77 has already transferred the target 73 to the second spindle with pie-jaw chucks 81 so that the other surface of the sputter target 73 can be machined to specifications. FIG. 5 is representative of the second surface already being machined and the computer controlled robot 63 removing the now fully machined target 73 with use of the end effector gripping device 69. FIG. 5 also shows the second sliding door 75 of the CNC machining station 19.

According to various embodiments, a sub system that can optionally be used is a bonding evaluation station. The bonding evaluation station is to ensure that the bond between the target blank and the backing plate is sufficient and has the desired integrity for use. Any means to test bonding integrity can be used and incorporated into the automated line of the present invention. As with other quality control measures, the bonding evaluation station can be a stand-alone system controlled by an Allen Bradley Programmable Logic Controller (PLC) or other PLC or other computer operating network with communication to the main system controller. One example of a suitable bonding evaluation test that can be used in the automated line of the present invention is described in U.S. patent application Ser. No. 10/890,378, filed Jul. 13, 2004, and incorporated in its entirety by reference herein. This particular test is a thermography test that evaluates a bond interface of a sputtering target assembly and involves conducting a thermographic analysis of the sputtering target assembly, such as heating or cooling the target or a part thereof, such as the backing plate in a heat sink or heat source, and then conducting an imaging of the target, such as by infrared thermography, to acquire a sequence of thermographic images of individual pixels of a pixel matrix for a predetermined imaging time to produce an observed time-temperature curve for individual pixels. This data can then be compared to corresponding reference time-temperature curves to determine an integrity for a bond interface. This type of comparing and the obtaining of the data can be communicated by a computer operating network to the main system controller to conduct this analysis to determine whether the target passes this bonding evaluation. The bonding evaluation station can be located at any point in the automated production line and can be used at any point. Preferably, the bonding evaluation will occur prior to machining, though the test can occur at any point after machining as well.

Figure 6:
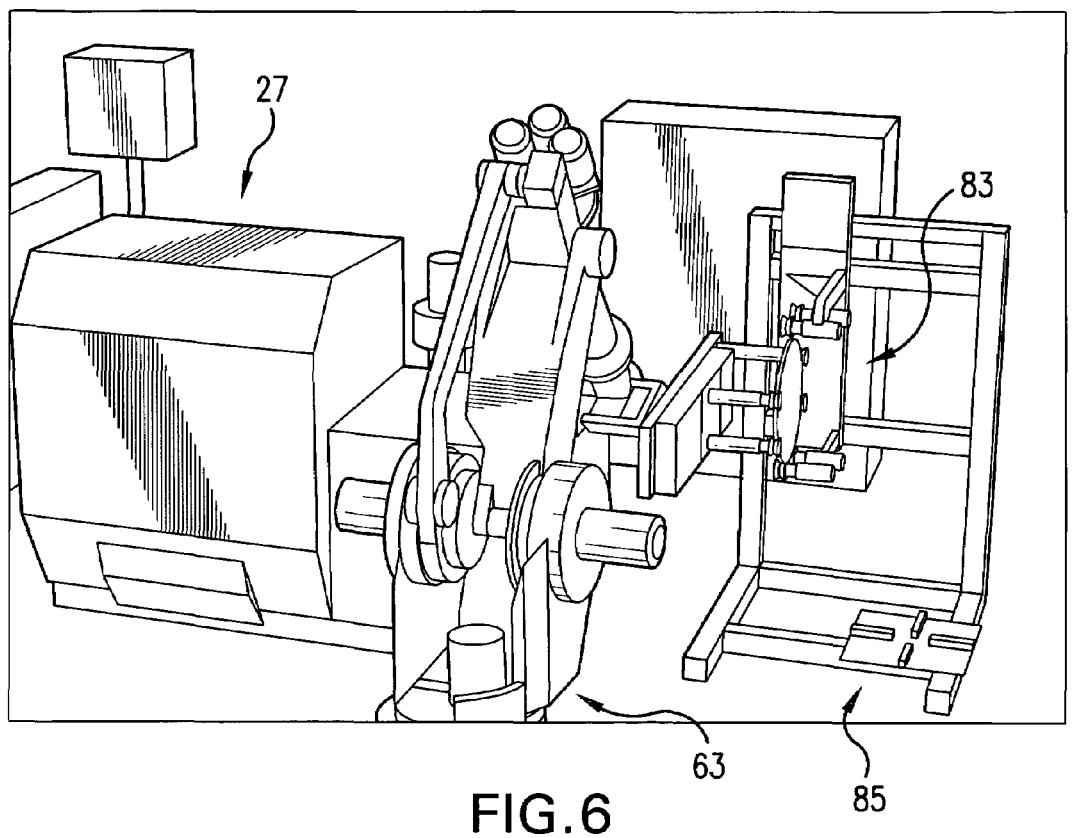
Figure 7:
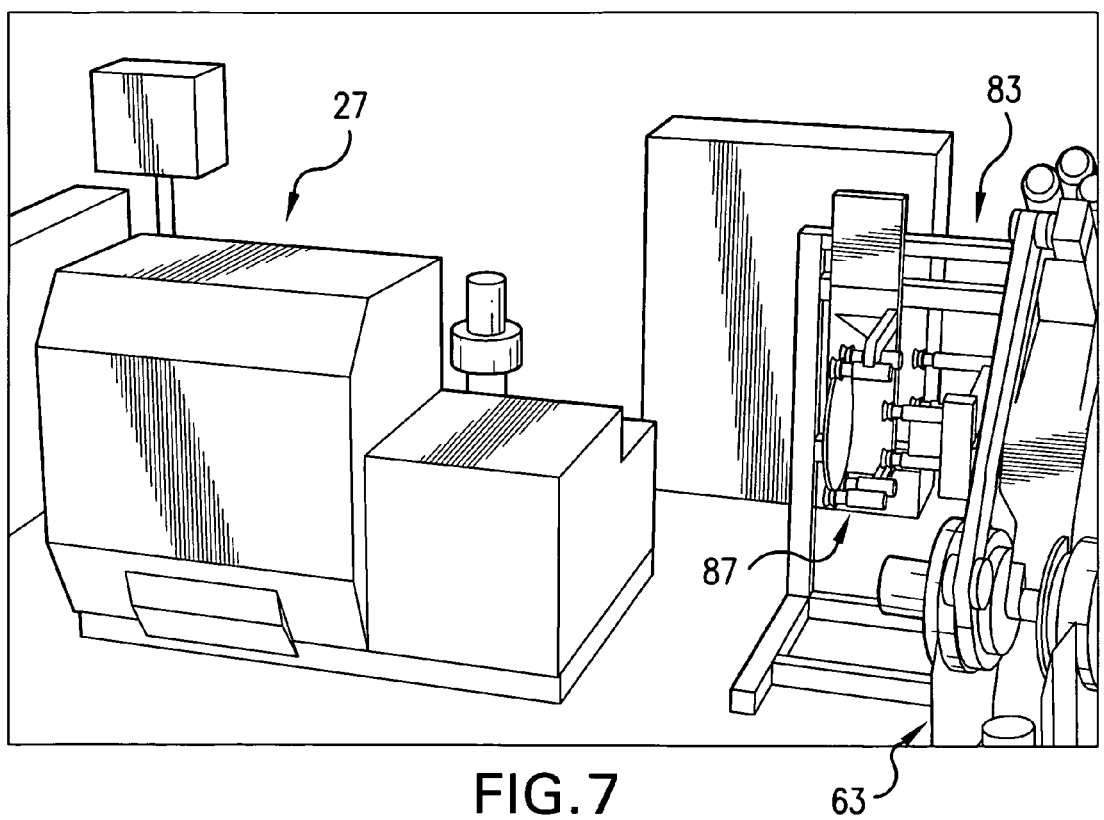

FIG. 6 shows an example of the computer controlled robot 63 placing a target on a special invert fixture 83, which will permit the robot to position and drop off the part to be inverted in a "vertical axis" orientation in the fixture 83. FIG. 7 then shows the computer controlled robot 63 repositioning itself on the opposite end of the part in order to re-grip and retrieve the target. As can be seen more clearly in FIG. 7, the special invert fixture 83 has end effector type grippers on the top and bottom 87 in order to grip the target and permit the computer controlled robot 63 to retrieve the target with the end effectors attached onto the computer controlled robot 63.

According to various embodiments, a further downstream sub system can comprise a degrease and clean station and a drying station that can accept both disk type and HCM parts from one or more upstream computer numerically controlled (CNC) machining centers and can process them one at a time to remove residual cutting fluids, chips and other debris from the machining process. An example of a desirable degrease and clean station and drying station is the Alliance "Aquamate SF", which is a top loading cabinet-style part cleaning system designed for batch processing for low volume parts cleaning. The SF-Series can offer easy top loading. A canopy can be hinged at the rear of the machine. When open, the front edge of the canopy can be beyond the center of a turntable, allowing a part to be loaded/unloaded by the material-handling robot for fast efficient cleaning. The part can be stationery and a spray nozzle can move around the part to perform the degreasing and cleaning. An air knife can be provided to pass over the part after cleaning for drying of the part. The custom top loading type cabinet washer can include stainless steel construction, automatic canopy opening and closing, multiple spray nozzle cleaning, full cascade rinse, and heated air blow-off cycles. The corrosion-resistant spray system can feature an adjustable "clip-on" nozzle for easy maintenance, a vertical seal less pump, auto-fill piping, and a level control with low water safety shut-off. The system can feature a recirculating wash and rinse pump system with solution filtration and can incorporate removable strainer baskets and filter screens for 100% filtration of all solutions. The Alliance system or other similar systems can be a stand-alone system controlled by an Allen Bradley programmable logic controller (PLC) or other PLC or other computer operating network with communication to the main system controller. Control panels can be NEMA 12, designed and assembled to meet NEC standards. Again, for purposes of the present invention, a degrease and clean station and a drying station can be incorporated into one station where degreasing, cleaning, and then drying occurs. Further, any system which can provide the function of degreasing, cleaning, and drying the target can be used in the present invention as long as it can be controlled by the programmable logic controller or other PLC or other computer generating network with communication to the main system controller. The particular design of the degrease and clean station and drying station is not critical to the present invention. The type of degreasing, cleaning, and drying of the target is known to those skilled in the art with respect to cleaning targets after they have been machined. The above description of the particular degrease and clean station and drying station preferably used in the present invention is simply one embodiment that can be used and, clearly, other similar types of stations can be used alternatively or in combination with this station described herein. The degrease and clean station and drying station generally is used after machining of the target as described previously, but can be used further downstream of the overall process if desired, or can be used more than once during the process. However, when the degrease and clean station and drying station are used in the automated system, the present invention can be adjusted based on the desires of the manufacturer. Further, it is preferred that the degrease and clean station and drying station are located near the machining station for convenience and time conservation. However, the location of the station can be anywhere in the automated line.

Figure 8:
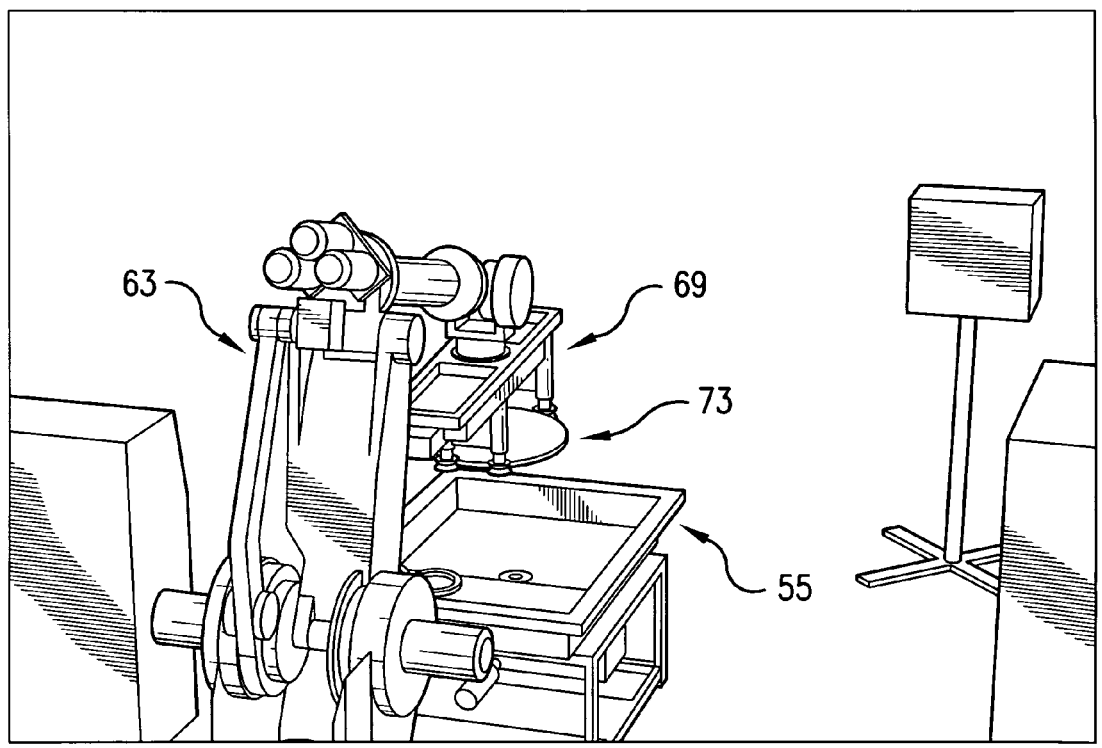
Figure 9:
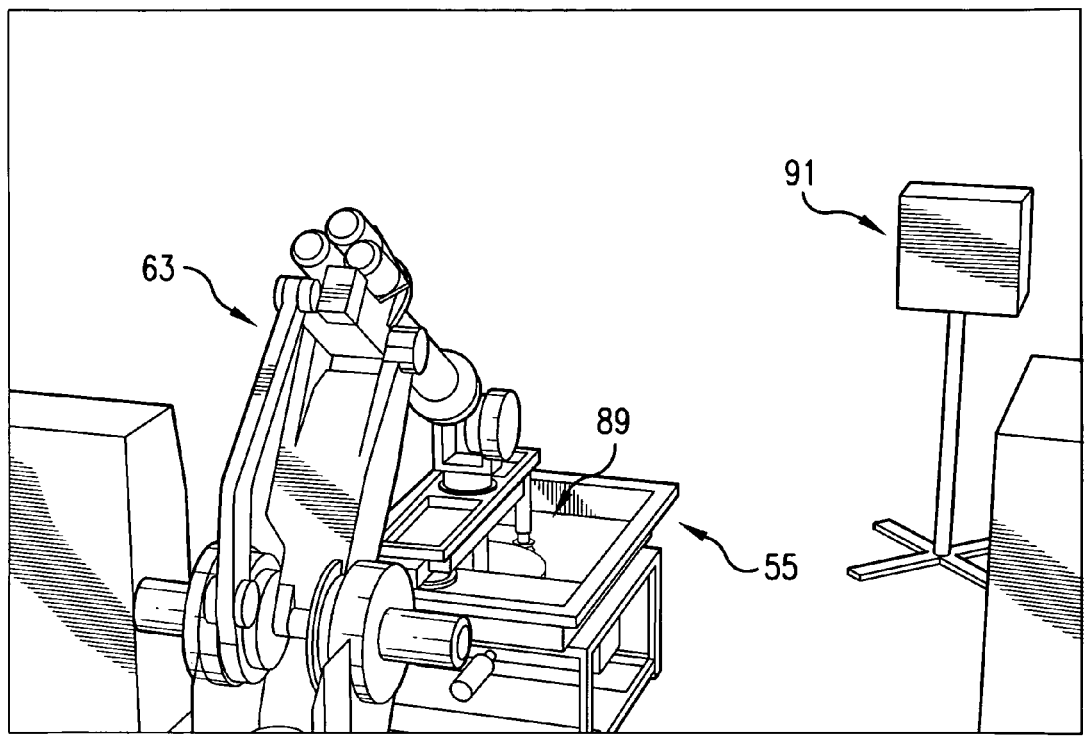
Figure 10:
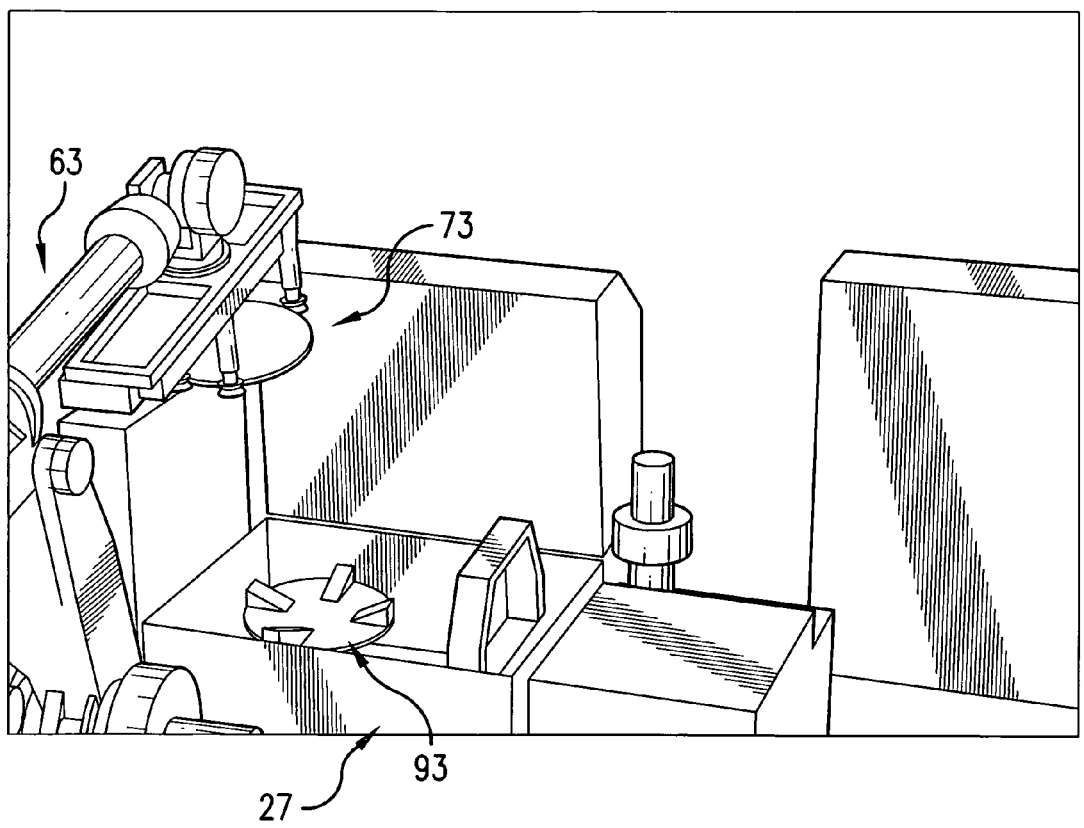
Figure 11A:
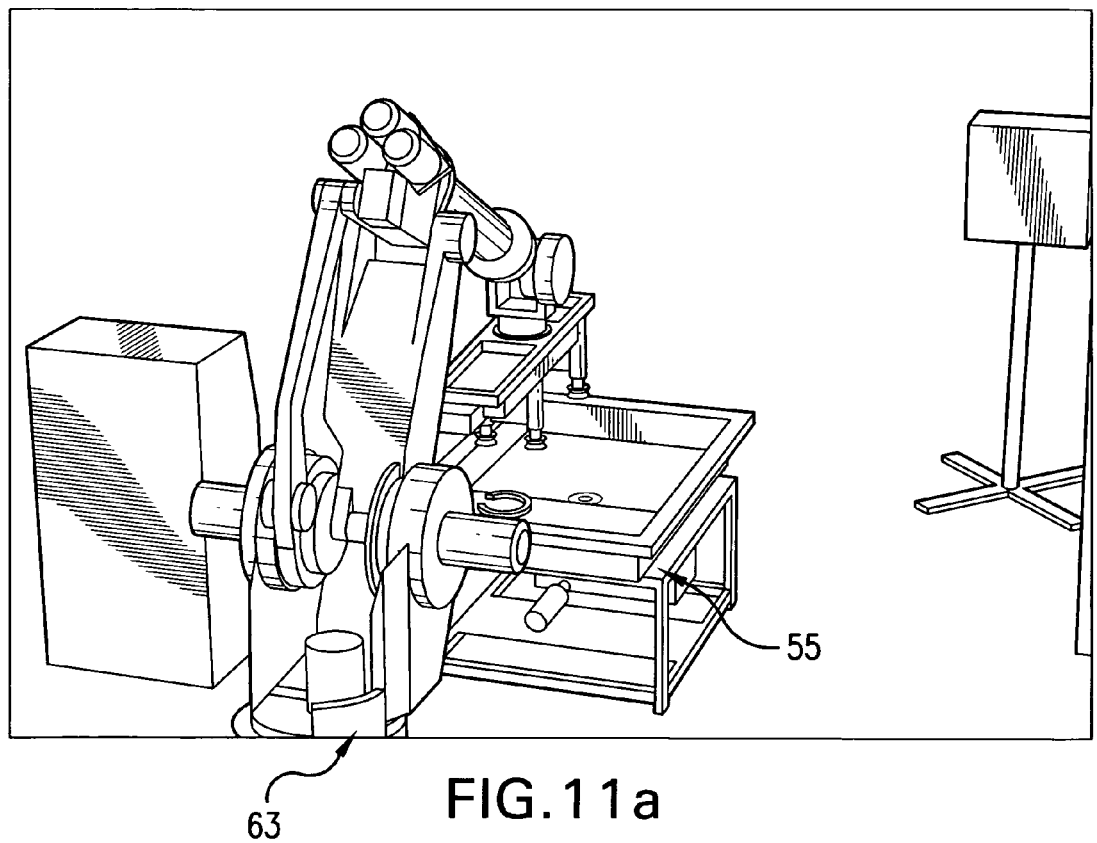
Figure 11B:
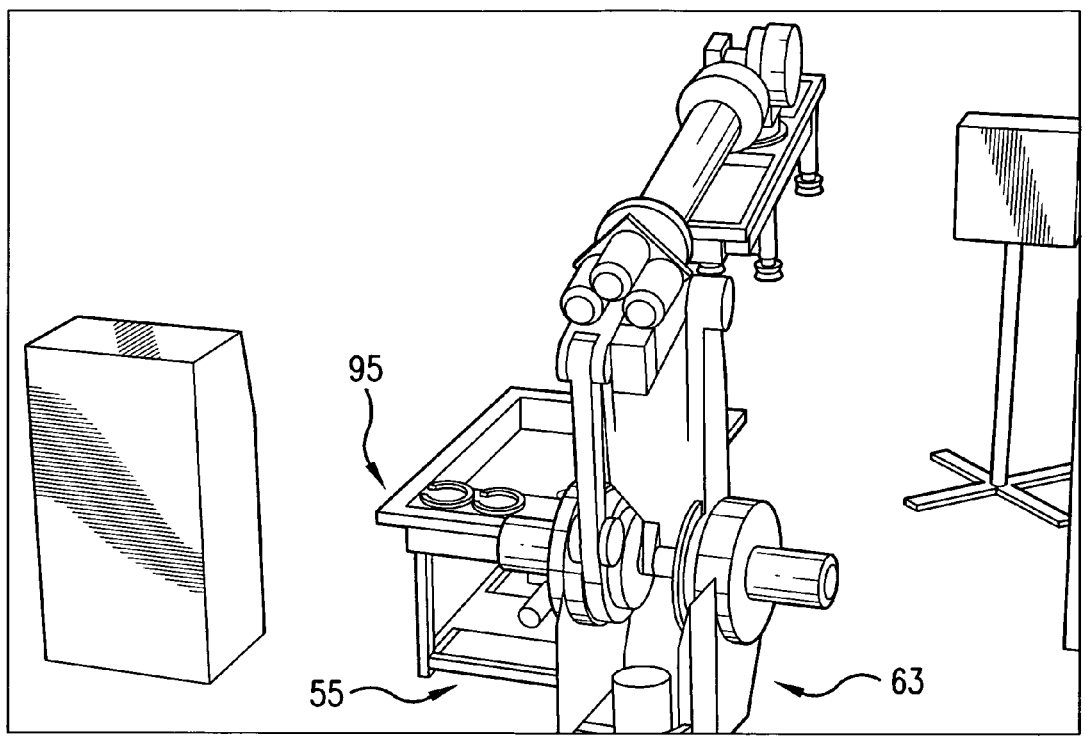
Figure 12:
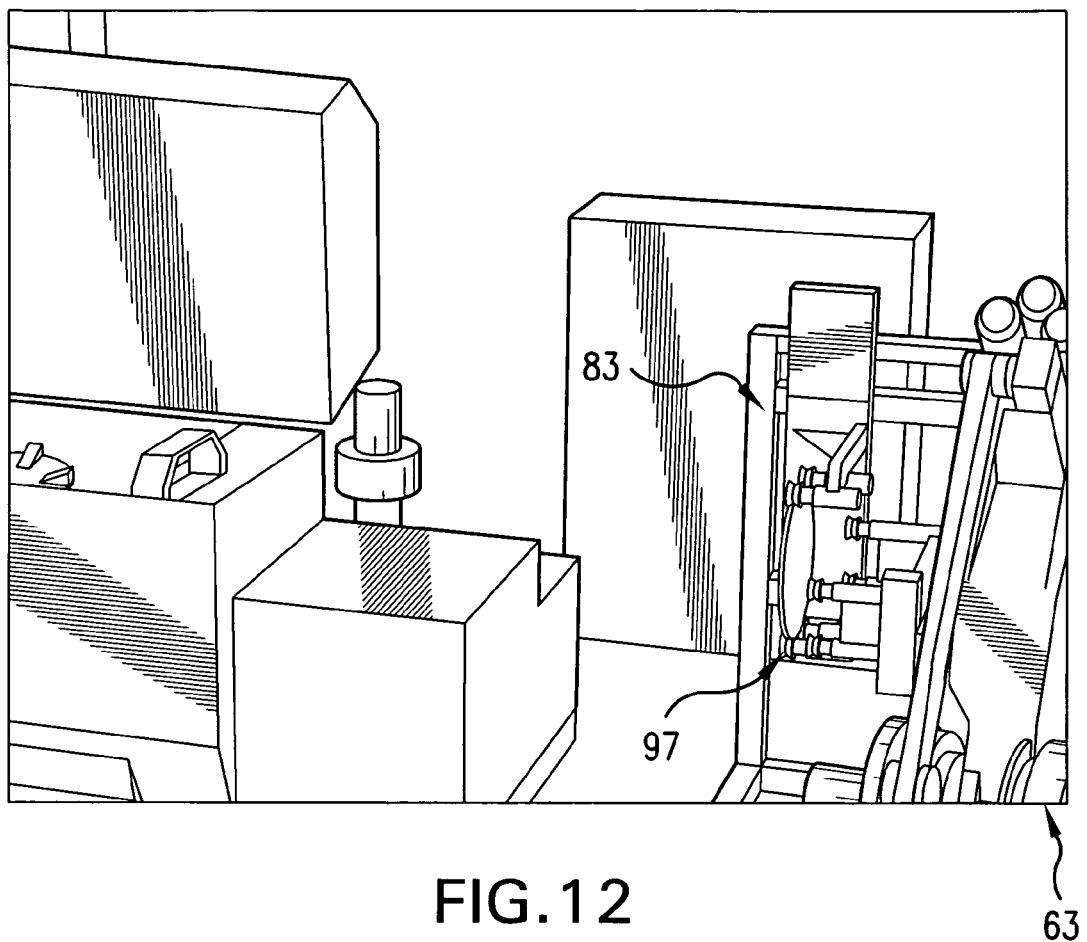

According to various embodiments, an ultrasonic measuring station can be used in the automated system of the present invention. The ultrasonic measuring station can be used at any time throughout the process of the present invention, such as after machining of the target and before the use of the degrease, clean, and drying station. The ultrasonic measuring station can be used at any point before or after these operations. The ultrasonic measuring station is completely optional and is for quality control purposes. The ultrasonic measuring station preferably determines the thickness of the target on a backing plate and optionally can determine the thickness of any part or the overall thickness of the sputtering target with backing plate or the HCM target. Generally, the ultrasonic testing involves submersing the part in a liquid, such as water or gel, and through the use of a Piezo electric transducer, ultrasonic signals can be sent through the target, and depending upon the reflection, a computer determination can be made of the thickness of a particular part of the target. The ultrasonic testing machine is known to those skilled in the art and is used to determine the thickness of metal articles, such as sputtering targets. The present invention, unlike previous uses, has incorporated the ultrasonic measurement station as an automated aspect of the overall automated line such that the ultrasonic measuring station is in computer communication. Thus, the ultrasonic measurement station can be a stand-alone system controlled by an Allen Bradley PLC or other PLC or other computer operating network with communication to the main system controller. Upon the measurement occurring in the ultrasonic measuring station, this information can be sent to the main system controller and compared to previously established specifications to ensure that the target meets those previously established specifications. If the target does meet those previously established specifications, the target will proceed through the remaining steps of the automated line to form a finished sputter target. If the specifications are not met, then the robot will take the rejected target to a reject location in the automated line. One example of an acceptable ultrasonic measuring device is from Krautkramer, Model No. USD30. FIGS. 8-12 show various stages of the ultrasonic measurement station 55 and a target 73 being submersed in the ultrasonic measurement station using the computer controlled robot 63 and the end effector gripping device 69 or the cleaning stage. FIG. 8 shows the target prior to being submersed in the ultrasonic measurement sink, and FIG. 9 shows the actual submersion of the target in the sink with water in it. After the ultrasonic measurement testing is completed, the robot 63 will retrieve the target from the sink 89 of the ultrasonic measurement station 55 and then place the target 73, as shown in FIG. 10, in the degrease and clean station and drying station 27. The degrease and clean station and drying station 27 has a turntable 93 to receive the target 73 from the robot 63. FIG. 10 shows the top loading cabinet style of the cleaning system. Upon the loading of the target 73 onto the center of the turntable 93, the top loading cabinet door will close so that the target can go through a pre-programmed series of degreasing, cleaning, and drying. During this operation, the computer controlled robot 63 can, as shown in FIG. 11A, return to the ultrasonic measurement station 55 or some other station in order to clean and/or dry the prongs of the end effector. As shown in better detail, FIG. 11B, the ultrasonic measurement station 55 has two circular drying ports 95 wherein the prongs of the end effector can be placed in or above in order to be dried rapidly since it is preferred not to have any water marks on the target upon the degrease, clean, and drying step. Upon completion of the degrease, clean, and drying of the target in the cleaning station and drying station, as shown, for instance, in FIG. 10, the computer controlled robot 63 using the end effector will retrieve the target from this station and proceed to the next station. Other thickness measuring devices can be used. As an option, in order to have the correct orientation of the target, the computer controlled robot 63, as shown in FIG. 12, can return to the special invert fixture 83 in order to invert the orientation of the target.

Figure 44:
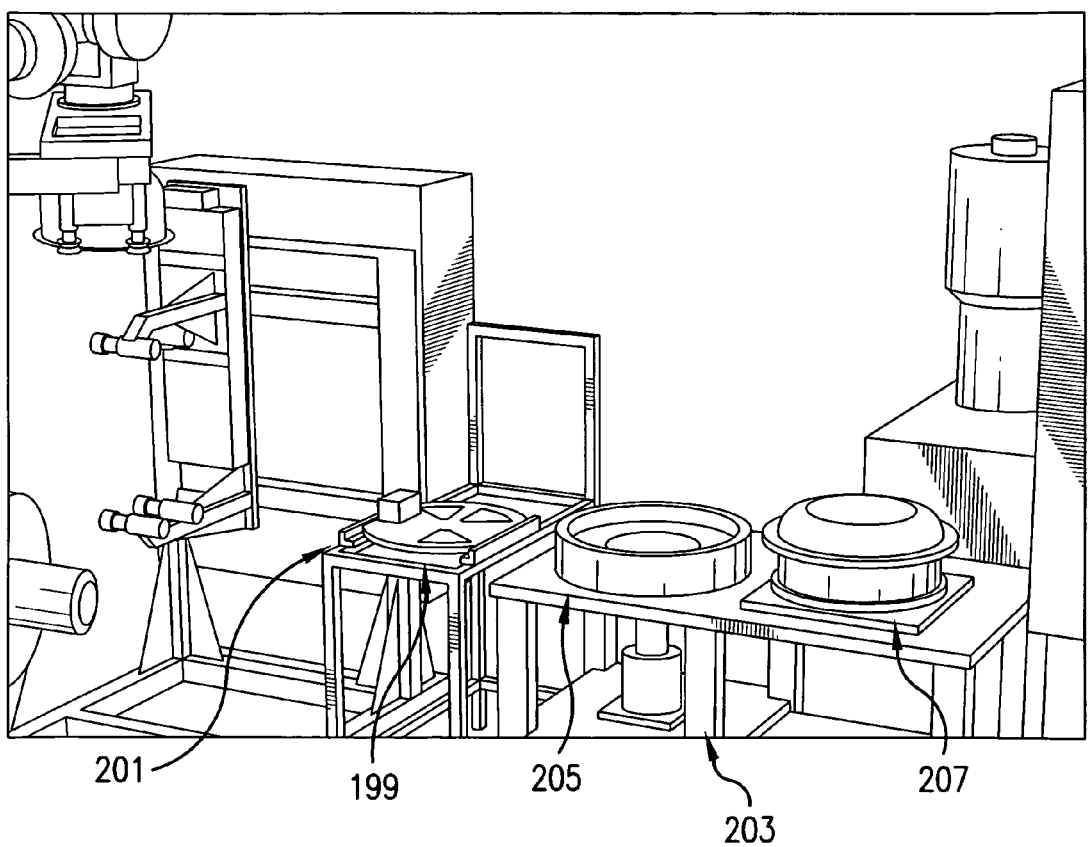
Figure 45:
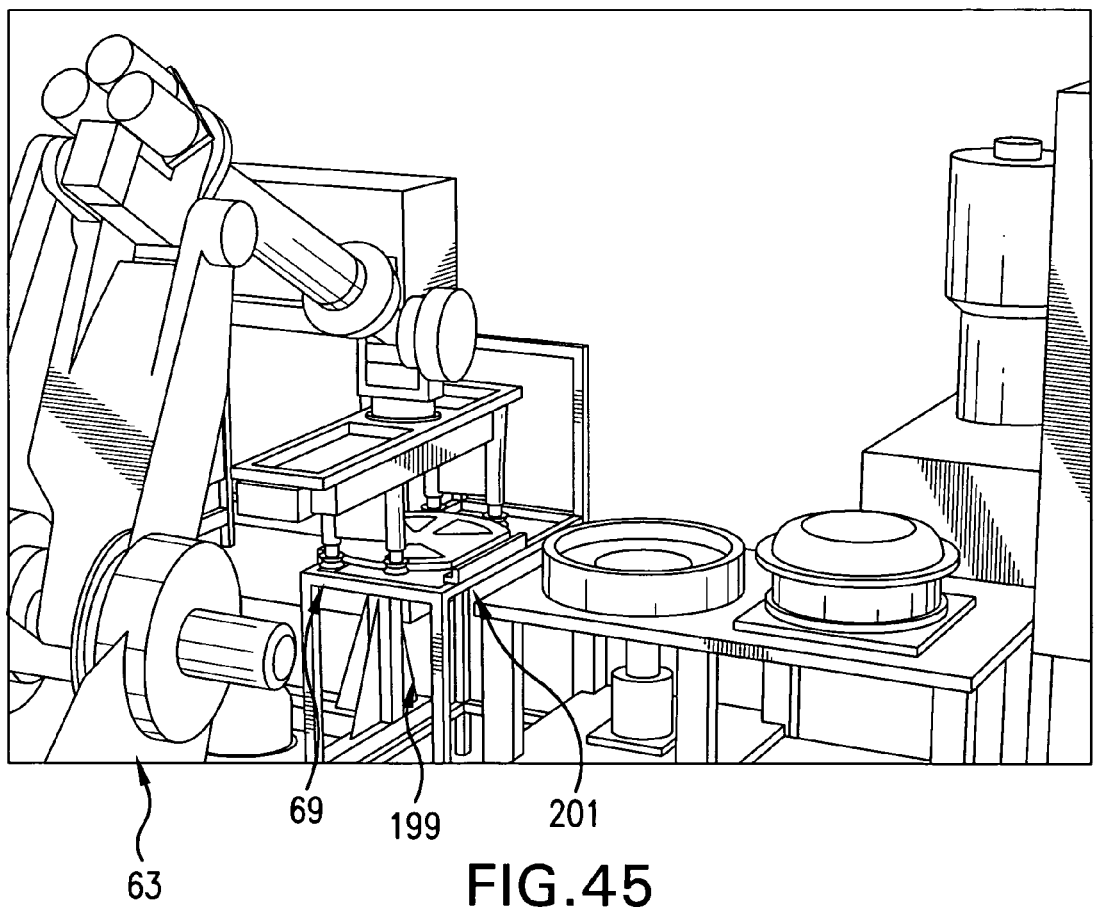
Figure 46:
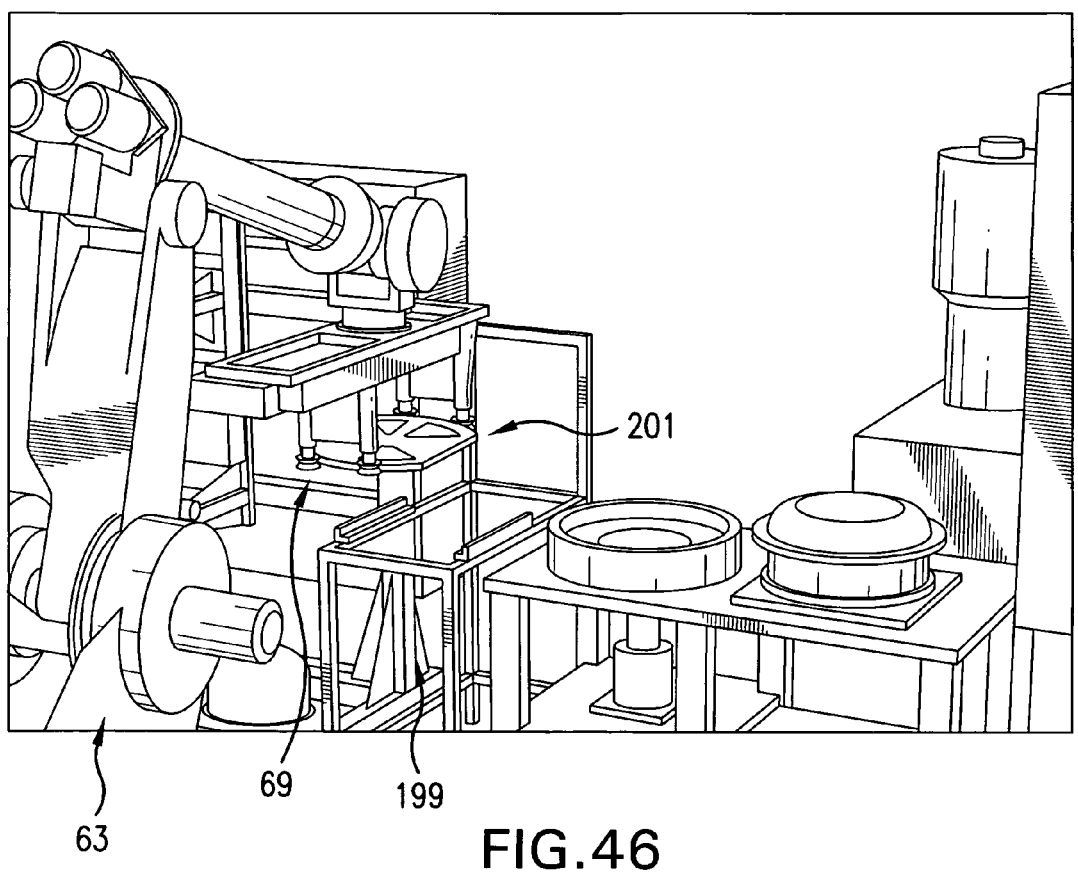
Figure 47:
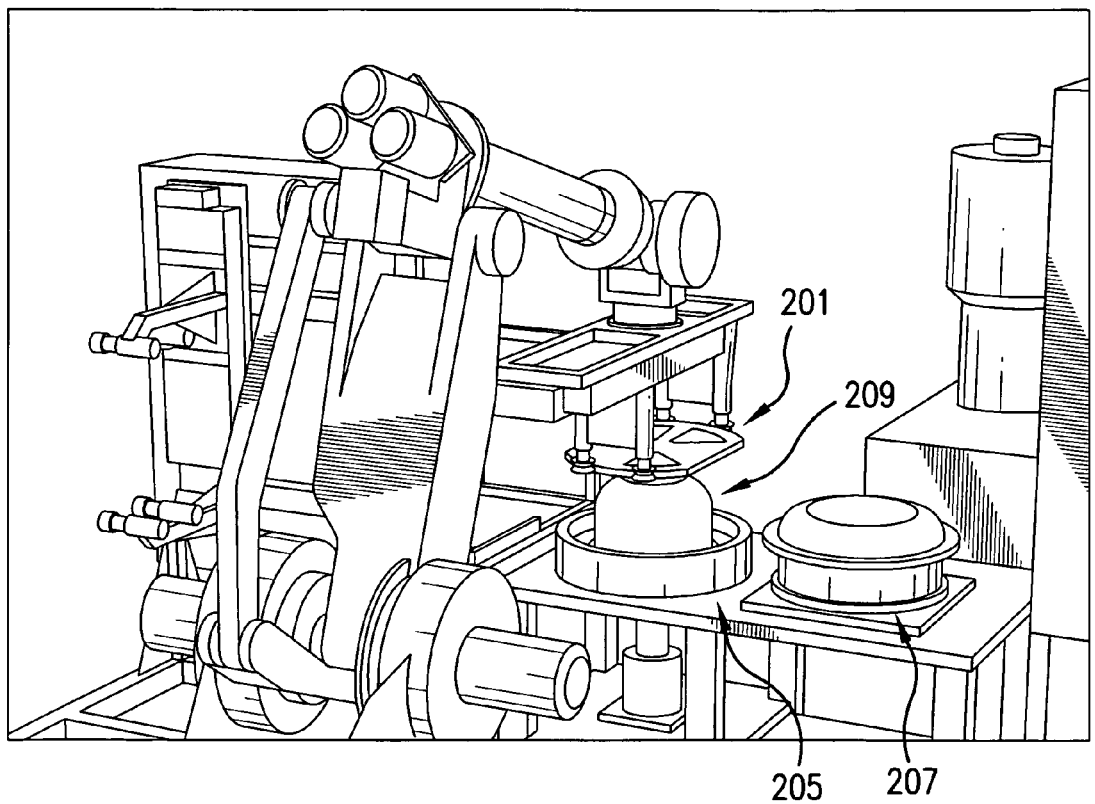
Figure 48:
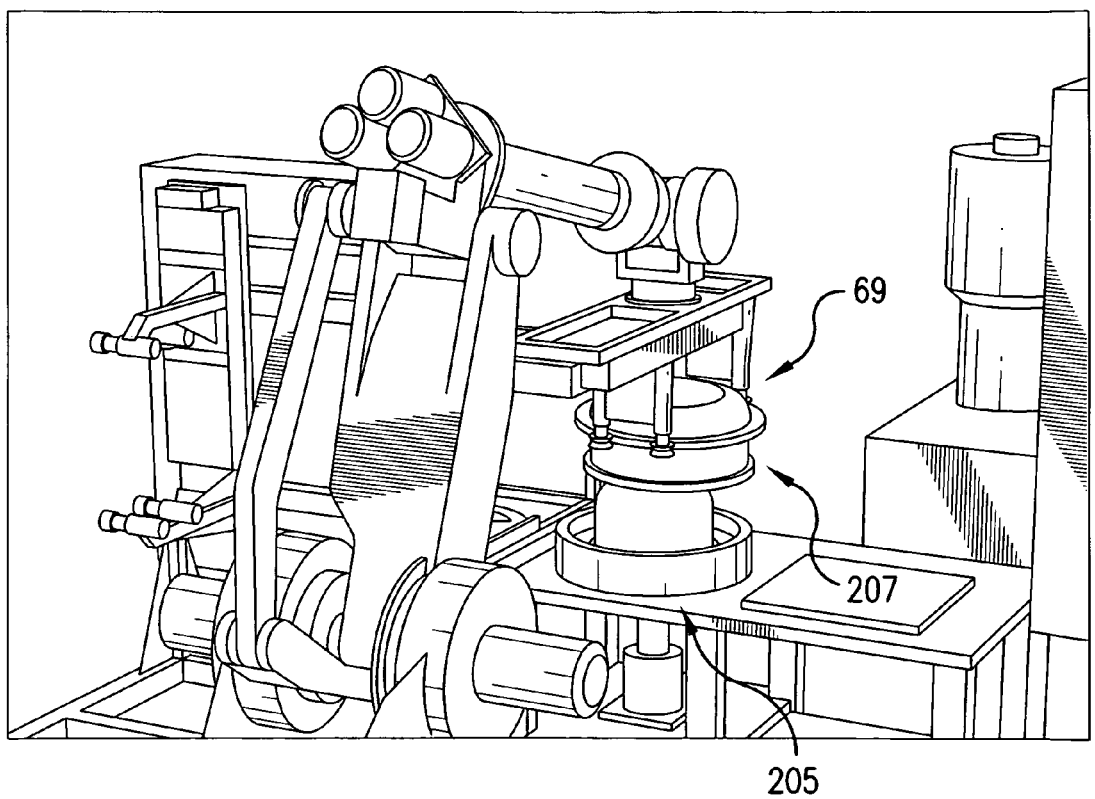
Figure 49:
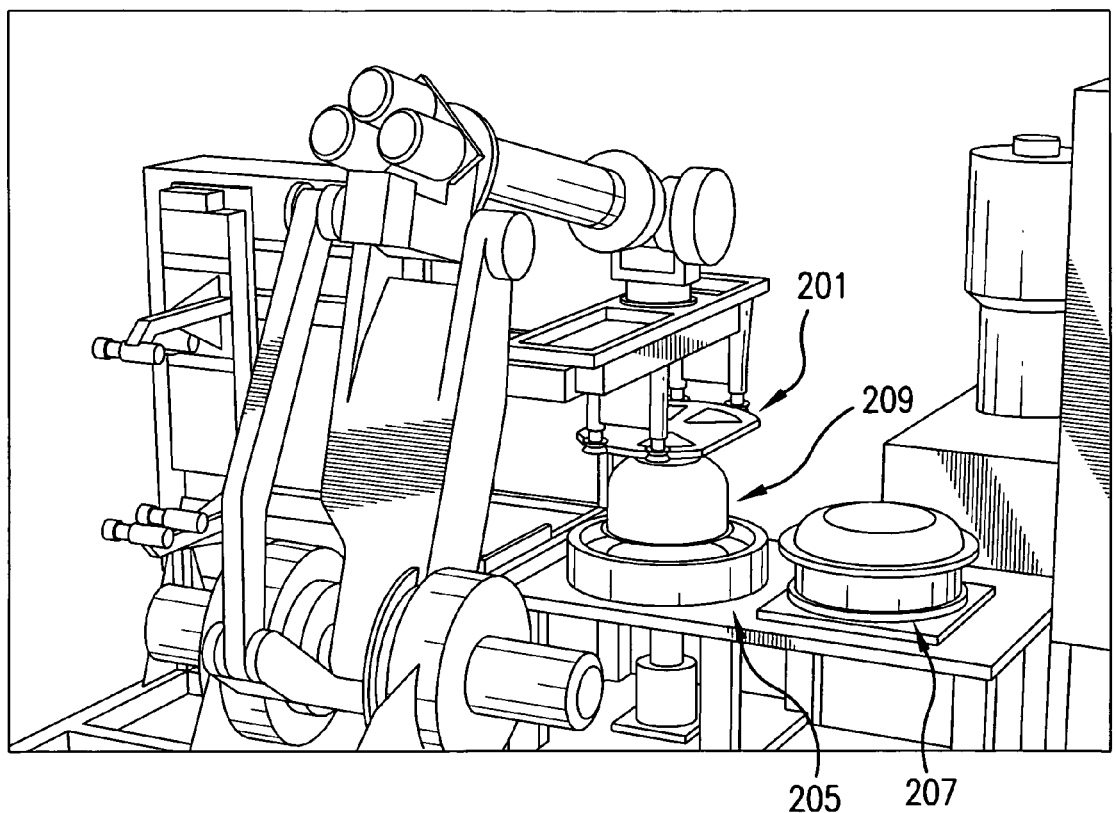

According to various embodiments, a leak test station can be provided at which an helium mass spectrometer (HMS) leak test or other leak test can be performed on the HCM parts to detect leak paths through the flange welds of the HCM parts, which typically have been machined. The station can include an HCM specific leak test fixture/chamber designed to accommodate both sizes of HCM parts, at least one Varian Helium Leak Detector instrument, and an appropriate pump, valve, pressure transducer, and regulator to connect the leak test circuitry to the test fixture/chamber. A blower can be connected to the test circuit and fixture/chamber and can be utilized to purge remaining helium from test circuits and fixture/chamber areas following the test cycle. Test fixture/chamber can utilize o-ring seal designs for sealing the test chamber on the HCM parts. Additionally, the HMS test equipment can be integrated to a machine frame to provide a complete test cell. The HMS Leak Test station can be a stand-alone system controlled by an Allen Bradley PLC or other PLC or other computer operating network with communication to the main system controller. With respect to the leak test station, the leak test station is generally only used with HCM parts and is not a test usually used with disk type parts. The leak test station is optional in the automated line. A leak test can easily be done outside of the automated line as well. The location of the leak test station can be anywhere in the automated line if used. The actual leak test that occurs, as well as the information provided by the leak test, is known to those skilled in the art and is a conventional test conducted by target manufacturers. What is relevant to the present invention is the fact that the leak test station can be incorporated into the automated line and done automatically, and the data obtained by the leak test can be provided to the PLC or other computer operating network in communication with the main system controller. This data can then be compared with previously established parameters or specifications to ensure that the HCM part passes and has no leaks that would be sufficient to consider the part a failure. All of this testing can be done automatically through the use of the robot in communication with the PLC and main system controller. Besides a helium mass spectrometer leak test, any other type of leak test which can perform a similar determination of the HCM part can be used in the present invention and can be arranged so that it is controlled by the PLC or the computer operating network in communication with the main system controller. FIG. 44 shows the overall leak station 203 with the HMS fixture/chamber 205 and the lid 207 for the chamber. Further shown in FIG. 44 is a station 199 to hold an attachment for the end effector wherein the end effector of the computer controlled robot can grab this device which will then permit the robot to pick up an HCM part on top using a vacuum. FIG. 45 shows the computer controlled robot 63 picking up this vacuum holder using the end effector 69. This is further shown in FIG. 46. FIG. 47 shows the vacuum gripper 201 holding HMC target 209 and placing it into the chamber 205. Afterwards, the computer controlled robot 63 can put the lid 207 onto the chamber 205 and seal it for the leak test to be conducted. As shown in FIG. 45, the end effector 69 can pick up the lid 207 without the use of the vacuum gripping means. After the test, the lid 207 can be removed by the computer controlled robot as shown in FIG. 48 and the HCM part 209 can be removed from the chamber 205 by the vacuum gripper 201 as shown in FIG. 49.

The helium mass spectrometer leak test system or other leak test system can also be used to test the vacuum integrity of the o-ring seal on the disk type or HCM style parts.

According to various embodiments, dimensional inspection can be performed on all disk type and HCM parts, for instance, in a dimensional inspection station, for conformance to part geometry and tolerance of all finished machined parts. The Mitutoyo Coordinate Measuring Machine (CMM) or other type of CMM can have a work cell range to accommodate all parts and uses the latest technologies. The dimensional inspection can be any type of dimensional inspection device that can provide dimensions of a metal article. The coordinate measuring machine can be any brand name and preferably is a stand-alone system that is controllable by a PLC or other computer operating network with communication to the main system controller. The dimensional inspection station is optional in the present invention, and is capable of measuring the dimensions of the target to ensure that the dimensions are correct for the specifications set forth by the user of the sputter target or the dimensions set by the manufacturer of the sputtering apparatus. The dimensional inspection is a quality control measure, which can be used and is completely optional. Should the dimensions not be within pre-set specifications, the program can be designed so that the target will then be considered rejected and ultimately sent to the reject location. Thus, in the present invention, the automated system has the ability to compare the actual dimensions of the target, for instance, using the dimensional inspection station to dimensions considered acceptable due to product specifications that have been inputted into the PLC or main system controller. The computer will then compare these values and determine whether the product is within acceptable dimensions or not. If the target has acceptable dimensions, it will proceed in the automated production line so that it can be finished as a target. The location of the dimensional inspection station can be located anywhere in the automated line, and its location is not important. Also, the dimensional inspection can occur one or more times and can occur at any point in the process.

Figure 15:
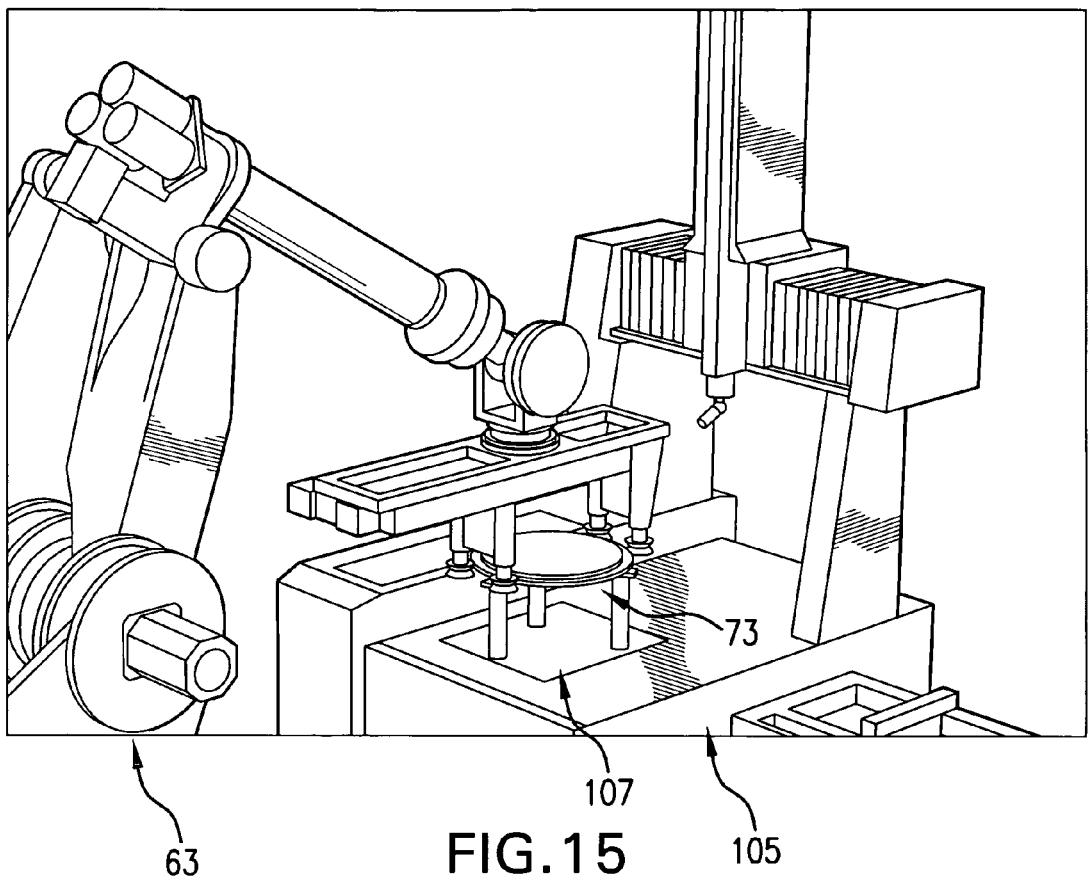
Figure 16:
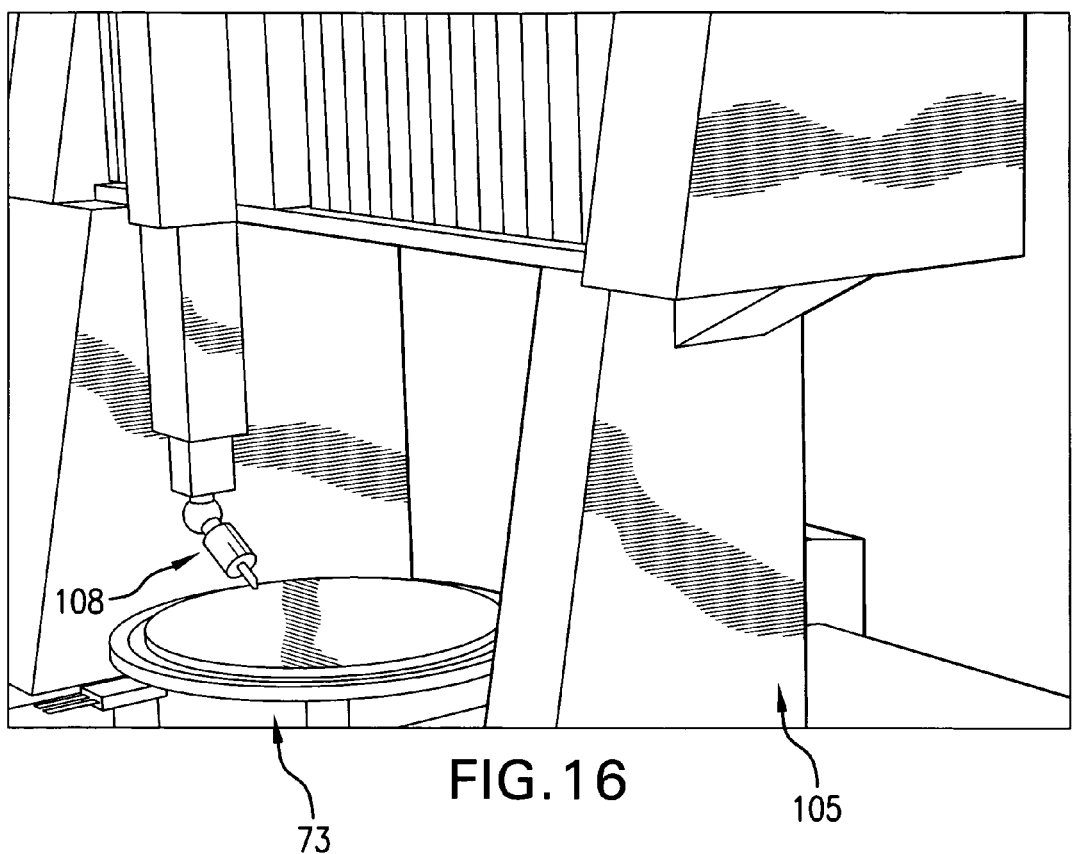
Figure 50:
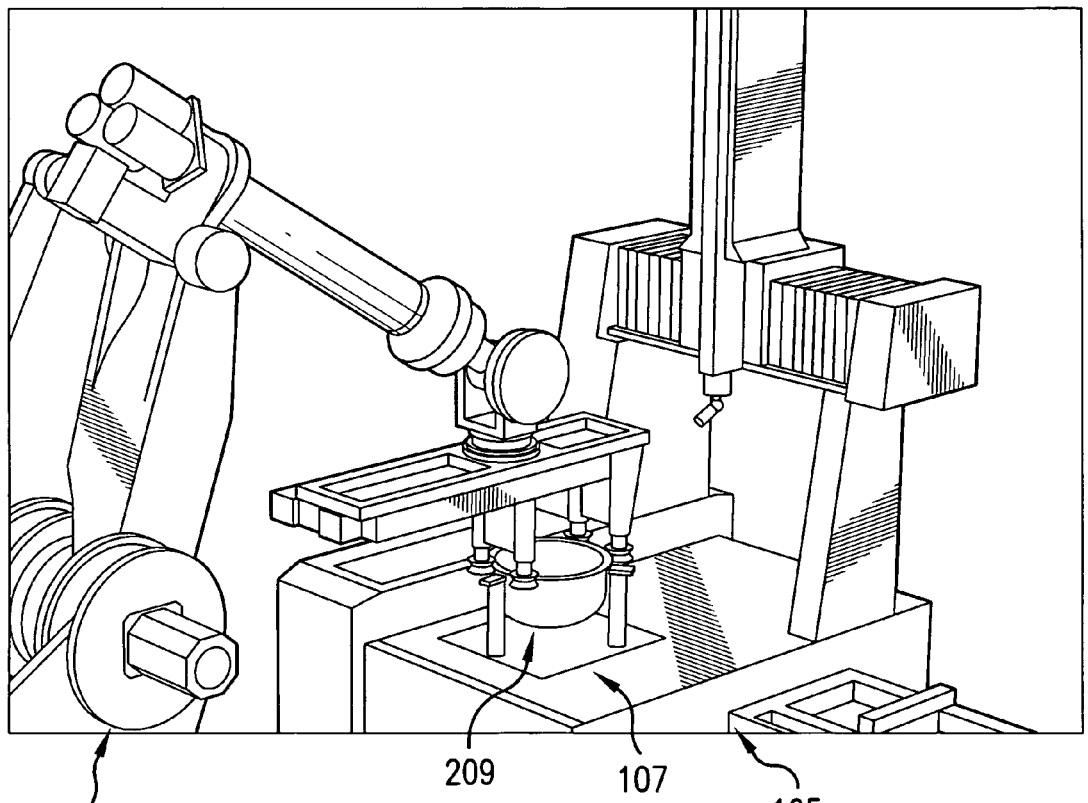

According to various embodiments, the CMM System can communicate with an electronic device through Digital I/O and file outputs in the system database. Additionally, a custom fixture can be mounted to the CMM table to accept the part for measurement. In FIG. 15, the computer controlled robot 63 using the end effectors is shown placing a target 73 on the dimensional inspection station 105, which includes three legs or columns to receive the bottom of the target 73. FIG. 16 shows the computer measuring probe 108 of the dimensional inspection station 105 taking dimension measurements of the target 73. FIG. 50 shows the CMM station 105 wherein an HCM target 209 is placed on the stand 107 for dimensional analysis by the computer controlled robot 63.

With respect to additional steps in the present invention, grit blasting and arc spray operations are inherently noisy, dusty, and dangerous operations that are preferably completed by robots rather than human operators. In addition, for large sputtering targets, the weight of the sputtering target can exceed 100 pounds, so there is a safety hazard in manually loading and unloading sputtering target assemblies into the grit blasting and arc spray systems.

The present invention solves the problem of keeping humans away from the grit blasting and arc spray operations and eliminates the need for human handling of the loading and unloading of the grit blasting and arc spraying systems.

During the arc spray and grit blasting operations, masking is required to limit the areas affected to those specified by the customer. In order to protect the target from the grit blasting and arc spray, masks are attached to the target. The automated application and removal of the masks to the target is a novel development and is used to achieve full automation of this part of the process. The present invention accomplishes this automated mask application and removal.

In previous systems, it was usual for masking of the part to be accomplished manually. The present invention provides an automated method and apparatus for applying and removing grit blasting and arc spray masking. The present invention is preferably applied to the manufacture of sputtering targets, but may be applied to the manufacture of other objects of geometry similar to sputtering targets, namely large flat objects needing masking in annular regions.

In this invention, grit blasting and arc spray masks are made of a material that is capable of resisting the erosive effects of the grit blasting and arc spray process.

The masking is designed to fit precisely on to the part being grit blasted or arc sprayed. Generally, a two part mask is used and the masks are supported by a skeleton which permits the robot to grab on to.

In the preferred embodiment of this invention, a robot selects the proper mask prior to grit blasting a specific part from a storage location and attaches the inner and outer mask to the sputter target. A signal is sent from the robot to the master computer when the masks are in place. The master computer initiates the grit blasting operation. When the grit blasting operation is completed, then a signal is sent from the master computer to the masking robot and the masking robot removes the grit blasting masks and replaces them in their storage location. The masking robot then proceeds to the arc spray station and selects the appropriate arc spray masks from the arc spray mask storage location and attaches these marks to the work part, once the part has been moved to the arc spray station. When these masks are in place, a signal is sent to the master computer and the arc spray process begins. When the arc spray process is completed, the master computer signals the masking robot and the masking is removed and placed back into their proper storage locations.

In more detail, according to various embodiments, a processing station can be provided with a grit blast machine that can be designed to automatically etch the outer flange area of the work pieces (disk type parts and HCM parts). The machine configuration can include an acoustical steel cabinet to enclose the grit blast process. Mounted on the front of the grit blast cabinet can be a vertical sliding door. This fixture can automatically open access to the cabinet for part loading and retract to remove parts once the cycle is completed. The part fixtures can include a spindle fixture that rotates the parts during the grit blast process. According to various embodiments, the machine controller can send a signal to the machine to indicate what style part is to be processed. The part to be grit blasted can be placed into the fixture by the robot end effector. When the part is properly loaded onto the fixture a separate overhead robot, such as a Fanuc LR Mate or M16i robot, can then place the required masking on the sputtering part. The masking, in one embodiment, is a two-part masking system. One part of the masking is to cover the outer circumference of the backing plate, and the second part of the mask is to cover the target material that will be sputtered, such as the tantalum. The robot will sequentially place the two-part mask on the target part to protect the areas which are not to be grit blasted. Since the grit blast station is in computer communication with the PLC or other computer operating network or the main system controller, the separate robot at the grit blast station will know which mask to use for the type of target being grit blasted since all of this can be automatically tracked and programmed. Various locators on the mask can be used to ensure the proper placement of the mask on the target. Needless to say, the various masks for different shape and size targets are properly located on a table, such as behind the grit blaster. Each of these masks are in an assigned location which the overhead robot recognizes such that the overhead robot from computer commands will obtain the proper mask based on the target being grit blasted. Afterwards, the mask will be removed and returned to its proper assigned location on the table containing a various masks. The fixture can begin to rotate and the grit blast nozzle can be turned on to etch the flange area of the part. When grit blasting is complete, the media flow to the nozzle can be turned off and compressed air can be used to remove residual abrasive from the part. After the part is blown off, the spindle rotation stops and the door opens. In various embodiments, instead of compressed air, an additional washing station can be created to remove abrasives or other unwanted material created from the grit blasting. Preferably, compressed air or some similar medium is used. The same or a different overhead robot can remove the masking, and a second blow off operation can be completed. Spent media can be blown off the parts before the parts are unloaded from the cabinet. The material handling robot on the rail, such as the M900i robot, can remove the finished part from the fixture.

According to various embodiments, the grit blast machine can provide the most uniform and reliable blasting performance possible. Spent media can be recovered pneumatically from the hopper-shaped floor of the cabinet. A cyclone can remove the fines and dust from the reclaimed media. A screening system can be used to insure that a consistent media size is always provided to the blast nozzles. The grit flow rate to the blast nozzle can be monitored and the air pressure to the blast nozzle can be closed-loop controlled. As media breaks down from the blast process it can be replenished with new media. An Allen Bradley PLC or other type of PLC or computer operating system, can be provided to control the operation of the machine. The operator interface can be a monitor connected to the controller.

According to various embodiments, a further downstream station can be provided comprising an arc spray machine that can be designed to automatically apply an aluminum coating or other coating to the outer flange of a work piece, for example, the disk type parts. The arc spray machine can operate very much the same way as the grit blast machine. For instance, a vertical door can open to allow parts in and out of the machine. When the parts are in the machine's fixture, they rotate beneath an arc spray gun for a precise amount of time to build up the proper coating. When the arc spray process is complete the parts are unloaded with a robot. As with the grit blast machine, the arc spray machine can be controlled with an Allen Bradley PLC or other PLC or computer operating system. The masking can be loaded and unloaded automatically as described in the grit blast section. The overhead robot used with the grit blast station can be the same overhead robot that is used in the arc spray station for putting on the mask on the target prior to arc spraying. Alternatively, a separate overhead robot can be used for this operation. Like the grit blast mask, the arc spray mask is preferably a two-part mask and is preferably a separate mask from the grit-blast mask. Again, a table can be used to contain various masks for various shapes and types of targets. The masks are assigned locations on the table such that the overhead robot will know which mask to use with the computer commands. This operation is essentially identical to the operation used for grit blasting. Preferably, each part of the mask has a separate location on the table containing the various masks.

Figure 17:
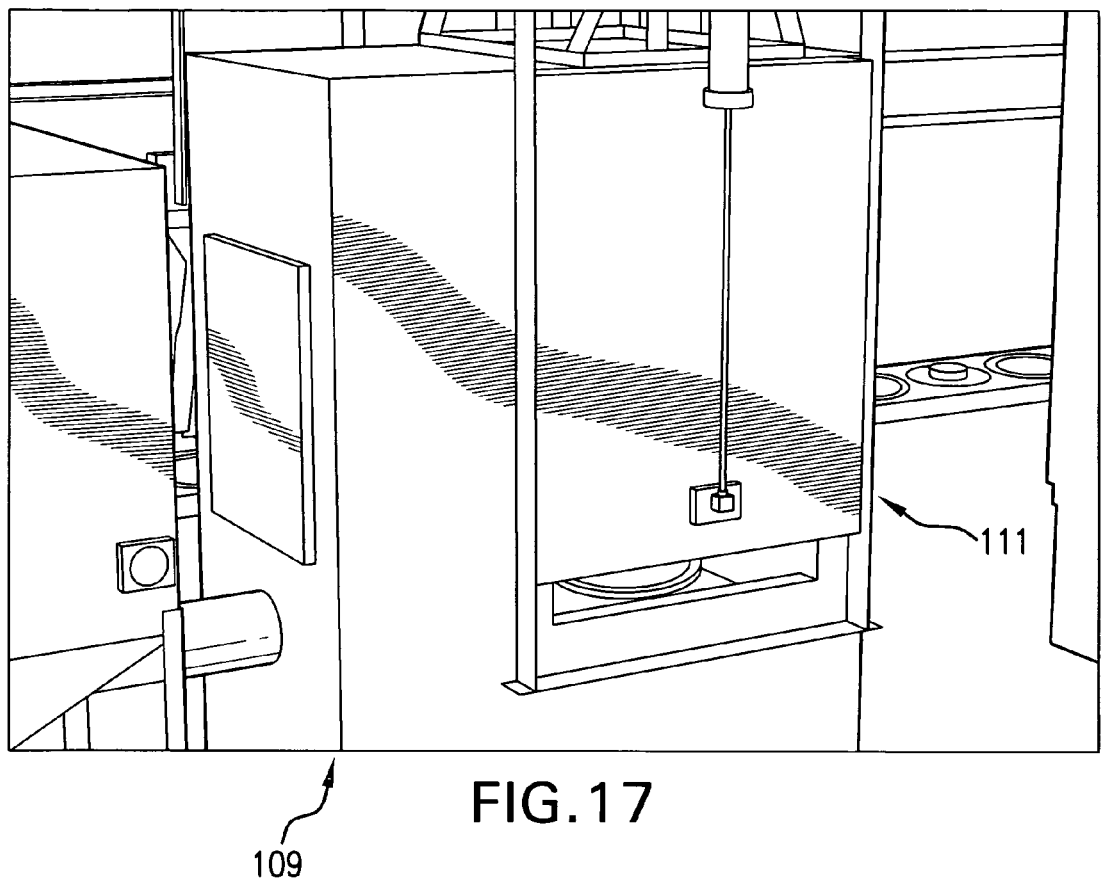
Figure 18:
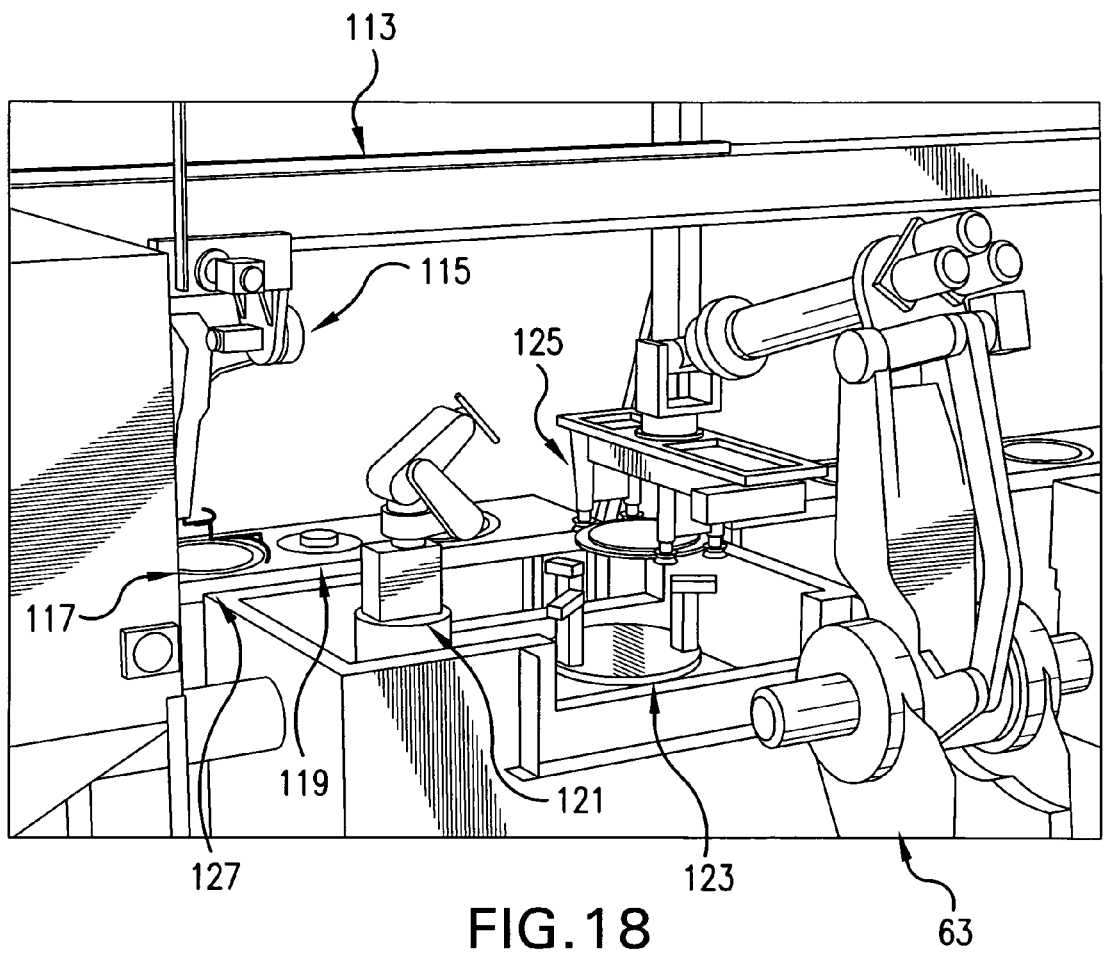
Figure 19:
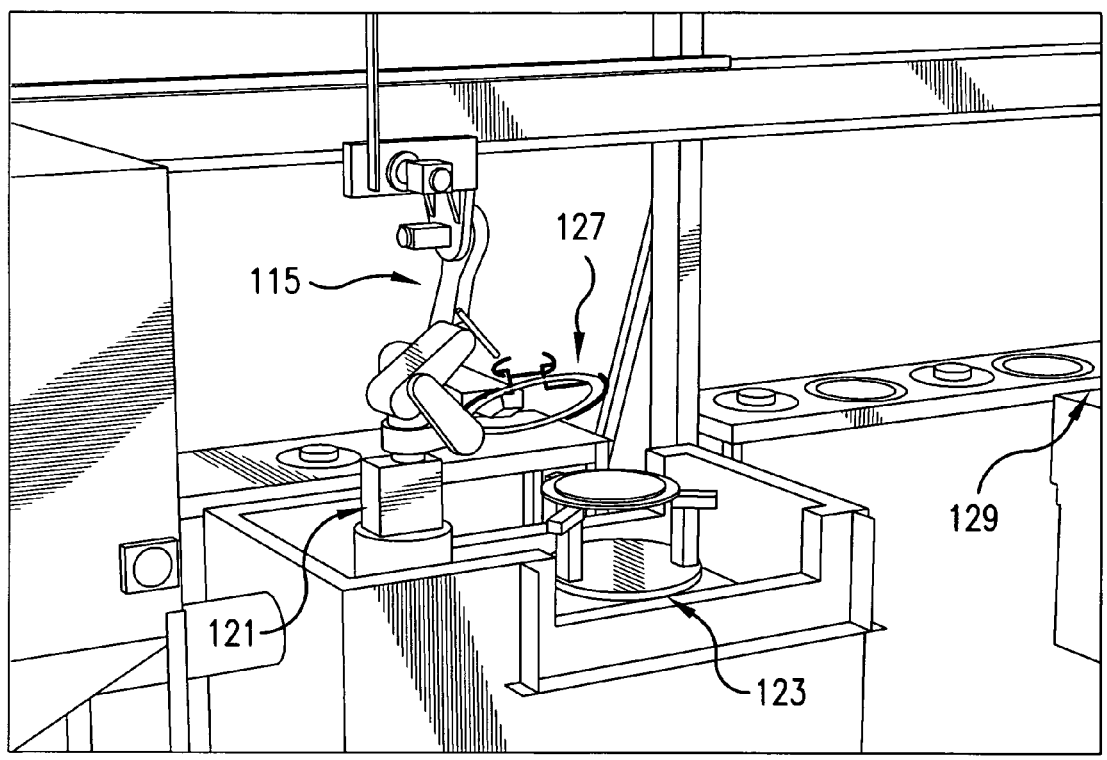
Figure 20:
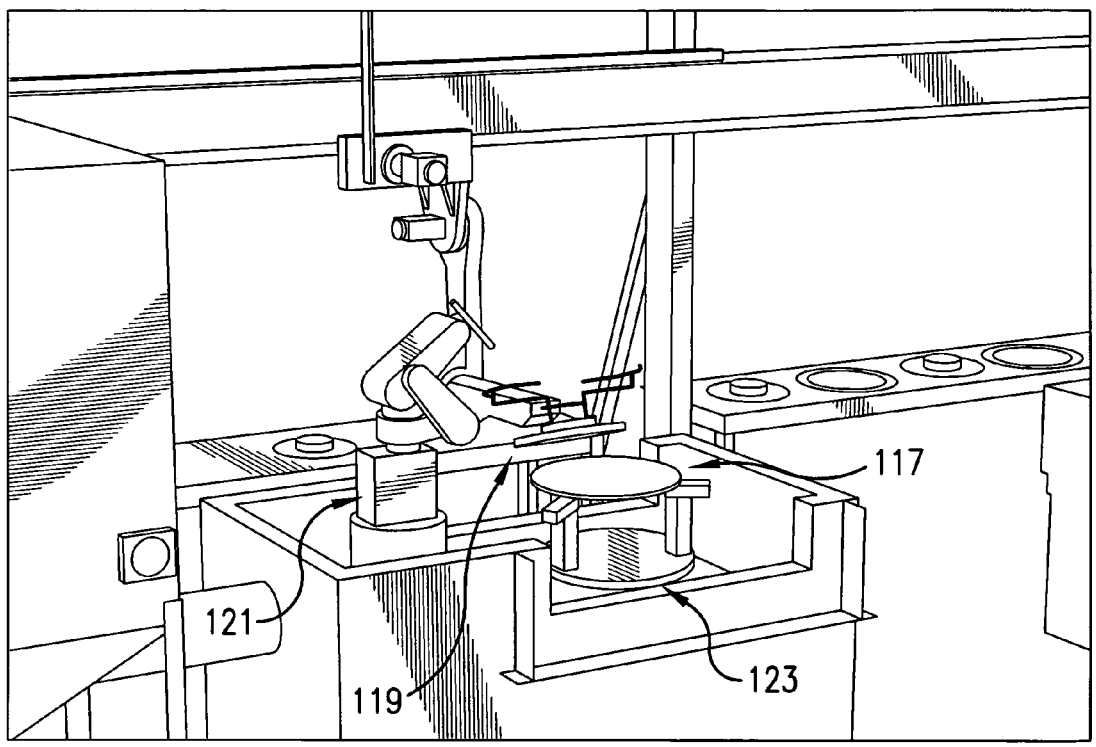
Figure 21:
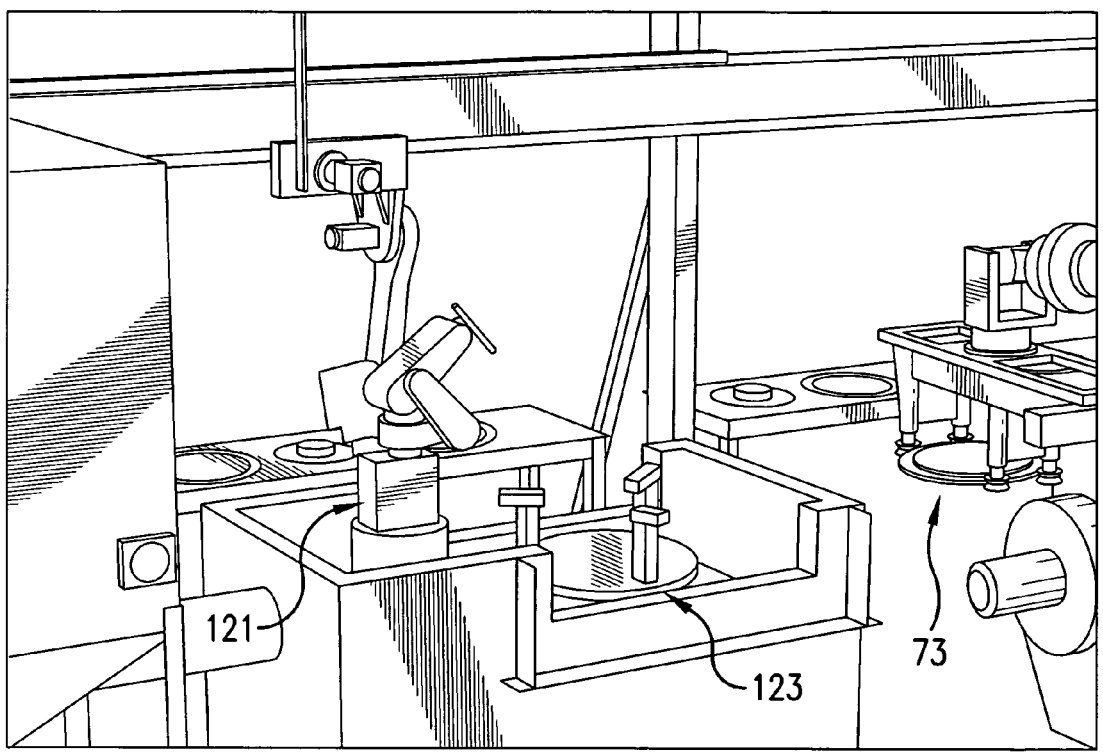
Figure 22:
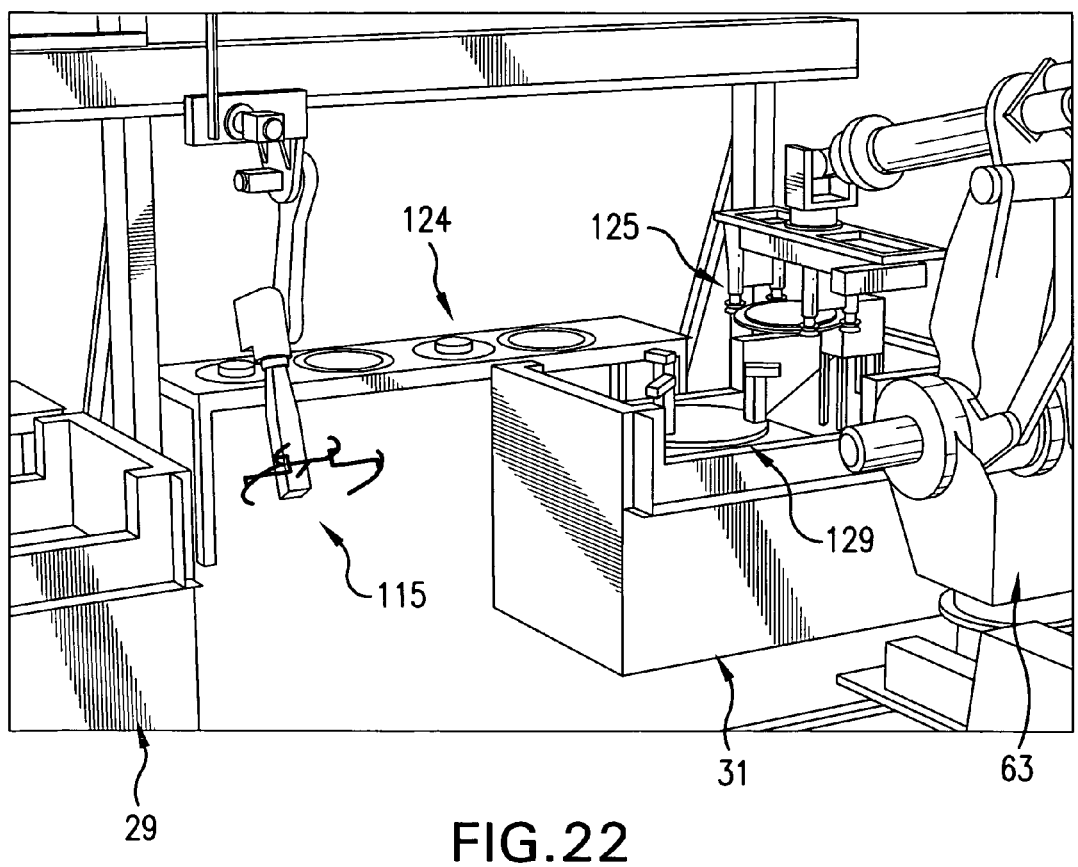
Figure 23:
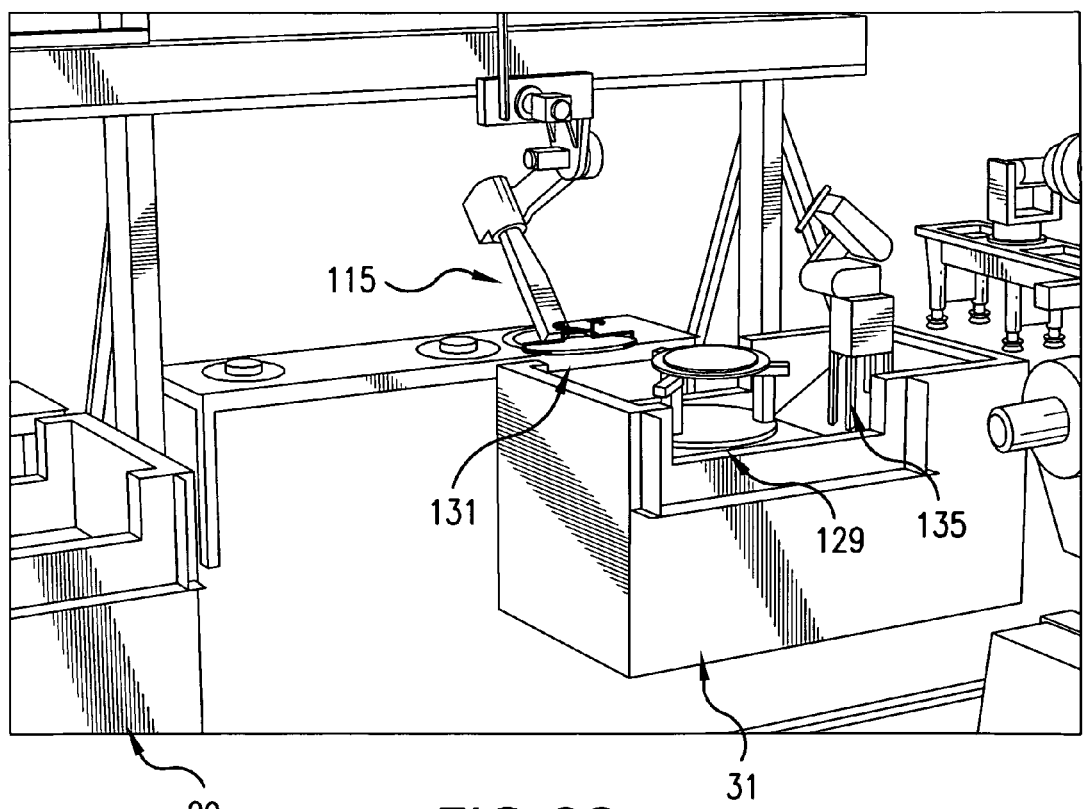
Figure 24:
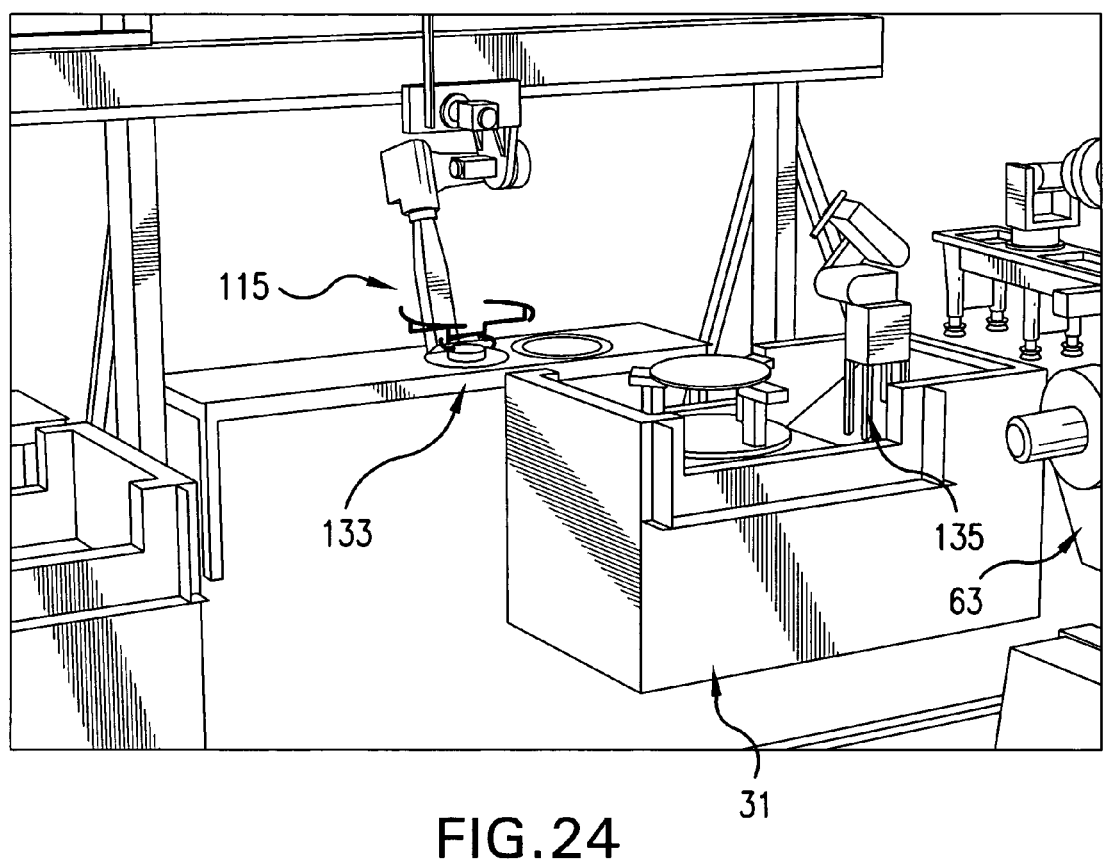
Figure 25:
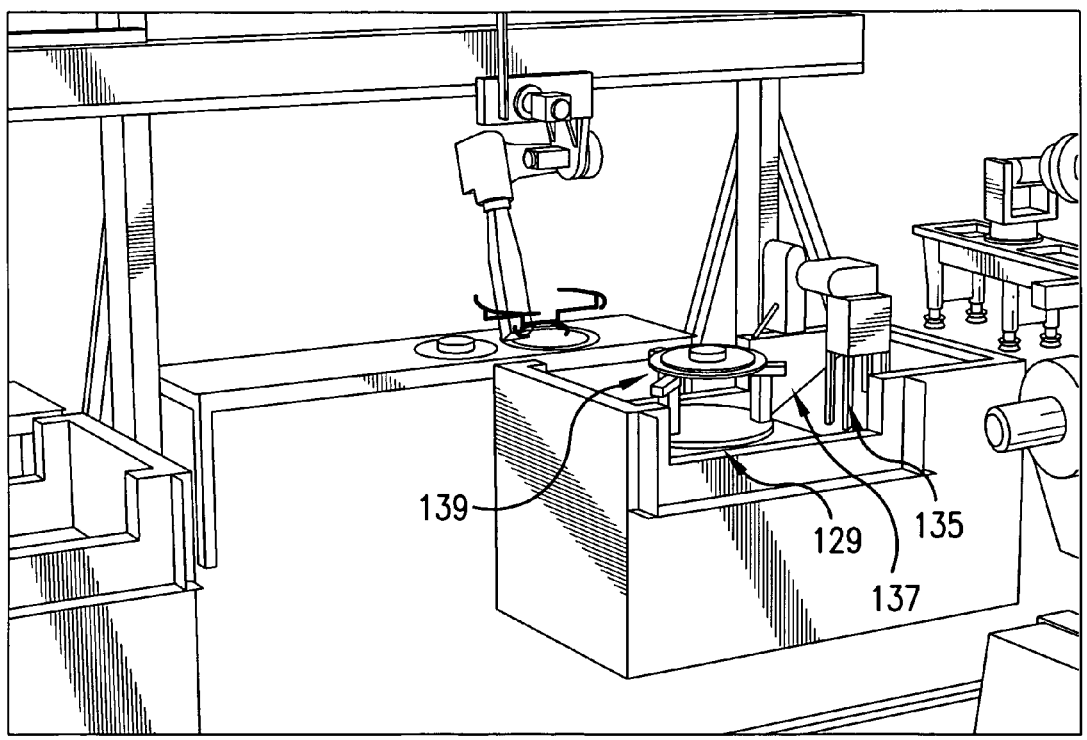
Figure 26:
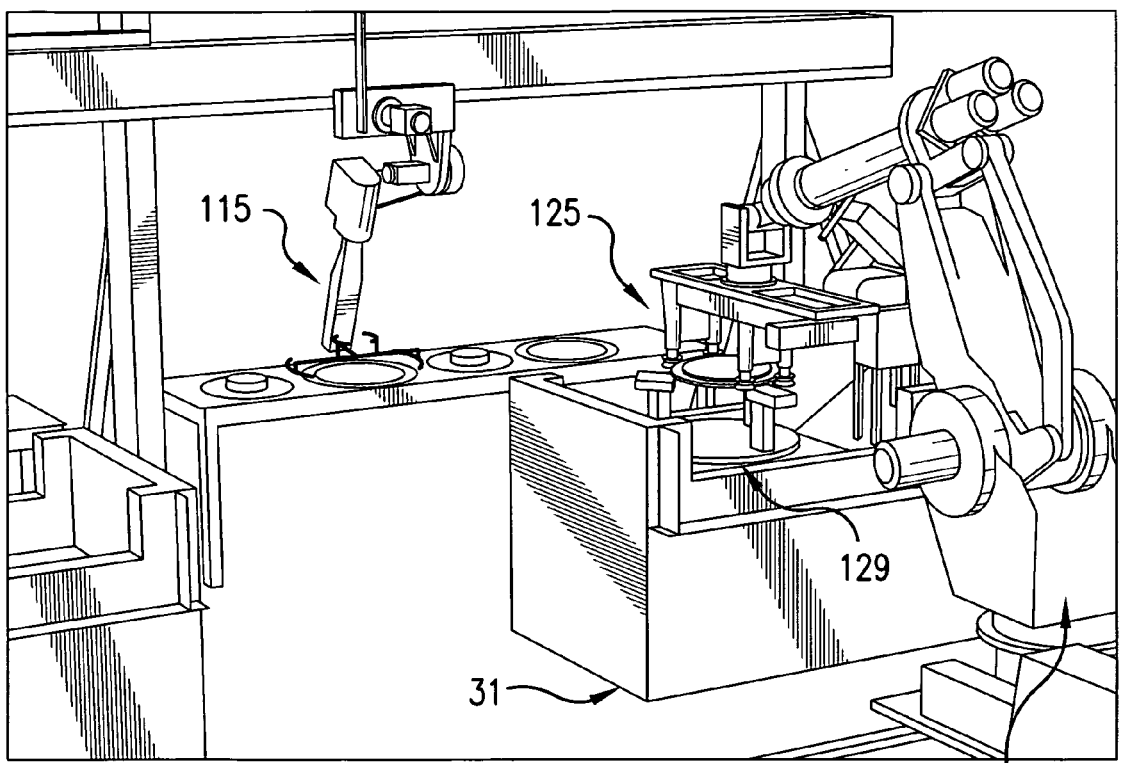
Figure 27:
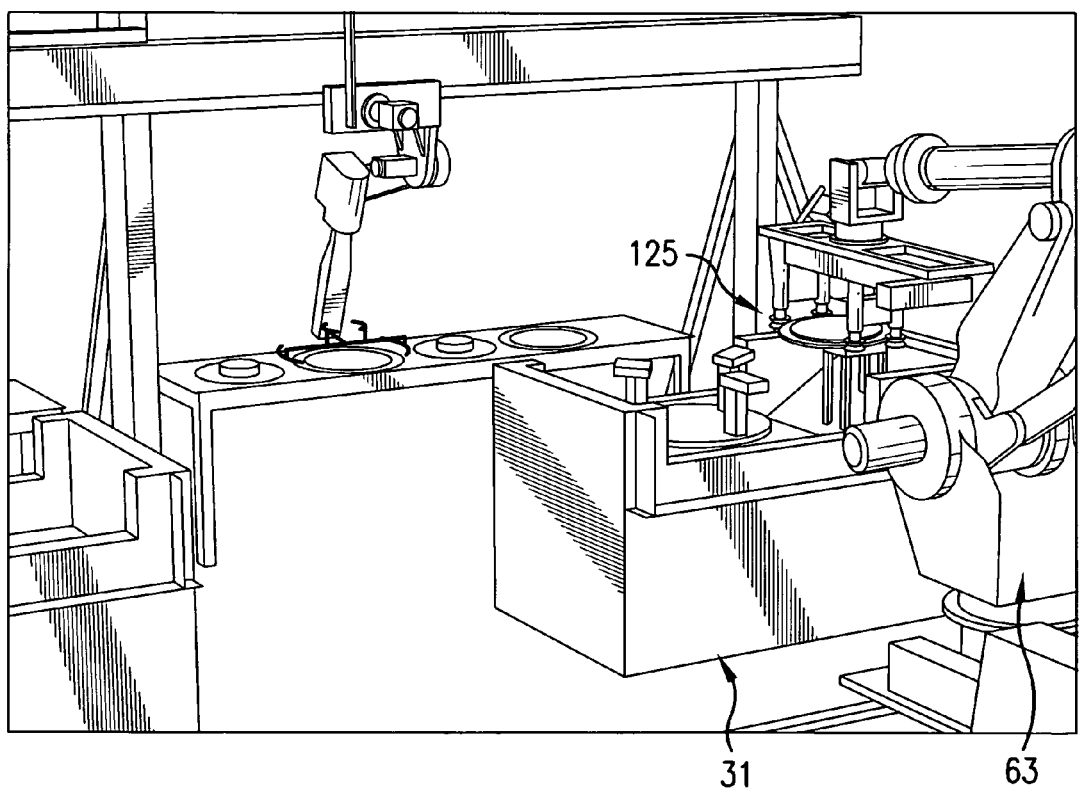

FIG. 17 shows the grit blasting station 109, which has a vertical sliding door 111 which is closed during the grit blasting operation. In FIGS. 18-27, the walls and door of the grit blasting station and arc spraying station are not shown so that the remaining parts of the various stations can be better seen in the figures. As can be seen, for instance, in FIG. 1, the grit blasting station 29 and arc spraying station 31 are enclosed and have tables located behind the stations in order to hold masks for these operations. The cabinet shown in FIG. 17 can be an acoustical steel cabinet to enclose the grit blast process and a similar cabinet can be present for the arc spraying process. In FIG. 18, a spindle 123 receives the target from the computer controlled robot 63, the end effector holding the target 125 is shown in FIG. 18. A separate overhead robot 115 operating on a overhead rail 113 is used to retrieve a mask from the table 127 containing the masks in pre-determined positions recognized by the overhead robot 115. The overhead robot 115 using grippers will retrieve the proper outer mask 117 to place on the target resting on the spindle 123. This is shown in FIG. 19. Then, the overhead robot 115 will retrieve the middle mask, which is the second part of the mask 119, to place on the middle of the target as shown in FIG. 20. Once this is done, the actual grit blaster 121 will lower and grit blast the exposed areas of the target. Then, the overhead robot will remove the masks and then the computer controlled robot 63 will retrieve the grit blasted target 73 from the spindle 123 as shown in FIG. 21. Then, as shown in FIG. 22, with the arc spray cabinet not shown, the computer controlled robot 63 will place the target held by the end effector 125 on a spindle 129 in the arc spray device. Again, the overhead robot 115 will retrieve the appropriate mask for the arc spraying operation from the separate table 133, as shown in FIG. 24. FIG. 23 shows the actual placement of the outer masks for arc spraying on the target. Upon placement of the two-part masks on the target, the actual arc sprayer 135 will then begin to conduct arc spraying by spraying a coating 137 on the exposed areas of the target as it is resting on spindle 129 as shown in FIG. 25. The arc sprayed target is shown as 139 in FIG. 25. Upon completion of the arc spraying, the computer controlled robot 63 will remove the target from the spindle 129 and the overhead robot 115 will separately return the masks to their proper locations on the table containing the various masks. This is shown in FIGS. 26 and 27.

With respect to the automated grit blast and arc spray systems, one aspect of the present invention includes an apparatus for automatically changing masks in a combination grit blasting and arc spray operation. Another aspect of the present invention is an apparatus for automatically changing masks in a grit blasting operation. Another aspect of the present invention is an apparatus for automatically changing masks in an arc, thermal, or plasma spray operation. For purposes of the present invention, the reference to "arc spraying" is simply for discussion purposes, and the present invention also includes, in lieu of arc spraying, thermal or plasma spray operations. Another aspect of the present invention relates to methods for grit blasting and/or arc, thermal, or plasma spraying involving the automatic changing of masks in each operation. Another aspect of the present invention relates to masks which are reusable and which can be suitable for automated changing. Thus, the present invention also relates to reusable grit blasts masks and reusable arc, thermal, or plasma spray masks that are suitable for automated changing.

According to various embodiments, a further downstream zone comprising a downstream cleaning sub system can comprise equipment sections, stations, and positions, optionally inside a nitrogen tunnel/clean room portion of the system, which can include the nitrogen tunnel with its entrance and exit antechambers. While the preferred inert gas is nitrogen with respect to the inert gas tunnel, other inert gases can be used for the same purpose. In at least one embodiment, the location in the cleaning sub system where the ultrasonic cleaning occurs is not in an inert gas environment (but can be), but instead is simply a clean room that preferably has an internal environment equaling a class 1,000 (or better) clean room. The clean room can be constructed of any suitable material and have any design as long as the clean room status is obtainable. Those skilled in the art will recognize that there are various designs and ways to obtain such a clean room especially for the cleaning of targets. In at least one embodiment, the material handling robot on the rail can place the target on a conveyor belt which leads into the clean room for ultrasonic cleaning. This conveyor belt can pass a sliding door in order to maintain the clean room status. Upon entering the clean room, a separate material handling device, such as a robot equipped with an end effector, can remove the target from the conveyor belt once the target is in the clean room, and then the robot with the end effector or other gripping device can take the target and move the target through the various tanks as part of the cleaning operation. Afterwards, the robot in the clean room can then take the target and place it on a second conveyor belt which can enter a nitrogen or other inert gas tunnel for further processing. Again, as with other parts of the automated system, the robot in the clean room is computer controlled with a PLC or other PLC operating system in communication with the main system controller. Thus, the tracking of the target through this process can easily be achieved. For instance, a Portable 1000 Clean Room with an ultrasonic cleaning system can include a cleaning section for an ultrasonic bath with laminar flow, including a Lexan (or other acceptable material) side wall, a support structure, a door, and a HEPA filtration with monitoring. Products can enter the clean room system and travel through a cleaning process that can comprise a four station cleaning system of three deionized (D.I.) water cleaning and rinse tanks plus a filtered air blow off tank. Both disk type and HCM parts can be retrieved from the conveyor by the gantry robot and submerged in the Ambient Water Rinse Tank with D.I. water. The gantry robot can then move the part into the ultrasonic cleaning tank containing D.I. water for a specified time period. After removal from the ultrasonic tank, the gantry robot can move the part to a heated rinse tank. The part can be placed into the air blow dry (optionally heated) tank by the gantry robot. Filtered air can be used to blow the part dry. Part orientation during the cleaning process can be maintained to maximize draining and minimize water capture, and the part can be repositioned back onto the conveyor travel position after blow drying by the gantry robot. The cleaning equipment can be enclosed in the portable Clean Room with the internal environment equaling a class 1000 (or better) clean room. Transport of the parts from process to process as listed above can be by a Gantry Robot system equipped with a custom end effector to grip the outside diameter of the peripheral flange on the parts. Parts returning to the conveyor transport system enter the drying oven section of the nitrogen tunnel following the blow-dry cycle for a 2 hour (or any pre-determined amount of time) drying process. The ultrasonic cleaning tank section can comprise a first station: ambient D.I. Water Rinse with an approximate tank size of 30" Front to Back×32" Left to Right×34" deep, 4-sided overflow weir, a resistivity monitor with an alarm, a cove corner, and a sanitary heat exchanger to cool water before entering the tank. The ultrasonic cleaning tank section can further include a second station comprising: hot temperature ultrasonic cleaning with an approximate tank size of 30" Front to Back× 32" Left to Right×34" deep, 40 KHz Ultrasonic, a 4-Sided overflow weir, a low level safety, an overtemp safety, a resistivity monitor with alarm, and cove corners. The ultrasonic cleaning tank section can further include a third station comprising: hot D.I. water rinse with an approximate tank size of 30" Front to Back×32" Left to Right×34" deep, a 4-sided overflow weir, a resistivity monitor with alarm, and cove corners. The ultrasonic cleaning tank section can further include a fourth station comprising: filtered air blow dry with parallel opposed blow-off headers. Any number of tanks can be used in the cleaning sub system and any drawing techniques can be used. Generally, the target user or the manufacturer of the sputtering device require a certain cleaning protocol which is known to those skilled in the art. Any such cleaning protocol can be adopted in the present invention and automated in a manner similar to the preferred cleaning sub system described above.

Figure 28:
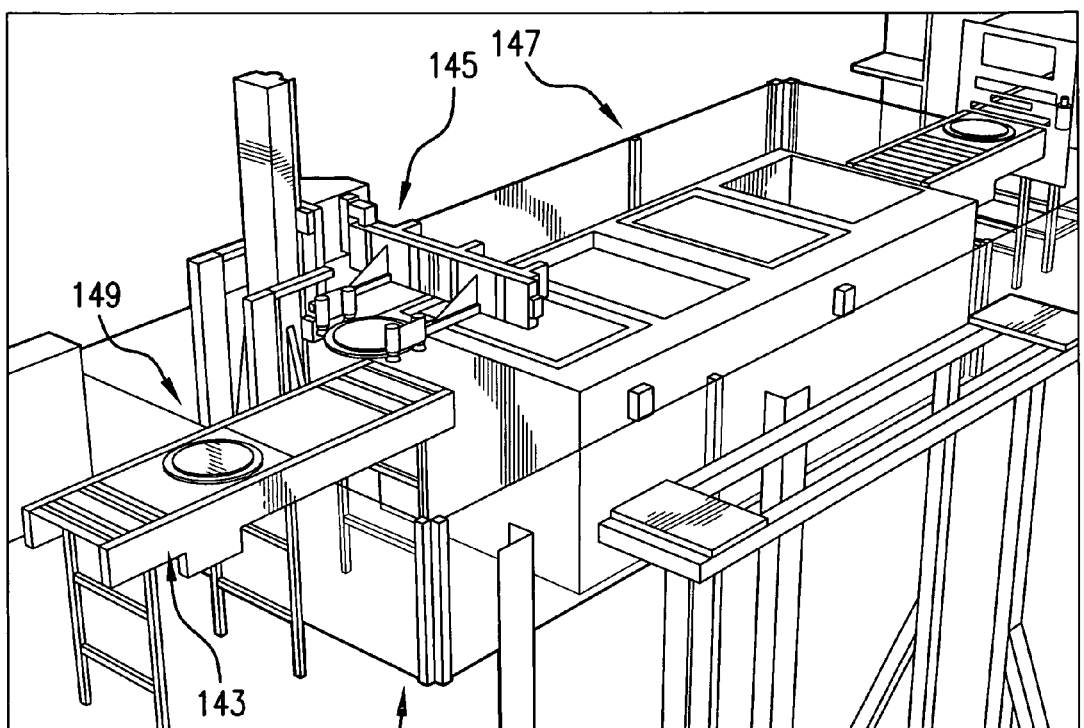
Figure 29:
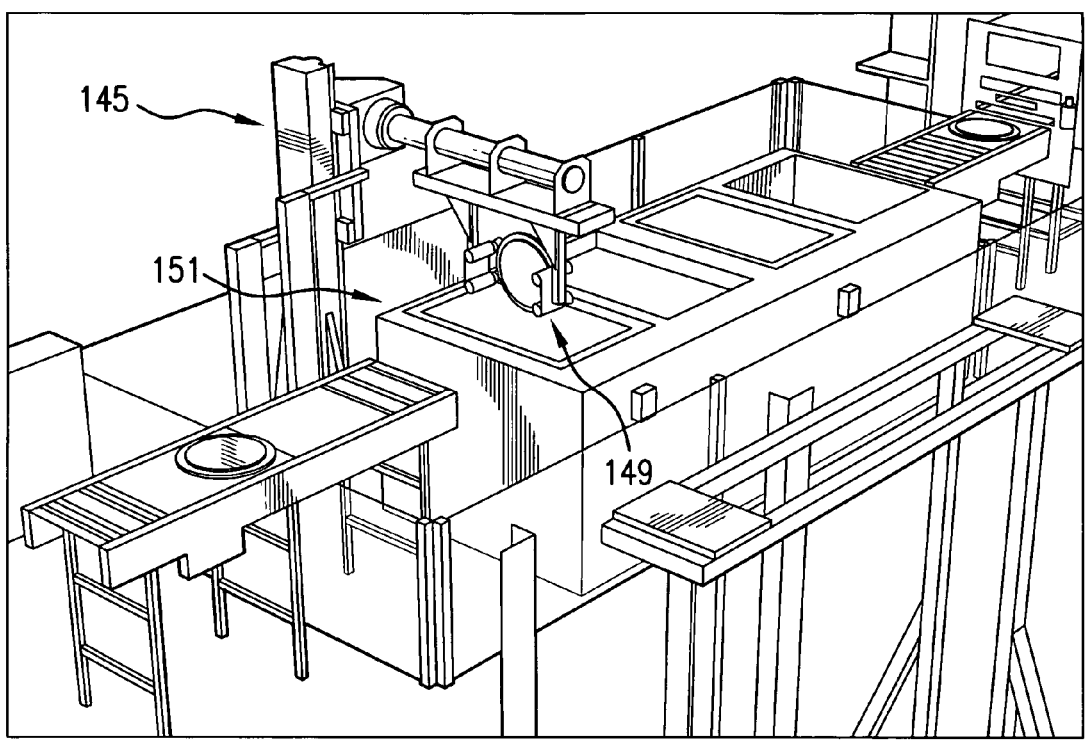
Figure 30:
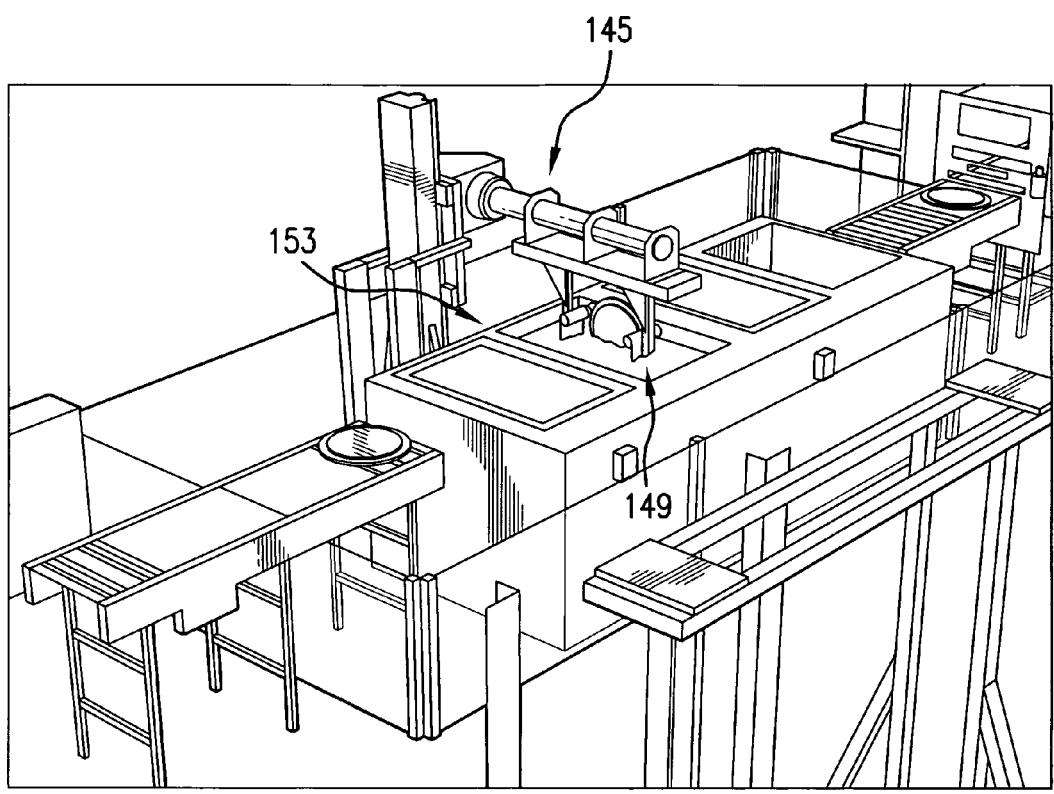
Figure 31:
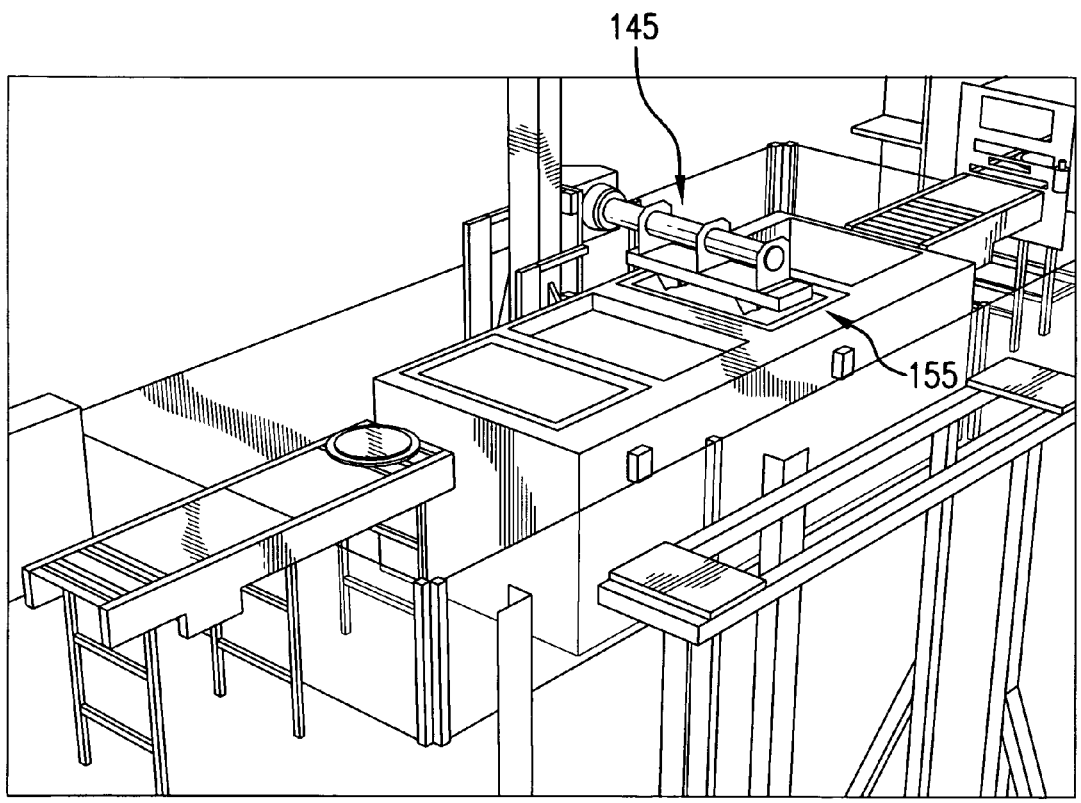
Figure 32:
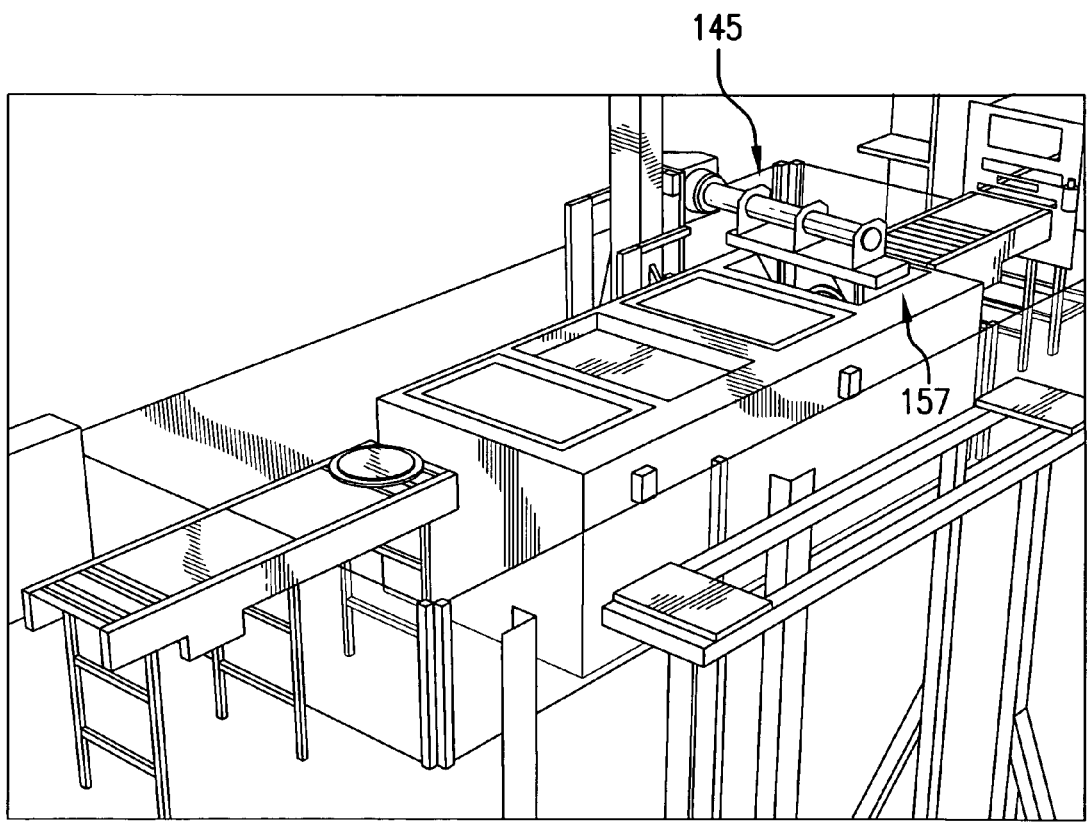
Figure 33:
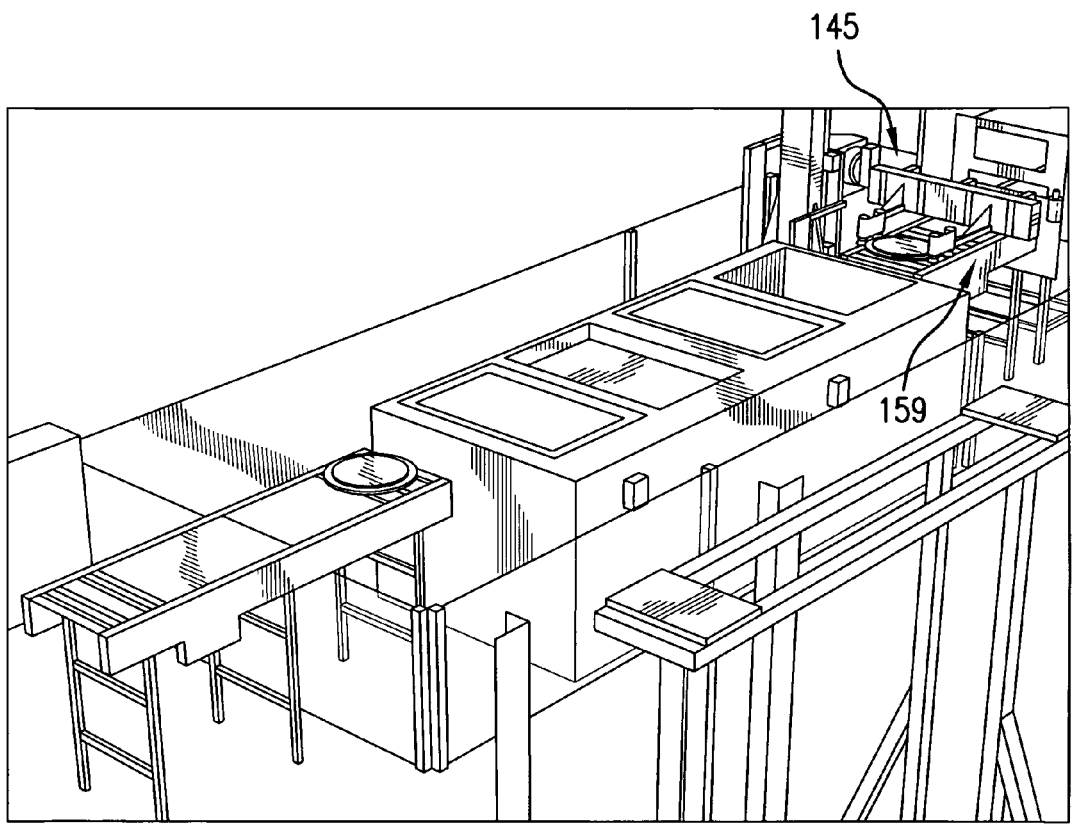

The computer controlled robot 63 can then place the arc sprayed target, for instance, on a conveyor belt 143 as shown in FIG. 28. This conveyor belt 143 leads into a cleaning station which is a clean room as signified by the enclosure 141. Part of this enclosure has not been shown in FIG. 28 so that other aspects of the cleaning station can be shown. Upon entering the clean room, a separate computer controlled robot 145, operating on a rail (not shown), will grab the target 149 off of the conveyor belt 143 and process the target through multiple cleaning baths 147. As shown in FIGS. 29, 30, 31, and 32, the computer controlled robot 145 will systematically by program place the target 149 in three various deionized water cleaning and rinse tanks. The first tank 151 is an ambient deionized water rinse, which is identified in FIG. 29. FIG. 30 is the introduction of the target 149 in the second bath, which is a hot temperature ultrasonic cleaning bath 153. FIG. 31 shows the submersion by the computer controlled robot 145 in the third bath 155, which is a hot deionized water rinse. FIG. 32 shows the final station, which is filtered air-blown dry area 157. Afterwards, the computer controlled robot 145 will place the clean and dried target on a conveyor belt 159 as shown in FIG. 33.

According to various embodiments, a nitrogen or other inert gas tunnel can be utilized to enclose a portion of a process line that can be specified as a class 100 clean room classification. The nitrogen tunnel can utilize a sliding door type entry and exit section, and a section barrier entry door as required to separate and maintain minimal cross contamination between various process chambers, while allowing part movement between the different process sections. The nitrogen tunnel can be a custom designed system that can enclose a Nitrogen Tunnel Conveyor System, a Drying Oven, one or more Nitrogen Tunnel Gantry Systems, a Cleanliness Inspection, a Surface Finish Inspection Station, and a Nitrogen Tunnel Bagging Section. For instance, the Drying Oven section can incorporate the Nitrogen Tunnel equipment providing filtered nitrogen at ≧77 Degrees C. (170 Degrees F.) for at least two hours. Other temperatures can be used. The nitrogen tunnel can include an automatic door to the drying oven, a drying oven chamber that can include a laminar flow and all associated components, and an exit chamber door from the drying oven. The nitrogen tunnel can further include a cooling section for cooling parts with laminar flow, an inspection and handling that can include a nitrogen purge, a box, a plate, and an anti window. The nitrogen tunnel can further include an exit ante-chamber for rejected parts, a bagging station Glove Box with laminar flow that includes boxes, plates and anti windows, an exit ante-chamber door for good parts, an environmental control for the entire nitrogen tunnel system, and an Nitrogen Tunnel Conveyor System.

According to various embodiments, Clean Room Rated Conveyor sections can be used to transport parts, both disk type and HCM into, through, and out of the nitrogen tunnel/ clean room portion of the system allowing the parts to ride directly on the conveyor rollers without the use of any part pallets or fixtures. The Slip-Torque conveyor units can provide transportation of disk type and HCM products, in a single lane, for instance, at a conveyor speed of approximately 10 feet per minute and a rate of 3 parts per hour. Other speeds can be used.

According to various embodiments, the conveyor units can be utilized inside the nitrogen tunnel including Shuttleworth's Slip-Trak, class 100 clean room, chain driven conveyor, and can further include an extruded aluminum or other type of frame, a solid black 21 mm roller on 22.7 mm center, and an aluminum or other type of bushing cover. A Slip-Trak, class 100 clean room conveyor with additional components to meet the preferred 170 degree F. specification can be located in the drying oven portion of the nitrogen tunnel.

According to various embodiments, two separate gantry robots can be used, one for transporting parts through the Ultrasonic Cleaning Section, and one to transport parts through the Cleanliness and Surface Inspection area. Both Gantry Systems can incorporate the use of several Servo Driven clean room motors for most of the linear motion in the system. The custom end effector tooling can be designed to grip the outside diameter of the flange on the parts. The second gantry located near the Cleanliness and Surface Finish Inspection can be the same style construction as the one utilized in the Ultrasonic Cleaning area. The sizing of the unit varies however. Disk type and HCM products can exit the cooling section and can be positioned for pick up by the second gantry robot. The parts can be lifted from the conveyor using a vacuum end effector and placed onto the inspection fixture. The inspection process can involve an inspection of the part for cleanliness, and/or surface finish inspection (e.g., surface roughness testing).

According to various embodiments, the Cleanliness Inspection can involve two identical sets of cleanliness inspection equipment, one positioned over the fixture to inspect the tantalum (or other metal) area of the disk type parts from above, and one positioned under the fixture to inspect the tantalum (or other metal) area inside the HCM "Bowl" from below the fixture. The inspection process can illuminate the part surface with the ultraviolet light source or other energy source using the vision inspection camera or other inspection device with a fixed focal length lens inspecting for "Unclean Areas" on the metal. The two sets of cleanliness inspection equipment can comprise a UV light source or other energy source that can be mounted to preferably illuminate as evenly as possible the tantalum (or other metal) surface of the part from a fixed rigid mounting position along with a vision inspection camera that can be positioned to focus on as much as possible the subject area of the tantalum (or other metal) surface from a fixed rigid mounting position. Any technique that can be automated to determine cleanliness can be used in the automated system of the present invention. In this inspection station, this quality control will ensure that the target meets user specifications with respect to cleanliness. The system is automated such that upon the inspection process occurring, a value can be placed on the cleanliness of the target. If that value exceeds acceptable cleanliness requirements, the part can then be rejected and the robot in the inert gas tunnel can pick the target up and place it on the rejected conveyor belt located in the tunnel. Since the inspection station is in computer communication with the automated line and the main system controller, pre-established values can be programmed such that upon the target being measured for cleanliness, this value can be compared with pre-established limits to determine whether the target passes the cleanliness standard or not. Again, all of this automated since each of these stations is in computer communication with the overall automated system and main system controller.

According to various embodiments, the Surface Finish Inspection equipment can utilize the same part fixture and can be initiated before or following a satisfactory cleanliness inspection process. Surface Finish of the parts can be checked using a finish inspection probe mounted on a three axis slide with a rotary actuator; one for the probe can be over the fixture to inspect the tantalum (or other metal) area of the disk type parts from above, and in the second position one can be under the fixture to inspect the vertical wall of the tantalum (or other metal) area inside the HCM "Bowl" from below the fixture. The surface finish inspection probe can be mounted to multi axis programmable servo driven linear slides to move the inspection probe into and out of the inspection area so as to not interfere with the previous cleanliness inspection process. In at least one embodiment, the surface finish inspection and the cleanliness inspection can occur at the same location with the target on the same fixture for inspection. This conserves space in the inert gas tunnel and avoids excessive movement of the target by the robot. Like the cleanliness inspection, the surface finish inspection can be achieved any number of ways as long as the system can be integrated into the automated line and computer controlled. The surface finish in at least one embodiment determines the surface roughness of the target to ensure that the surface roughness is within the specifications of the target user or the manufacturer of the target sputtering apparatus. Since it is computer controlled, a value can be determined for surface roughness and automatically compared to pre-established specifications to determine if the target has acceptable surface roughness or not. If the surface roughness is excessive, the system can automatically have the robot in the inert gas tunnel take the target and place it on the rejected conveyor line. If the surface roughness is acceptable, and upon completion of any other inspections, the robot can take the target from the inspection fixture and place it on a conveyor belt which can lead the target to a bagging area for final processing. Again, during this whole operation, the target and its location is known and tracked by way of the PLC and main system controller.

Figure 34:
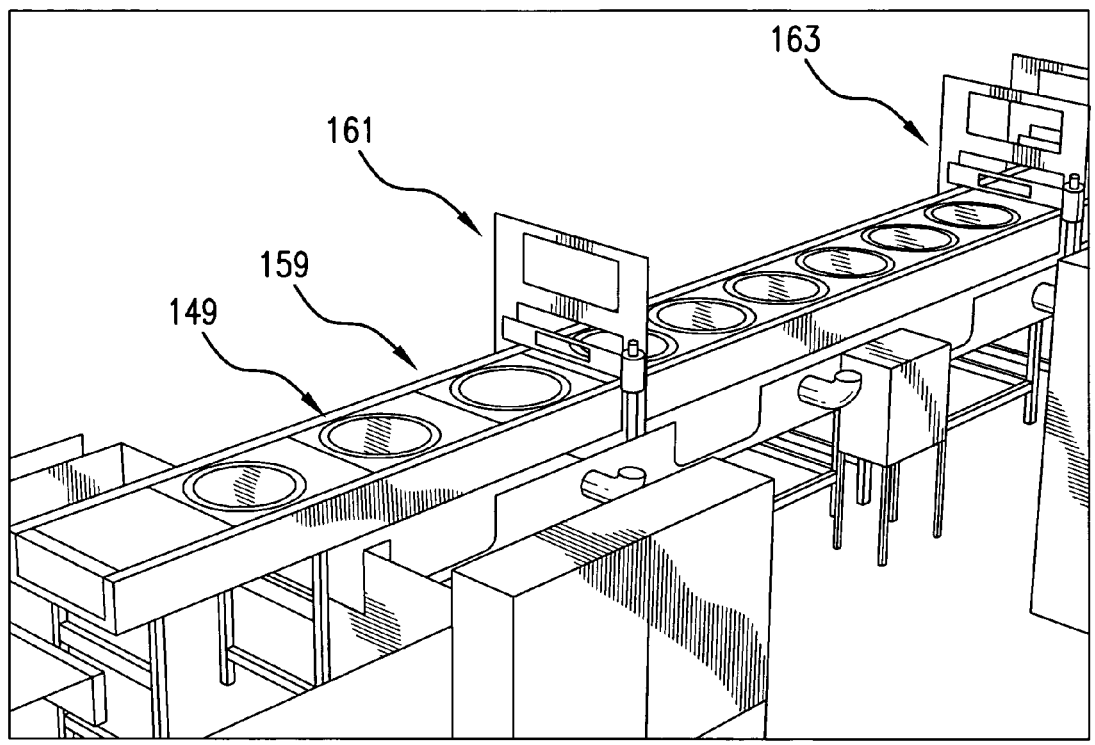
Figure 35:
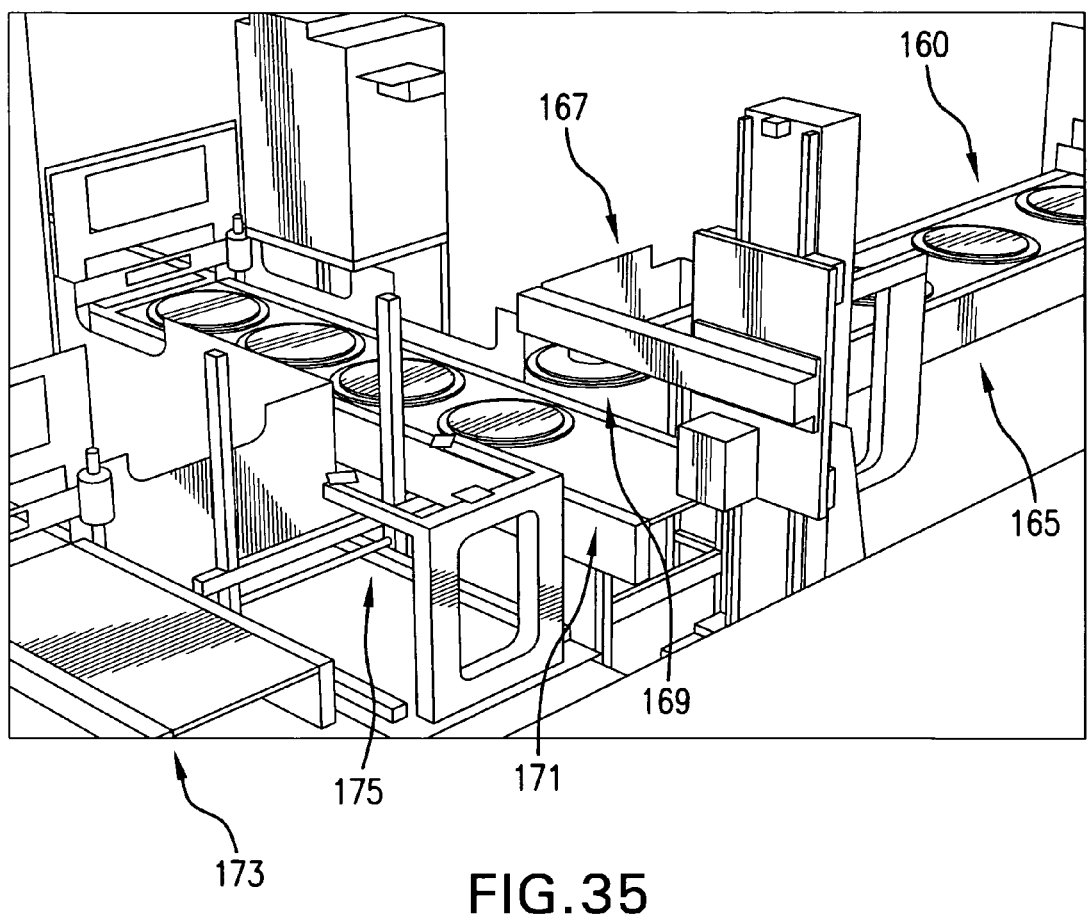
Figure 36:
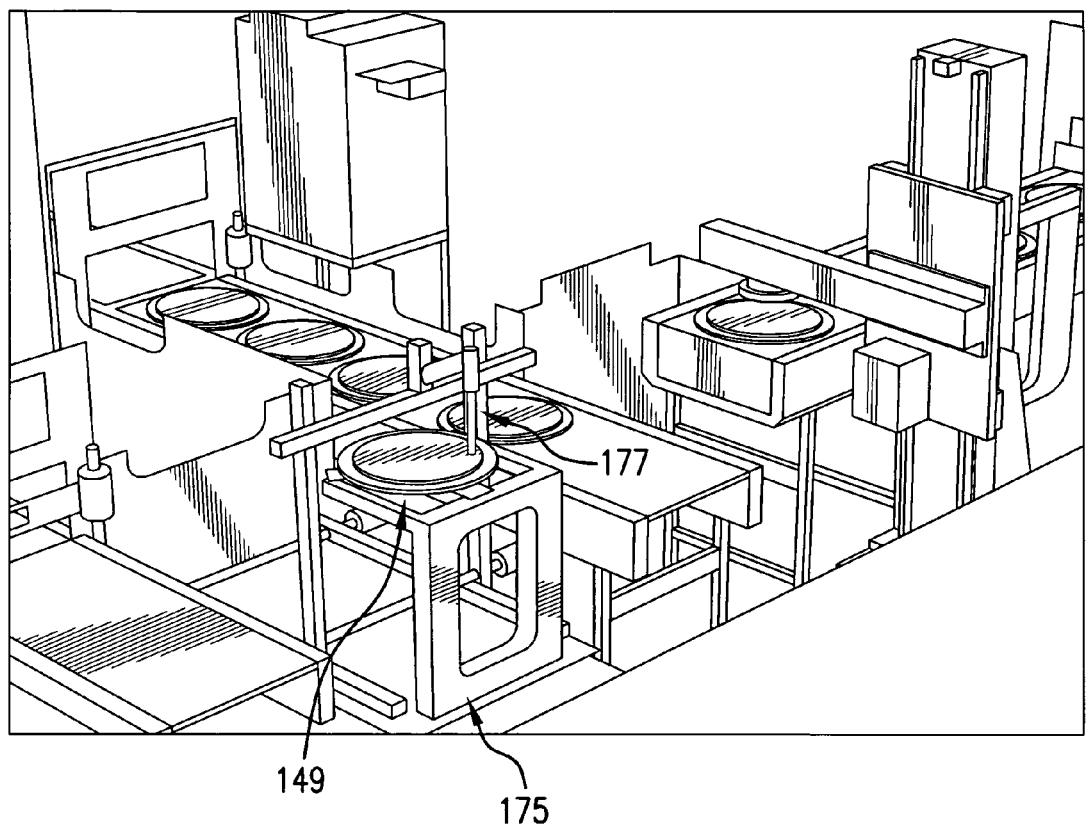
Figure 37:
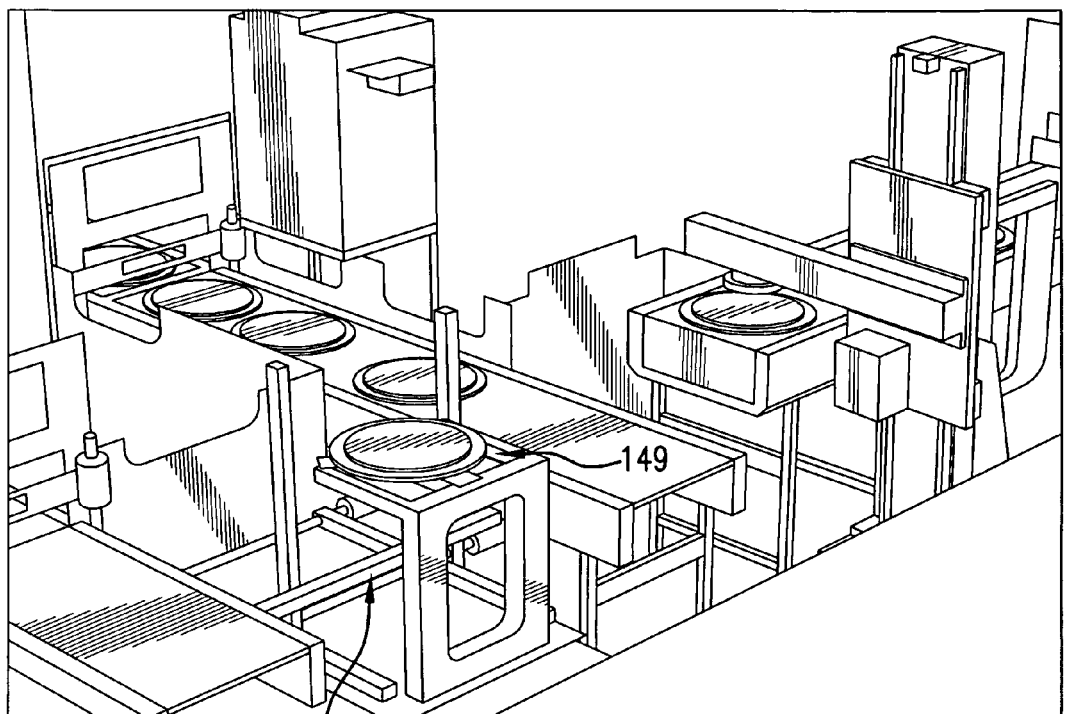
Figure 38:
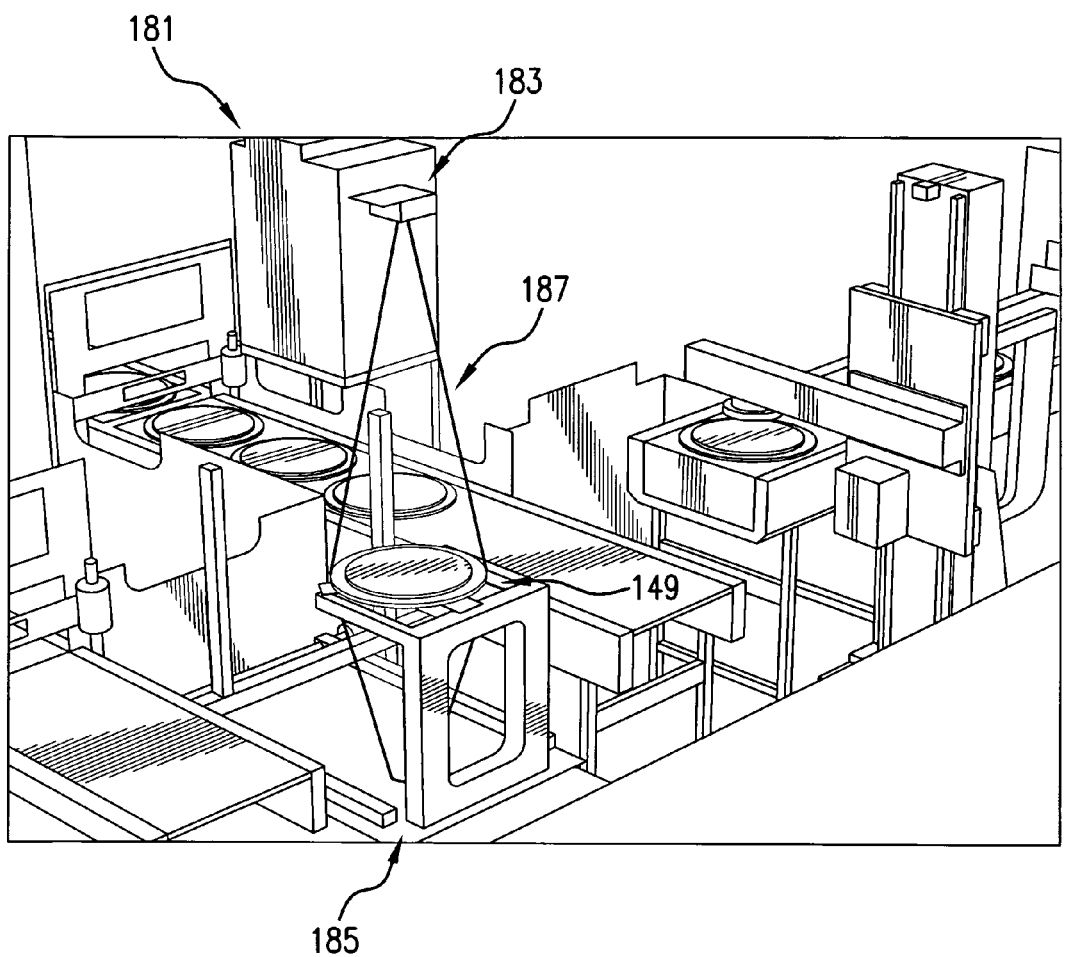
Figure 39:
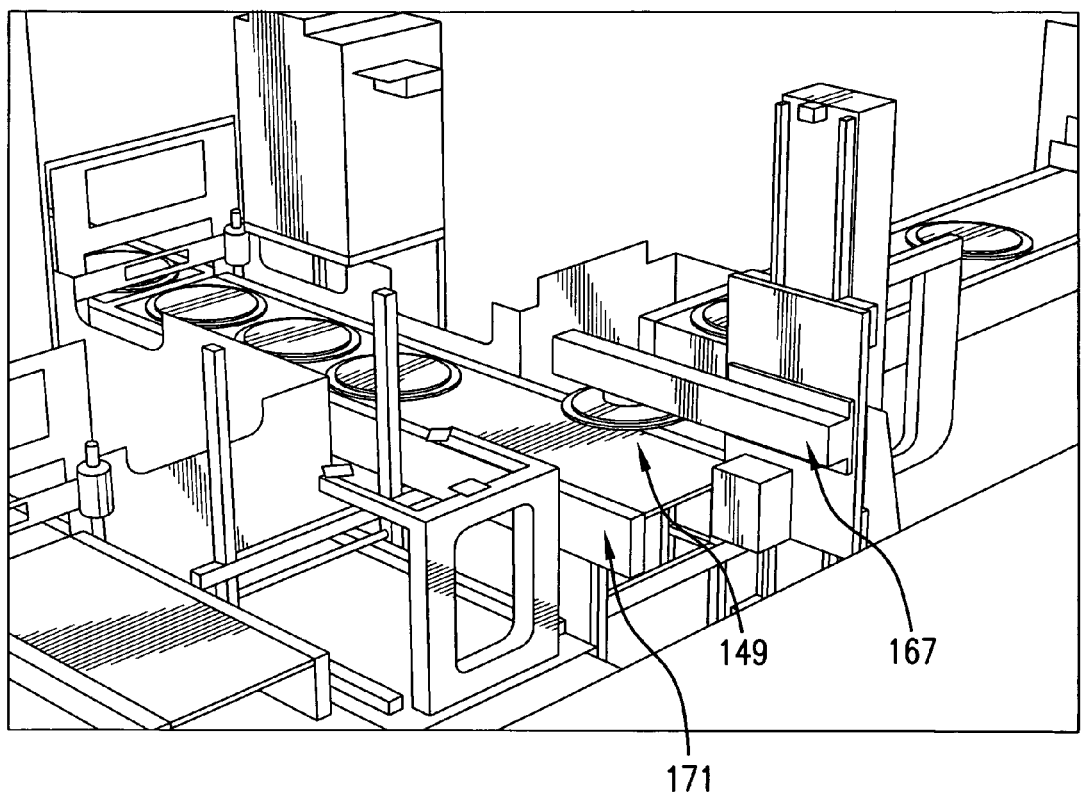
Figure 40:
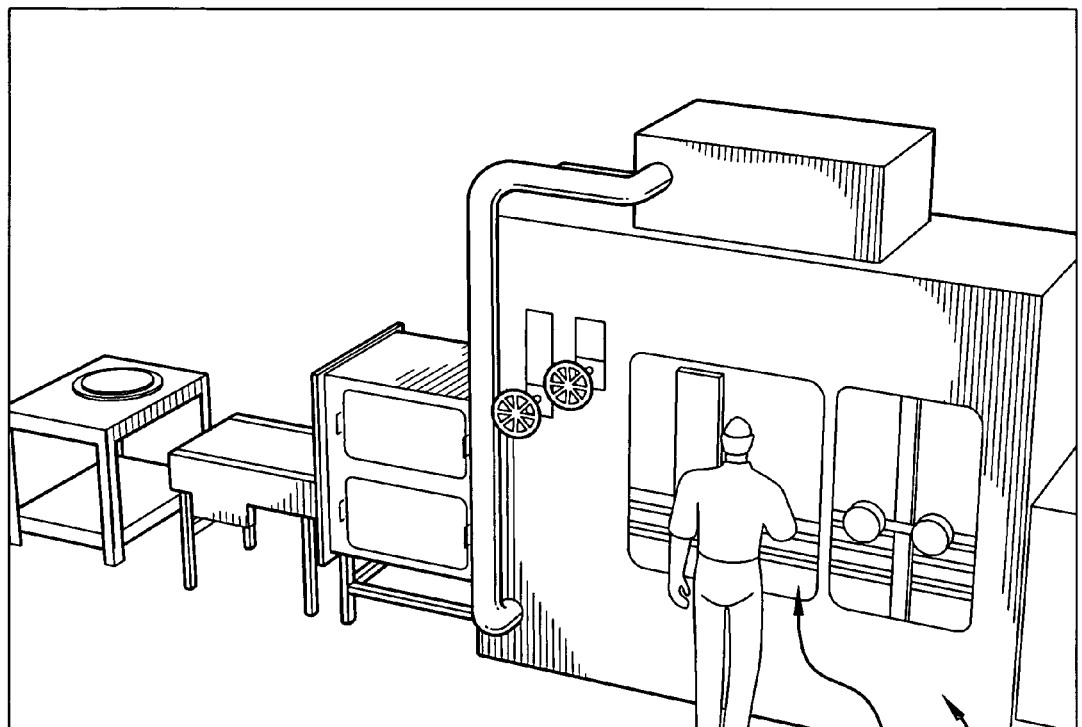
Figure 41:
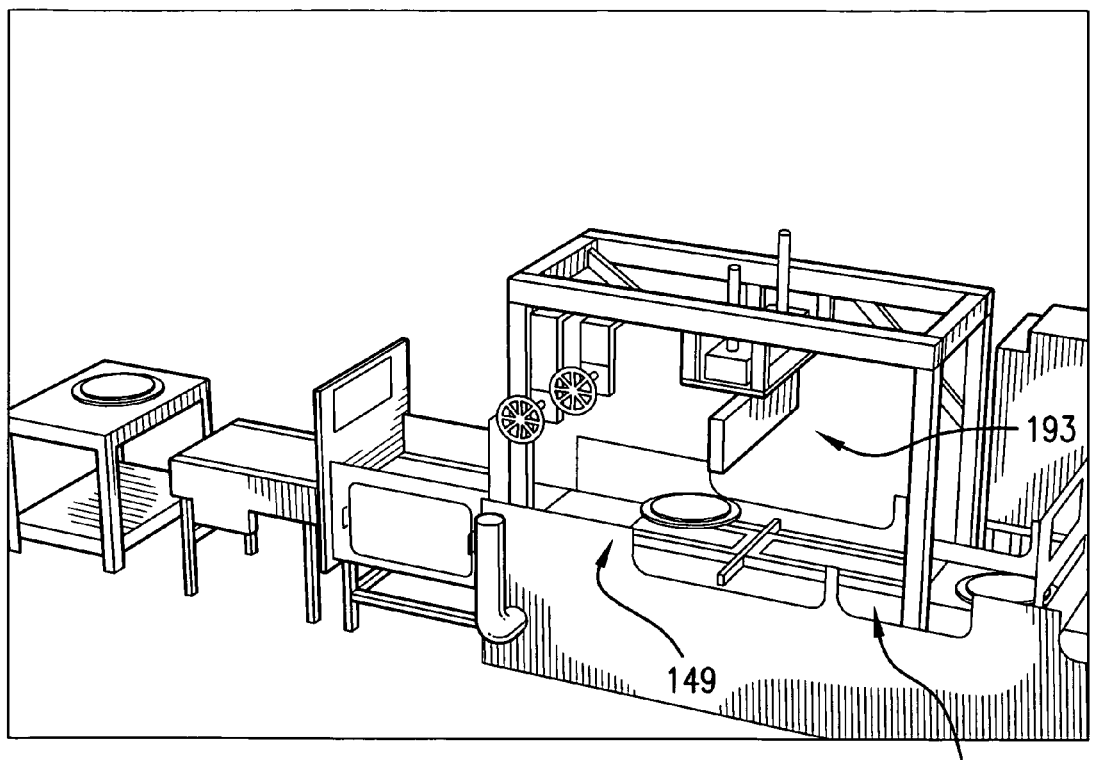

In FIG. 34, the inert gas tunnel is shown without the walls so that it can be better seen in FIG. 34. The target 149, traveling on conveyor belt 159, goes through a sliding door type entries 161 and 163 in order to enter the inert gas tunnel. Inside the inert gas tunnel, the conveyor belt, now shown as 165, first goes through a drying oven generally shown as area 160 in FIG. 35. Then, the target 169 is picked up by a computer controlled robot 167, which is a gantry-type robot. The robot 167 can pick up targets using a vacuum type end effector which can pick the targets up from the top surface, as shown in FIG. 35. The target then can be placed on an inspection table 175 for surface roughness analysis and cleanliness analysis. Upon completion of this, if the target passes the inspection, the target can then be placed on conveyor belt 171 for further processing. If the target is rejected, the computer controlled robot 167 can place the target on the conveyor belt for rejected targets shown as 173. The entire operation shown in FIG. 35 is within the inert gas tunnel. FIG. 36 more specifically shows the surface finish inspection of target 149 using an optical measurement device 177. This optical measurement device can also conduct a surface inspection underneath the target as shown in FIG. 37 with reference to the optical device being located at about position 179. FIG. 38 shows an example of the cleanliness testing wherein a UV light source 183 and 185 can illuminate both surfaces of the target 149. In FIG. 38, reference point 187 is showing the UV light. A vision inspection camera or other scanning device 181 is further shown in FIG. 38. In FIG. 39, upon the target passing the cleanliness and surface finish inspections, the target can be placed by the computer controlled robot 167 on conveyor belt 171 for further processing. FIG. 40 shows the enclosed bagging area 37 with an operator 191 conducting the bagging operation. FIG. 40 further shows one of the glove boxes 189. FIG. 41 shows the wall surrounding the bagging area removed so that the parts inside can be better seen. As shown, the target 149 can be bagged using the device 193 to pull the bag over and under the target with the assistance of the operator. A lift device, such as indicated by 195 in FIG. 41, can raise the target so that the bag can be placed underneath the target.

An alternative method of conducting the cleanliness inspection can be to use a laser and measure the specular and diffuse reflectance from the sputtering target surface. This same technique is used to inspect particle contamination on silicon wafers in the integrated circuit manufacturing process. KLM/Tencor manufactures this type of equipment for silicon wafer inspection.

A further alternative method for cleanliness inspection is to use a vacuum device to pull air and particles from the surface and measure the particle content in the air stream.

The ultraviolet method for cleanliness inspection has an inherent speed advantage over the alternative methods. The cleanliness and/or surface finish inspection can occur at any point and are completely optional.

Thus, in one embodiment of the present invention, the present invention provides an automated environment for the target cleaning and inspection and ultimately packaging operations that separate the human operators from the process by keeping the target part in a clean tunnel environment and manipulating the part through the various process steps using automation. In this way, people are not required to wear clean room garments and people are not required to lift or position the target. This operation is less costly and less time consuming, and avoids operator error.

According to various embodiments, acceptable parts are transferred by the gantry robot to the conveyor going to the Inert Gas Tunnel Bagging Section upon completion of the surface finish inspection while rejects are placed on the conveyor to the reject discharge "antechamber" and out of the nitrogen tunnel for removal from the system.

According to various embodiments, the Inert Gas Tunnel Bagging Section can be a nitrogen tunnel fitted with a glove box on two sides and can be used to manually place finished acceptable disk type and HCM parts into first an inner clean shipping bag and second an outer clean shipping bag to provide a double bagged finish part prior to the part exiting the Inert Gas Tunnel. The acceptable parts can enter the bagging section of the nitrogen tunnel via the Slip Trac conveyor after passing both final inspections. The part can be positioned at the first bagging station where a lift device elevates the part off of the conveyor surface. The operators can retrieve a bag from a supply of bags placed previously inside the tunnel, and working through the glove box, slip the bag material over the part and the lift device. The bag can be placed on the lift device, vacuum heat sealed, returned to the conveyor, and transferred off of and away from the lift device to a second position. The operator can position the open end of the bag for sealing and actuate the bag sealer to complete the first layer of bagging. The part and bag can travel to the first lift device and then the process can be repeated over the inner bag. The completed part with double bags can travel through the exit "Antechamber" to the unload position for removal from the system and loading to the final shipping container. As stated above, instead of a nitrogen atmosphere, any inert gas can be used. Furthermore, this bagging area can be part of the same nitrogen or inert gas atmosphere used for the inspection and drying oven or it can be different. One unique aspect of the bagging operation is the fact that the bagging of the target occurs in an inert gas atmosphere the entire time, and further that the target from the point in which it entered the inert gas tunnel has been maintained in an inert gas atmosphere the whole time. Thus, one aspect of the present invention relates to a bagging operation which is maintained in an inert gas atmosphere the whole time. Thus, unlike previous methods where bagging occurred in air and then the bag containing the target was back-filled with inert gas, such as argon or nitrogen, the present invention conducts the entire bagging operation in an inert gas atmosphere so that no back-filling needs to occur, and the sputtering target is maintained in a clean room status the entire time. This automated system allows the sputtering target to be packaged in a clean tunnel that isolates the sputtering target from the outside environment and human contamination. The automated system used as an option in the present invention moves the sputtering target so that a clean room compatible or series of clean room compatible bags, such as plastic bags, can surround the sputtering target and be sealed in an inert gas atmosphere. Thus, with the present invention, the inert bag is never exposed to an unclean environment. As an option, the environment can be a class 1000, class 100, or a class 10 environment.

According to various embodiments, the automated process equipment at each station can be mounted on heavy-duty steel bases (e.g., hot rolled) and component risers as necessary. The steel bases can provide a solid mounting and reference surface to build up the custom equipment required at each station. The mounting base tops and other impact surfaces can be blanchard ground, shot-peened, and/or painted as the application allows or blanchard ground and plated and/or clad as the application demands. (Such demands are typically due to size limitations or constant exposure to substances that can be "caustic" to painted surfaces).

According to various embodiments, other custom fabricated metal components can be appropriately coated to prevent oxidation and wear. One or more of a variety of coatings, for example, paint, black oxide, anodization, electroless nickel, flash chrome, or thin dense chrome can be used. Hardened steel touch tooling or wear surfaces can be plated with thin dense chrome (TDC), which can produce a very hard-finished surface (approximately Rockwell #C70). Equipment mounting structures can be painted to any specifications.

According to various embodiments, all system programs can be coded according to Advanced Automation's strict coding standards in a modular format. By following this standard, each program (and its subroutines) can be formatted as a logical "state-machine", a programming style that produces easy to understand, logically flowing sequences. Using this method can improve the readability and ease of maintenance of the code.

According to various embodiments, the machine logic can be implemented as an event-based rather than time-based control algorithm. Automated equipment can include feedback sensors to verify performance of scheduled actions. For instance, grippers do not close until a pick-and-place downstroke can be completed and a component can be present in the fixture. As a matter of design practice, systems typically can include sensors at both ends of an actuation, extending positions to make sure they got there, and then retracting positions to make sure they come back. Sensors can include verifying that parts can be present in escapements and grippers only when they should be. Sequencing failures can be thus diagnosed and reported.

According to various embodiments, sub-supplier equipment can be programmed according to their internal standards, and preferably has common interface with the rest of the system. All sub-supplier equipment can be "slaved" to the "zone controllers."

According to various embodiments, the system can be built with controls-interlocked guarding to ensure personnel safety during operation, generally using safety rated keyed interlock switch components with solenoid latching. Interlock switches can be generally used in conjunction with physical barrier guard structures. Physical barrier-type guarding can be constructed from painted steel or extruded aluminum strut structures with either Lexan polycarbonate or wire mesh panels. System guarding can comply with relevant OSHA, ANSI-RIA, and other regulatory agency requirements for this type of equipment.

Figure 42:
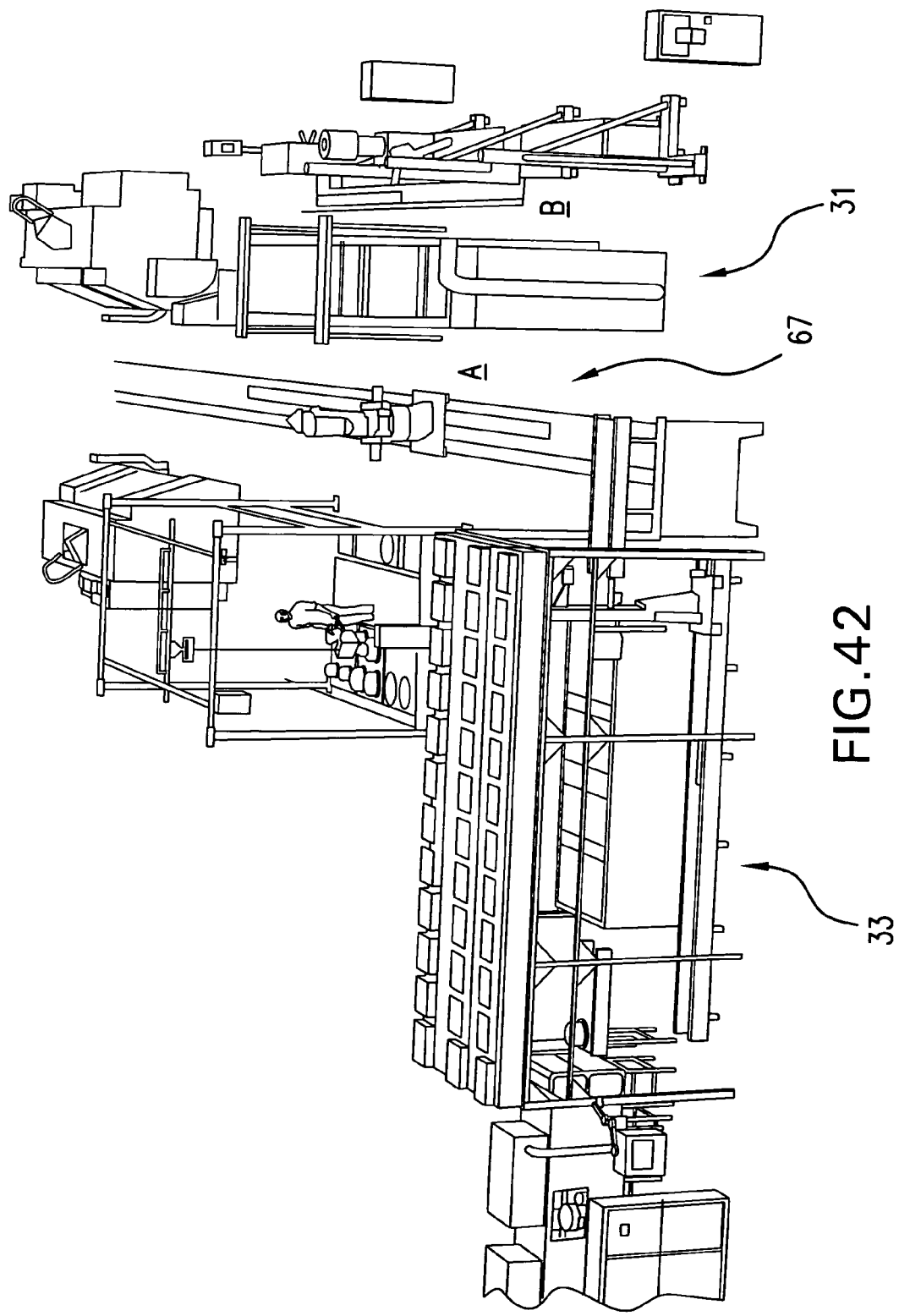
Figure 43:
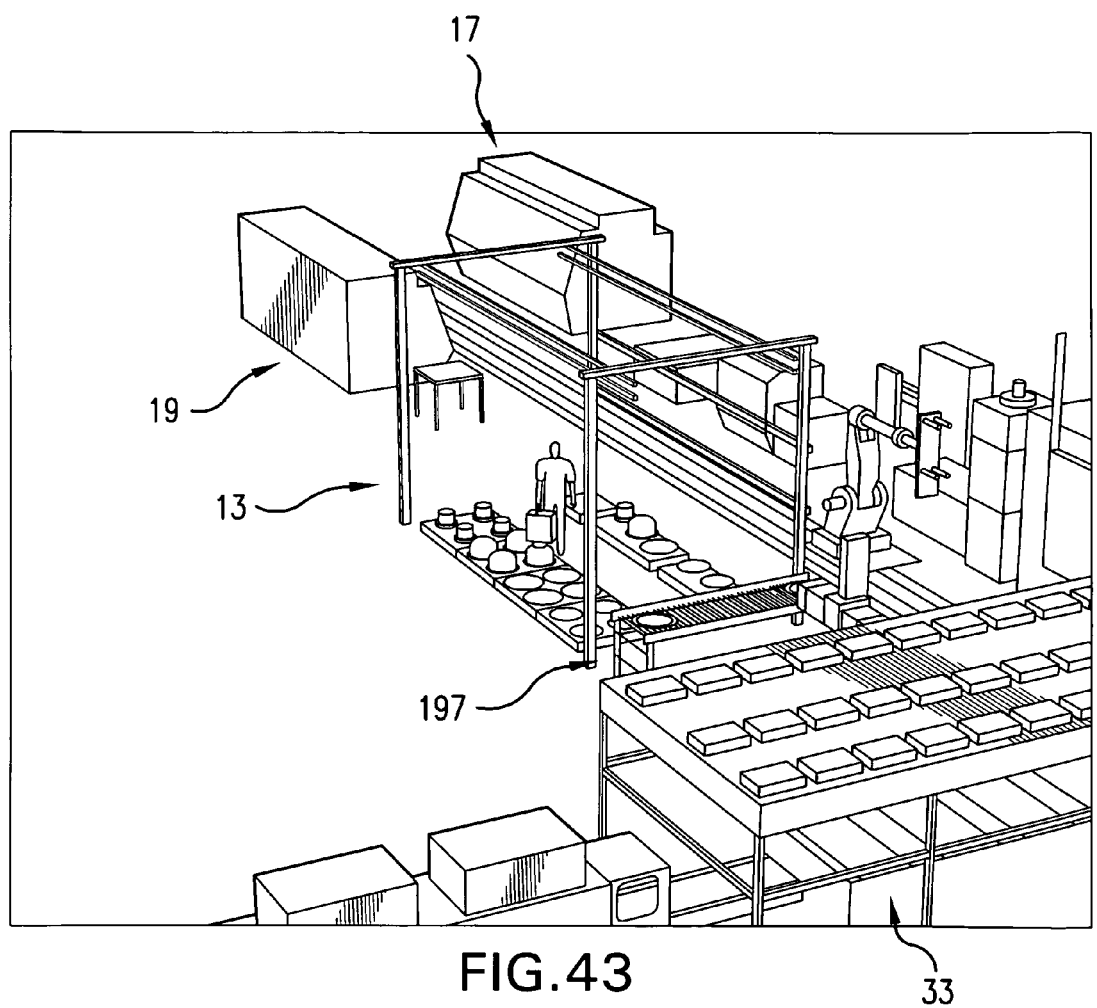

FIG. 42 is another representation of one example of the overall automated line, where the robot transport unit or rail 67 can be seen. Furthermore, location A is an area in front of the grit blast and arc spray stations, whereas location B is the area in which the separate robot places the masks from the mask tables onto the targets for grit blasting and arc spraying. FIG. 42 also shows a better representation of the clean room with the walls and ceiling 33. Further, FIG. 43 shows one example of a reject station 197 for receiving targets that may have been rejected somewhere in the automated process.

For purposes of the present invention, the present invention not only relates to an overall automated system for manufacturing metal articles, such as sputtering targets, but the present invention relates to each individual sub system which is automated. In addition, the present invention relates to any combination of one or more sub systems as described herein. As stated, each of the sub systems described herein are not required, but are optional, and any combination of sub systems mentioned herein, or in addition to other sub systems not mentioned herein, are encompassed by the present invention as part of the automated system. Further, the automated system can also include further pre-finish target process steps, such as automation to take a target with or without a backing plate and automatically unload these targets from a location and load them onto the on-load station. Equally so, upon the completion of the finished target and the bagging of the target, the automated line can be extended to automatically take these bagged items, through the use of robots, and load these items in an inventory area or automatically take them to an area for shipping to the customer.

Applicants specifically incorporate the entire contents of all cited references in this disclosure. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the present specification and practice of the present invention disclosed herein. It is intended that the present specification and examples be considered as exemplary only with a true scope and spirit of the invention being indicated by the following claims and equivalents thereof.

What is claimed is:

1. A system for manufacturing a sputtering target, comprising:
   a robotic part handling sub system;
   an optional weighing sub system adapted to measure the weight of a pre-finished and/or finished sputtering target;
   a machining sub system adapted to finish machine a pre-finished sputtering target;
   a cleaning sub system adapted to clean a pre-finished sputtering target;
   an optional inspection sub system adapted to measure dimensions of a pre-finished and/or finished sputtering target;
   a feedback control sub system adapted to provide control signals to one or more of the robotic part handling sub system, the weighing sub system, the cleaning sub system, and/or the inspection sub system to control processing performed by one or more of the sub systems; and
   wherein the weighing sub system is present and is adapted to compare the actual measured weight of a prefinished or finished sputtering target with an expected weight or previously recorded weight for the same sputtering target as stored in the feedback control sub system, and wherein said weighing sub system further includes a marking device adapted to mark a prefinished or finished sputtering target.

2. The system of claim 1, further including:
   a computer numerically controlled machining sub system adapted to finish machine one or more surfaces of a pre-finished or semi-finished sputtering target.

3. The system of claim 1 wherein the robotic part handling sub system comprises a multi-axis, modular, electric, servo-driven robot.

4. The system of claim 1 wherein the robotic part handling sub system comprises a single carriage, heavy duty, floor-mount robot transport unit.

5. The system of claim 1, wherein the robotic part handling sub system further comprises a multi-axis, modular, electric, servo-driven robot, the robot transport unit transporting the multi-axis, modular, electric, servo-driven robot.

6. The system of claim 1, further comprising a product load station, wherein parts to be manufactured into sputtering targets are staged and mounted in fixtures adapted to hold the parts during further processing.

7. The system of claim 6, wherein the product load station comprises multiple universal part fixtures, each adapted to hold a part to be manufactured into a sputtering target.

8. The system of claim 6, wherein the product load station comprises a floor supported bridge crane.

9. the system of claim 6, wherein the product load station comprises a vacuum lifting mechanism.

10. The system of claim 1, wherein the cleaning sub system comprises a degreasing, cleaning, and drying station.

11. The system of claim 1, further including a grit blast station adapted to etch at least a portion of a pre-finished sputtering target.

12. The system of claim 1, further including a coating station adapted to coat at least a portion of a pre-finished sputtering target.

13. The system of claim 1, further including a secondary cleaning sub system, the secondary cleaning sub system comprising one or more stations that are provided in a zone separate from a zone that induces the weighing sub system, the cleaning sub system, and the inspection sub system.

14. The system of claim 13, wherein the secondary cleaning sub system comprises an ultrasonic cleaning station, and an inert gas-filled clean room station.

15. The system of claim 14 wherein the secondary automatic part handling sub system is provided for transferring a part to be manufactured into a sputtering target to and/or between one or more of the ultrasonic cleaning station and the inert gas-filled clean room station.

16. A method of manufacturing a sputter target, comprising:
   gripping a pre-finished sputtering target utilizing a robotic part handling apparatus;
   weighing the pre-finished sputtering target and comparing the actual weight of the part to an expected weight or previously recorded weight, determining whether further processing of the part should be performed based on the results of comparing the actual weight to the expected weight;
   finish machining the part to desired dimensions;
   cleaning the finish machined part; and
   inspecting the finish machined part to determine conformance of the dimensions of the finish machined part with desired dimensions.

17. The method of claim 16, further including leak testing the finish machined and cleaned part.

18. The method of claim 16, further including grit blasting at least a portion of the pre-finished sputtering target.

19. The method of claim 16, further including moving the finish machined and cleaned part to a secondary cleaning station wherein further cleaning is performed including one or more of deionized water cleaning and rinsing, ultrasonic cleaning, and filtered air blow drying.

20. The method of claim 16, further including:
   providing a system controller;
   providing an input signal to the system controller indicative of the presence of a part at a desired location for further processing including one or more of gripping the part, weighing the part, finish machining the part, and cleaning the part; and
   performing the one or more processing operations upon receiving a control signal from the system controller based on receipt by the system controller of the input signal indicative of the presence of the part.

* * * * *

UNITED STATES PATENT AND TRADEMARK OFFICE
CERTIFICATE OF CORRECTION

PATENT NO.        : 7,480,976 B2  
APPLICATION NO.   : 11/795391  
DATED             : January 27, 2009  
INVENTOR(S)       : Wiley Zane Reed et al.

It is certified that error appears in the above-identified patent and that said Letters Patent is hereby corrected as shown below:

On the title page item (57), delete Abstract and replace as follows:

--A system and method are provided for manufacturing a workpiece or metal article, like a sputtering target or a component thereof or a component used with a sputtering target. The system is preferably automated. Sub systems of the manufacturing system include a robotic part handling sub system, a weighing sub system adapted to measure the weight of a part to be manufactured into a sputtering target, and a machining sub system adapted to finish machine a part to be manufactured into a sputtering target. The system can further include a cleaning sub system adapted to clean a pre-finished or finished sputtering target, an inspection sub system adapted to measure dimensions of a pre-finished or finished sputtering target, and a feedback control sub system adapted to provide control signals to one or more of the robotic handling sub system, the weighing sub system, the cleaning sub system, and the inspection sub system to control processing performed by one or more of the sub systems.--.

Column 27, line 54, after 9. delete "the" and replace with --The--.

Signed and Sealed this

Twenty-fourth Day of March, 2009

JOHN DOLL  
*Acting Director of the United States Patent and Trademark Office*